US012018037B2

(12) United States Patent
Choi et al.

(10) Patent No.: US 12,018,037 B2
(45) Date of Patent: Jun. 25, 2024

(54) ORGANOMETALLIC COMPOUND, ORGANIC LIGHT-EMITTING DEVICE INCLUDING THE ORGANOMETALLIC COMPOUND, AND DIAGNOSTIC COMPOSITION INCLUDING THE ORGANOMETALLIC COMPOUND

(71) Applicant: Samsung Electronics Co., Ltd., Suwon-si (KR)

(72) Inventors: Jongwon Choi, Yongin-si (KR); Yongsuk Cho, Hwaseong-si (KR); Hyun Koo, Yongin-si (KR); Bumwoo Park, Hwaseong-si (KR); Sunghun Lee, Seoul (KR); Shingo Ishihara, Suwon-si (KR); Yoonhyun Kwak, Seoul (KR); Ohyun Kwon, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/230,529

(22) Filed: Dec. 21, 2018

(65) Prior Publication Data

US 2019/0194237 A1 Jun. 27, 2019

(30) Foreign Application Priority Data

Dec. 22, 2017 (KR) ........................ 10-2017-0178740

(51) Int. Cl.
*C07F 15/00* (2006.01)
*C07F 1/12* (2006.01)
(Continued)

(52) U.S. Cl.
CPC ............ *C07F 15/0086* (2013.01); *C07F 1/12* (2013.01); *C07F 15/006* (2013.01); *C09K 11/06* (2013.01);
(Continued)

(58) Field of Classification Search
CPC . H10K 85/346; C07F 15/006; C07F 15/0086; C07F 1/12; H01L 51/0087
See application file for complete search history.

(56) References Cited

U.S. PATENT DOCUMENTS 6,465,115 B2 10/2002 Shi et al.
6,596,415 B2 7/2003 Shi et al.
(Continued)

FOREIGN PATENT DOCUMENTS

CN 101935523 A * 1/2011
CN 106467560 A 3/2017
CN 107216356 A 9/2017

OTHER PUBLICATIONS

Lee, et al. "Synthesis and characterization of phosphorescent platinum complexes containing phenylpyridazine." Materials Science and Engineering: C 24.1-2 (2004): 221-224.*
(Continued)

*Primary Examiner* — Jenna N Chandhok
(74) *Attorney, Agent, or Firm* — CANTOR COLBURN LLP

(57) ABSTRACT

An organometallic compound represented by Formula 1:

Formula 1

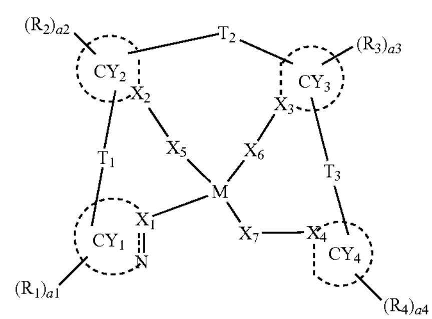

wherein, in Formula 1, groups and variables are the same as described in the specification.

9 Claims, 1 Drawing Sheet

(51) Int. Cl.

| | |
|---|---|
| ***C09K 11/06*** | (2006.01) |
| ***H10K 50/11*** | (2023.01) |
| ***H10K 50/15*** | (2023.01) |
| ***H10K 50/16*** | (2023.01) |
| ***H10K 50/17*** | (2023.01) |
| ***H10K 50/18*** | (2023.01) |
| ***H10K 85/30*** | (2023.01) |
| ***H10K 101/10*** | (2023.01) |
| ***H10K 101/30*** | (2023.01) |

(52) U.S. Cl.
CPC .......... *H10K 50/11* (2023.02); *H10K 85/346* (2023.02); *H10K 85/371* (2023.02); *C09K 2211/185* (2013.01); *H10K 50/15* (2023.02); *H10K 50/16* (2023.02); *H10K 50/171* (2023.02); *H10K 50/18* (2023.02); *H10K 85/324* (2023.02); *H10K 2101/10* (2023.02); *H10K 2101/30* (2023.02)

(56) References Cited

U.S. PATENT DOCUMENTS

| | | | | |
|---|---|---|---|---|
| 7,442,797 | B2 | 10/2008 | Itoh et al. | |
| 10,825,999 | B2 * | 11/2020 | Lee | H01L 51/0087 |
| 10,937,973 | B2 * | 3/2021 | Lee | H01L 51/0087 |
| 2001/0019782 | A1 | 9/2001 | Igarashi et al. | |
| 2006/0222887 | A1 * | 10/2006 | Okada | H01L 51/0086 428/690 |
| 2007/0103060 | A1 | 5/2007 | Itoh et al. | |
| 2008/0036373 | A1 * | 2/2008 | Itoh | H01L 51/0087 313/504 |
| 2015/0349279 | A1 * | 12/2015 | Li | H05B 33/14 252/301.16 |
| 2016/0013431 | A1 | 1/2016 | Choi et al. | |
| 2017/0054095 | A1 * | 2/2017 | Choi | H01L 51/0087 |
| 2017/0305881 | A1 | 10/2017 | Li et al. | |
| 2017/0358761 | A1 * | 12/2017 | Wang | H01L 51/0087 |
| 2018/0013078 | A1 * | 1/2018 | Lee | H01L 51/0094 |
| 2018/0240990 | A1 * | 8/2018 | Choi | C09K 11/06 |
| 2018/0261781 | A1 * | 9/2018 | Lee | C07F 15/0086 |
| 2019/0074457 | A1 * | 3/2019 | Choi | C07F 15/0086 |
| 2019/0100546 | A1 * | 4/2019 | Baik | H01L 51/0091 |
| 2020/0308207 | A1 * | 10/2020 | Kim | H01L 51/0087 |
| 2022/0093880 | A1 | 3/2022 | Choi et al. | |

OTHER PUBLICATIONS

Lee, et al. "Synthesis and Characterization of Phosphorescent Platinum and Iridium Complexes of 6-Chloro-3-phenylpyridazine." Journal of Photoscience 10.2 (2003): 185-187.*

Lee, et al. "Synthesis of phosphorescent platinum complexes with 3-aryl pyridazine as prominent emitting materials in organic light-emitting device." Key Engineering Materials. vol. 277. Trans Tech Publications Ltd, 2005.*

Brooks, et al. "Synthesis and characterization of phosphorescent cyclometalated platinum complexes." Inorganic Chemistry 41.12 (2002): 3055-3066.*

Vezzu, et al. "Highly luminescent tetradentate bis-cyclometalated platinum complexes: design, synthesis, structure, photophysics, and electroluminescence application." Inorganic chemistry 49.11 (2010): 5107-5119.*

CN-101935523-A Machine Translation.*

Extended European Search Report issued by the European Patent Office on Mar. 29, 2019 in the examination of the European Patent Application No. 18212977.5-1109.

Lewis et al. "Synthesis and Evaluation of Lipophilic BTBP Ligands for An/Ln Separation in Nuclear Waste Treatment: The Effect of Alkyl Substitution on Extraction Properties and Implications for Ligands Design", European Journal of Organic Chemistry, 2012, pp. 1509-1519.

Zhang et al. "Separation and complexation of palladium(II) with a new soft N-donor ligand 6,6'-bis(5,6-dinonyl-1,2,4-triazin-3-yl)-2,2'-bipyridine(c9-BTBP) in nitric acid medium", New Journal of Chemistry, 40, pp. 6374-6383.

M.A. Baldo et al. "Highly efficient phosphorescent emission from organic electroluminescent devices", Nature, 1998, 395 (6698), 151-154 (4 pp.).

M.A. Baldo et al. "Very high-efficiency green organic light-emitting devices based on electrophosphorescence", Applied Physics Letters, 1999, 75 (1), 4-6 (3 pp.).

Raymond C. Kwong et al. "High operational stability of electrophosphorescent devices", Applied Physics Letters, 2002, 81 (1),162-164 (3 pp.).

Sergey Lamansky et al. "Highly Phosphorescent Bis-Cyclometalated Iridium Complexes: Synthesis, Photophysical Characterization, and Use in Organic Light Emitting Diodes", J. Am. Chem. Soc. 2001, 123, 4304-4312.

Sergey Lamansky et al. "Synthesis and Characterization of Phosphorescent Cyclometalated Iridium Complexes", Inorg. Chem. 2001, 40, 1704-1711.

Qin Wang et al., "Effects of charged self-assembled quantum dots on two-dimensional quantum transport," Appl. Phys. Lett., 76, No. 13, 1704-1706, Mar. 27, 2000.

Anyun Zhang, et al., "Separation and complexation of palladium (II) with a new soft N-doner ligand 6,6'-bis(5,6-dinonyl-1,2,4-triazin-3-yl)-2,2'-bipyridine (C9-BTBP) in nitric acid medium", New Journal of Chemistry, pp. 1-18. (May 10, 2016).

English Abstract of CN 107216356.

English Translation of Office Action dated Nov. 8, 2022 issued in corresponding CN Patent Application No. 201811561380.0, 9 pp.

Office Action dated Nov. 8, 2022 issued in corresponding CN Patent Application No. 201811561380.0, 9 pp.

Office Action dated Jun. 30, 2023, issued in corresponding CN Patent Application No. 201811561380.0, 6 pp.

English Translation of Office Action dated Jun. 30, 2023, issued in corresponding CN Patent Application No. 201811561380.0, 7 pp.

* cited by examiner

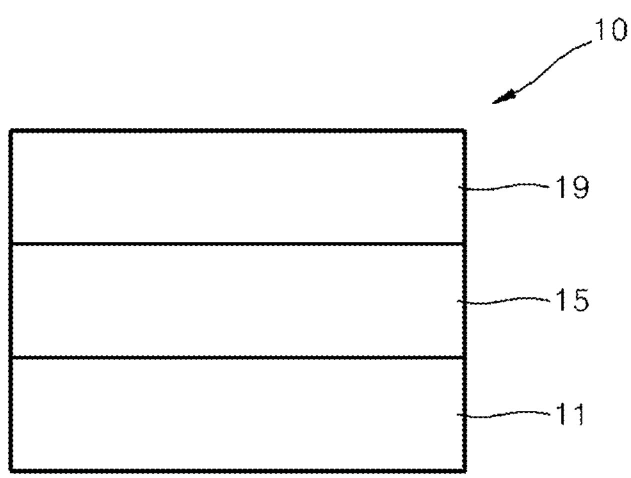
10
19
15
11

ORGANOMETALLIC COMPOUND, ORGANIC LIGHT-EMITTING DEVICE INCLUDING THE ORGANOMETALLIC COMPOUND, AND DIAGNOSTIC COMPOSITION INCLUDING THE ORGANOMETALLIC COMPOUND

CROSS-REFERENCE TO RELATED APPLICATION

This application claims priority to Korean Patent Application No. 10-2017-0178740, filed on Dec. 22, 2017, in the Korean Intellectual Property Office, and all the benefits accruing therefrom under 35 U.S.C. § 119, the content of which is incorporated herein in its entirety by reference.

BACKGROUND

1. Field

One or more embodiments relate to an organometallic compound, an organic light-emitting device including the organometallic compound, and a diagnostic composition including the organometallic compound.

2. Description of the Related Art

Organic light-emitting devices (OLEDs) are self-emission devices, which have superior characteristics in terms of a viewing angle, a response time, a brightness, a driving voltage, and a response speed, and which produce full-color images.

In a typical example, an organic light-emitting device includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

Meanwhile, luminescent compounds may be used to monitor, sense, or detect a variety of biological materials including cells and proteins. An example of the luminescent compounds includes a phosphorescent luminescent compound.

Various types of organic light emitting devices are known. However, there still remains a need in OLEDs having low driving voltage, high efficiency, high brightness, and long lifespan.

SUMMARY

Aspects of the present disclosure provide an organometallic compound, an organic light-emitting device including the organometallic compound, and a diagnostic composition including the organometallic compound.

Additional aspects will be set forth in part in the description which follows and, in part, will be apparent from the description, or may be learned by practice of the presented embodiments.

An aspect of the present disclosure provides an organometallic compound represented by Formula 1:

Formula 1

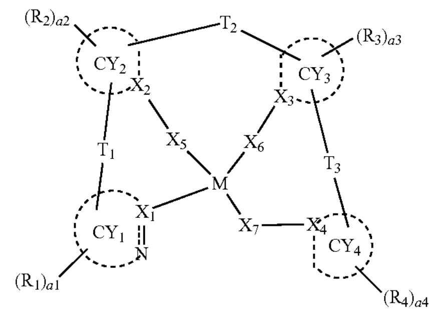

In Formula 1,

M may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au), $X_1$ may be N, $X_2$ to $X_4$ may each independently be C or N, $X_5$ to $X_7$ may each independently be a chemical bond, O, S, $B(R_7)$, $N(R_7)$, $P(R_7)$, $C(R_7)(R_8)$, $Si(R_7)(R_8)$, $Ge(R_7)(R_8)$, C(═O), $B(R_7)(R_8)$, $N(R_7)(R_8)$, or $P(R_7)(R_8)$, when $X_5$ is a chemical bond, $X_2$ and M may be directly linked to each other, when $X_6$ is a chemical bond, $X_3$ and M may be directly linked to each other, and when $X_7$ is a chemical bond, $X_4$ and M may be directly linked to each other, a bond between $X_1$ and M may be a coordinate bond, one bond selected from a bond between $X_2$ or $X_5$ and M, a bond between $X_3$ or $X_6$ and M, and a bond between $X_4$ or $X_7$ and M may be a coordinate bond, and the others thereof may each be a covalent bond, ring $CY_1$ may be a $C_1$-$C_{30}$ heterocyclic group having at least two N atoms as ring-forming atoms, ring $CY_2$ to ring $CY_4$ may each independently be selected from a $C_5$-$C_{30}$ carbocyclic group and a $C_1$-$C_{30}$ heterocyclic group, $T_1$ and $T_3$ may each independently be a single bond, a double bond, *—N(R')—*', *—B(R')—*', *—P(R')—*', *—C(R')(R")—*', *—Si(R')(R")—*', *—Ge(R')(R")—*', *—S—*', *—Se—*', *—O—*', *—C(═O)—*', *—S(═O)—*', *—$S(═O)_2$—*', *—C(R')=*', *=C(R')—*', *—C(R')═C(R")—*', *—C(═S)—*', or *—C≡C—*', $T_2$ may be a single bond, a double bond, *—$N(R_5)$—*', *—$B(R_5)$—*', *—$P(R_5)$—*', *—$C(R_5)(R_6)$—*', *—$Si(R_5)(R_6)$—*', *—$Ge(R_5)(R_6)$—*', *—S—*', *—Se*', *—O—*', *—C(═O)—*', *—S(═O)—*', *—$S(═O)_2$—*', *—$C(R_5)$=', *═$C(R_5)$—*', *—$C(R_5)$═$C(R_6)$—*', *—C(═S)—*', or *—C≡C—*', $R_1$ to $R_8$, R', and R" may each independently be selected from hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ aryl alkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroaryl alkyl group, a substituted or unsubstituted $C_2$-$C_{60}$ alkyl heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, and —$P(=O)(Q_8)(Q_9)$, a1 to a4 may each independently be an integer from 0 to 20, two of a plurality of neighboring groups $R_1$ may optionally be linked to form a $C_5$-$C_{30}$ carbocyclic group which is unsubstituted or substituted with at least one $R_{10a}$ or a $C_1$-$C_{30}$ heterocyclic group which is unsubstituted or substituted with at least one $R_{10a}$, two of a plurality of neighboring groups $R_2$ may optionally be linked to form a $C_5$-$C_{30}$ carbocyclic group which is unsubstituted or substituted with at least one $R_{10a}$ or a $C_1$-$C_{30}$ heterocyclic group which is unsubstituted or substituted with at least one $R_{10a}$, two of a plurality of neighboring groups $R_3$ may optionally be linked to form a $C_5$-$C_{30}$ carbocyclic group which is unsubstituted or substituted with at least one $R_{10a}$ or a $C_1$-$C_{30}$ heterocyclic group which is unsubstituted or substituted with at least one $R_{10a}$, two of a plurality of neighboring groups $R_4$ may optionally be linked to form a $C_5$-$C_{30}$ carbocyclic group which is unsubstituted or substituted with at least one $R_{10a}$ or a $C_1$-$C_{30}$ heterocyclic group which is unsubstituted or substituted with at least one $R_{10a}$, two of $R_1$ to $R_8$, R', and R" may optionally be linked to form a $C_5$-$C_{30}$ carbocyclic group which is unsubstituted or substituted with at least one $R_{10a}$ or a $C_1$-$C_{30}$ heterocyclic group which is unsubstituted or substituted with at least one $R_{10a}$, $R_{10a}$ is the same as described in connection with $R_1$,

* and *' each indicate a binding site to a neighboring atom, at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_6$-$C_{60}$ aryloxy group, the substituted $C_6$-$C_{60}$ arylthio group, the substituted $C_7$-$C_{60}$ aryl alkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroaryl alkyl group, the substituted $C_2$-$C_{60}$ alkyl heteroaryl group, the substituted monovalent non-aromatic condensed polycyclic group, and the substituted monovalent non-aromatic condensed heteropolycyclic group may be selected from:

deuterium, —F, —Br, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_{60}$ alkoxy group, each substituted with at least one selected from deuterium, —F, —Cl, —Br, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroaryl alkyl group, a $C_2$-$C_{60}$ alkyl heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroaryl alkyl group, a $C_2$-$C_{60}$ alkyl heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroaryl alkyl group, a $C_2$-$C_{60}$ alkyl heteroaryl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroaryl alkyl group, a $C_2$-$C_{60}$ alkyl heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), and —P(═O)($Q_{28}$)($Q_{29}$), and
—N($Q_{31}$)($Q_{32}$), —Si($Q_{33}$)($Q_{34}$)($Q_{35}$), —B($Q_{36}$)($Q_{37}$), and —P(═O)($Q_{38}$)($Q_{39}$), and $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_7$-$C_{60}$ alkylaryl group, a $C_1$-$C_{60}$ alkyl group, and a $C_6$-$C_{60}$ aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroaryl alkyl group, a $C_2$-$C_{60}$ alkyl heteroaryl group, a monovalent non-aromatic condensed polycyclic group, and a monovalent non-aromatic condensed heteropolycyclic group.

Another aspect of the present disclosure provides an organic light-emitting device including:

a first electrode, a second electrode, and an organic layer disposed between the first electrode and the second electrode, wherein the organic layer includes an emission layer, and wherein the organic layer includes at least one organometallic compound.

In the organic layer, the organometallic compound may serve as a dopant.

Another aspect of the present disclosure provides a diagnostic composition including at least one organometallic compound represented by Formula 1.

BRIEF DESCRIPTION OF THE DRAWING

These and/or other aspects will become apparent and more readily appreciated from the following description of the embodiments, taken in conjunction with the FIGURE which is a schematic view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

In an embodiment, an organometallic compound represented by Formula 1 below is provided:

Formula 1

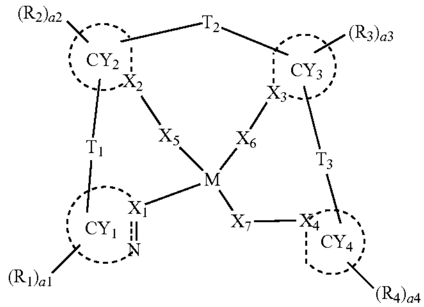

M in Formula 1 may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au).

For example, M may be Pt, Pd, or Au, but embodiments of the present disclosure are not limited thereto.

In Formula 1, $X_1$ may be N, $X_2$ to $X_4$ may each independently be C or N, $X_5$ to $X_7$ may each independently be a chemical bond, O, S, $B(R_7)$, $N(R_7)$, $P(R_7)$, $C(R_7)(R_8)$, $Si(R_7)(R_8)$, $Ge(R_7)(R_8)$, $C(=O)$, $B(R_7)(R_8)$, $N(R_7)(R_8)$, or $P(R_7)(R_8)$, when $X_5$ is the chemical bond, $X_2$ and M may be directly linked to each other, when $X_6$ is the chemical bond, $X_3$ and M may be directly linked to each other, and when $X_7$ is the chemical bond, $X_4$ and M may be directly linked to each other. $R_7$ and $R_8$ are the same as described herein.

In one or more embodiments, in Formula 1, $X_2$ and $X_3$ may each be C, $X_4$ may be N, and $X_5$ to $X_7$ may each be a chemical bond; or $X_2$ and $X_4$ may each be C, $X_3$ may be N, $X_5$ and $X_6$ may each be a chemical bond, and $X_7$ may be a chemical bond, O, or S, but embodiments of the present disclosure are not limited thereto.

In Formula 1, a bond between $X_1$ and M may be a coordinate bond, one bond selected from a bond between $X_2$ or $X_5$ and M, a bond between $X_3$ or $X_6$ and M, and a bond between $X_4$ or $X_7$ and M may be a coordinate bond, and the others thereof may each be a covalent bond. Therefore, the organometallic compound represented by Formula 1 may be electrically neutral.

In one or more embodiments, in Formula 1, a bond between $X_2$ or $X_5$ and M and a bond between $X_3$ or $X_6$ and M may each be a covalent bond, $X_7$ may be a chemical bond, and a bond between $X_4$ and M may be a coordinate bond; or a bond between $X_2$ or $X_5$ and M and a bond between $X_4$ or $X_7$ and M may each be a covalent bond, $X_6$ may be a chemical bond, and a bond between $X_3$ and M may be a coordinate bond, but embodiments of the present disclosure are not limited thereto.

In Formula 1, ring $CY_1$ may be a $C_1$-$C_{30}$ heterocyclic group having at least two N atoms as a ring-forming atom, and ring $CY_2$ to ring $CY_4$ may each independently be selected from a $C_5$-$C_{30}$ carbocyclic group and a $C_1$-$C_{30}$ heterocyclic group.

In one or more embodiments, in Formula 1, ring $CY_1$ may be selected from i) a first ring, ii) a condensed ring in which at least two of the first ring is condensed, and iii) a condensed ring in which at least one of the first ring and at least one of a second ring are condensed to each other, the first ring may be a pyridazine group, a triazine group, or a tetrazine group, and the second ring may be selected from a cyclopentane group, a cyclopentadiene group, a furan group, a thiophene group, a pyrrole group, a silole group, an indene group, a benzofuran group, a benzothiophene group, an indole group, a benzosilole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, a triazasilole group, an adamantane group, a norbornane group, a norbornene group, a cyclohexane group, a cyclohexene group, a benzene group, a pyridine group, a pyrimidine group, and a pyrazine group.

When ring $CY_1$ is a condensed ring in which at least one of the first ring and at least one of a second ring are condensed with each other, N in the first ring of the condensed ring may be coordinately bonded to M in Formula 1. That is, when ring $CY_1$ is a condensed ring in which at least one of the first ring and at least one of a second ring are condensed with each other, N in the first ring of the condensed ring may be $X_1$ coordinately bonded to M in Formula 1.

In one or more embodiments, in Formula 1, ring $CY_2$ to ring $CY_4$ may each independently be selected from i) a third ring, ii) a fourth ring, iii) a condensed ring in which at least two of the third ring are condensed to each other, iv) a condensed ring in which at least two of the fourth ring are condensed to each other, and v) a condensed ring in which at least one of the third ring and at least one of the fourth ring are condensed to each other, the third ring may be selected from a cyclopentane group, a cyclopentadiene group, a furan group, a thiophene group, a pyrrole group, a silole group, an indene group, a benzofuran group, a benzothiophene group, an indole group, a benzosilole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, and a triazasilole group, and the fourth ring may be selected from an adamantane group, a norbornane group, a norbornene group, a cyclohexane group, a cyclohexene group, a benzene group, a pyridine group, a pyrimidine group, a pyrazine group, a pyridazine group, and a triazine group.

For example, ring $CY_2$ to ring $CY_4$ may each independently be selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group.

In Formula 1, $T_1$ and $T_3$ may each independently be a single bond, a double bond, *—N(R')—*' *—C(R')(R")—*', *—Si(R')(R")—*', *—Ge(R')(R")—*', *—C(═O)—*', *—S(═O)—*', *—S(═O)$_2$—*', *—C(R')=*', *═C(R')—*', *—C(R')═C(R")—*', *—C(═S)—*', or *—C≡C—*', and $T_2$ may be a single bond, a double bond, *—N($R_5$)—*', *—B($R_5$)—*', *—P($R_5$)—*', *—C($R_5$)($R_6$)—*', *—Si($R_5$)($R_6$)—*', *—Ge($R_5$)($R_6$)—*', *—C(═O)—*', *—S(═O)—*', *—S(═O)$_2$—*', *—C($R_5$)=*', *═C($R_5$)—*', *—C($R_5$)═C($R_6$)—*', *—C(═S)—*', or *—C≡C—*'. R', R", $R_5$, and $R_6$ may be understood by referring to the description provided herein.

In an embodiment, in Formula 1, $T_1$ and $T_3$ may each be a single bond, and $T_2$ may be *—N($R_5$)—*', *—C($R_5$)($R_6$)—*', *—Si($R_5$)($R_6$)—*', *—S—*', or *—O—*', but embodiments of the present disclosure are not limited thereto.

In Formula 1, $R_1$ to $R_8$, R', and R" may each independently be selected from hydrogen, deuterium, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ aryl alkyl group, a substituted or unsubstituted heteroaryl group, a substituted or unsubstituted heteroaryloxy group, a substituted or unsubstituted $C_1$-$C_{60}$ heteroarylthio group, a substituted or unsubstituted $C_2$-$C_{60}$ heteroaryl alkyl group, a substituted or unsubstituted $C_2$-$C_{60}$ alkyl heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(═O)($Q_8$)($Q_9$). $Q_1$ to $Q_9$ are each independently the same as described above.

For example, $R_1$ to $R_8$, R', and R" may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, and a $C_1$-$C_{20}$ alkoxy group;

a $C_1$-$C_{29}$ alkyl group and a $C_1$-$C_{29}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, and a pyrimidinyl group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkyl phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkyl phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkyl phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and $N(Q_1)(Q_2)$, $—Si(Q_3)(Q_4)(Q_5)$, $—B(Q_6)(Q_7)$, and $—P(=O)(Q_8)(Q_9)$, and $Q_1$ to $Q_9$ may each independently be selected from:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, $—CD_2CH_3$, and $—CD_2CDH_2$;

an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group.

In an embodiment, $R_1$ to $R_8$, R', and R" may each independently be selected from hydrogen, deuterium, —F, a cyano group, a nitro group, $—SF_5$, $—CH_3$, $—CD_3$, $—CD_2H$, $—CDH_2$, $—CF_3$, $—CF_2H$, $—CFH_2$, groups represented by Formulae 9-1 to 9-19, groups represented by Formulae 10-1 to 10-226, and $—Si(Q_1)(Q_2)(Q_3)$ (wherein $Q_1$ to $Q_3$ are the same as described above):

9-1

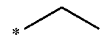

9-2

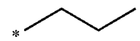

9-3

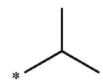

9-4

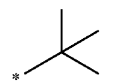

9-5

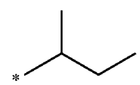

9-6

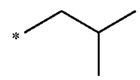

9-7

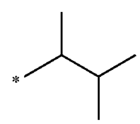

9-8

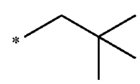

9-9

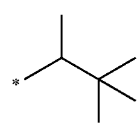

9-10

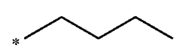

9-11

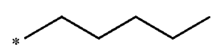

9-12

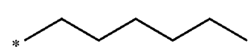

9-13

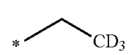

9-14

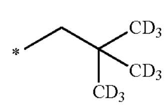

9-15

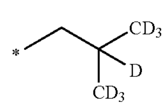

9-16

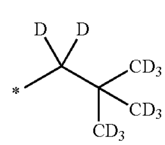

-continued
9-17
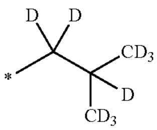
9-18
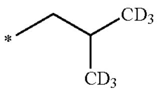
9-19
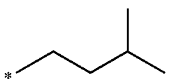
10-1
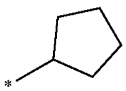
10-2
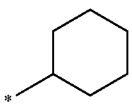
10-3
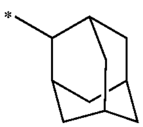
10-4
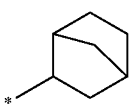
10-5
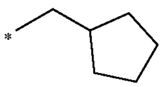
10-6
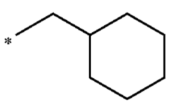
10-7
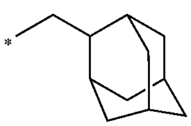
10-8
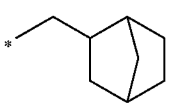
10-9
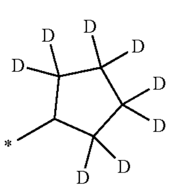
-continued
10-10
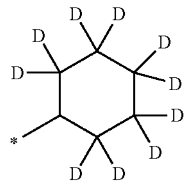
10-11
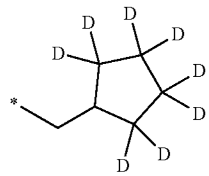
10-12
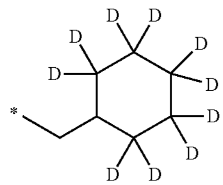
10-13
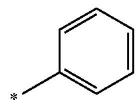
10-14
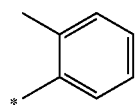
10-15
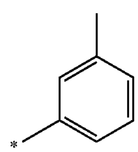
10-16
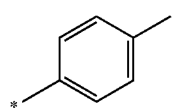
10-17
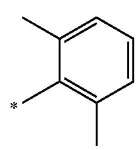
10-18
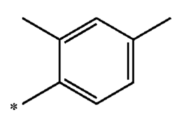
10-19
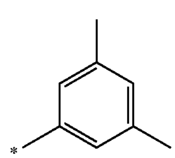

-continued
10-20
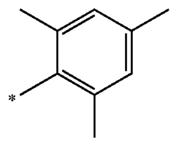
10-21
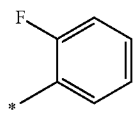
10-22
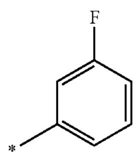
10-23
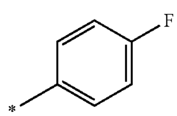
10-24
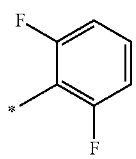
10-25
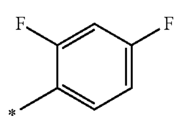
10-26
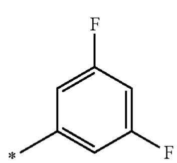
10-27
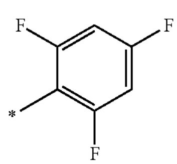
10-28
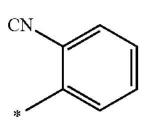
10-29
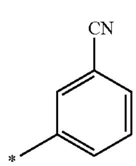
-continued
10-30
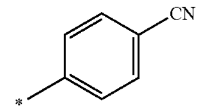
10-31
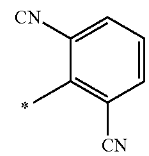
10-32
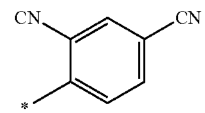
10-33
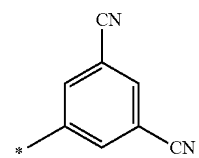
10-34
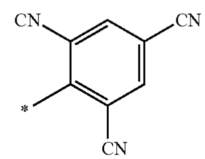
10-35
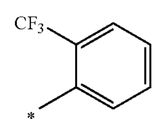
10-36
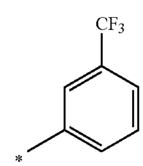
10-37
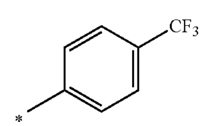
10-38
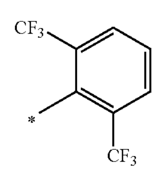
10-39
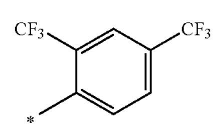

10-40
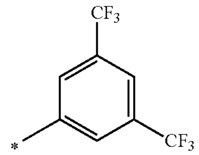
10-41
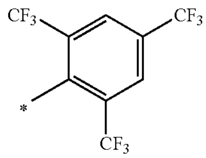
10-42
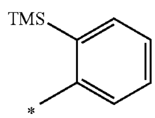
10-43
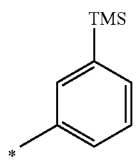
10-44
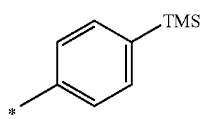
10-45
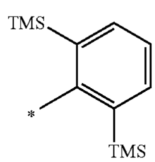
10-46
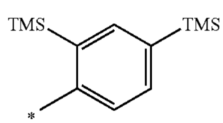
10-47
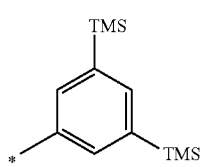
10-48
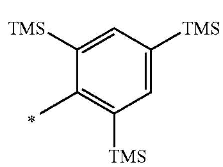
10-49
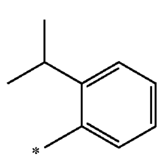
10-50
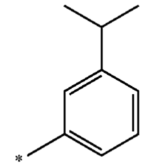
10-51
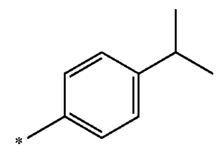
10-52
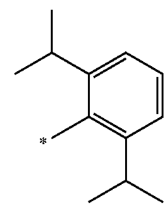
10-53
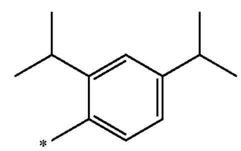
10-54
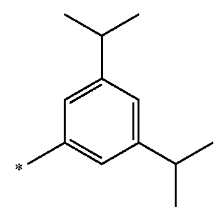
10-55
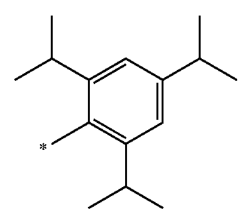
10-56
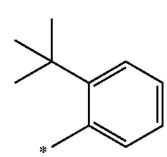
10-57
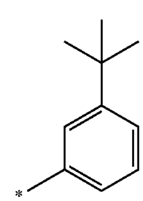

-continued
10-58
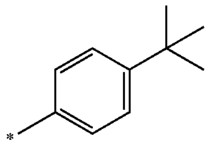
10-59
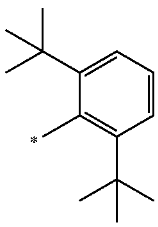
10-60
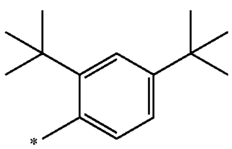
10-61
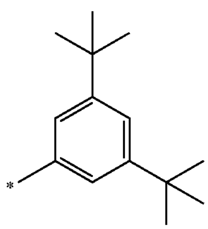
10-62
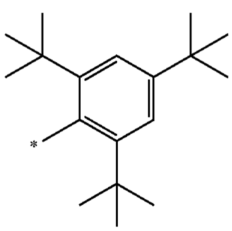
10-63
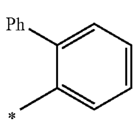
10-64
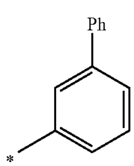
10-65
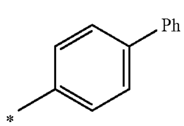
10-66
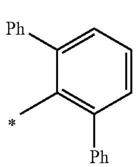
-continued
10-67
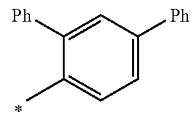
10-68
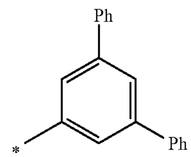
10-69
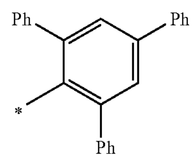
10-70
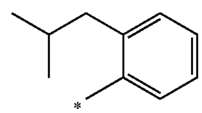
10-71
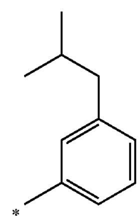
10-72
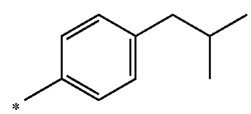
10-73
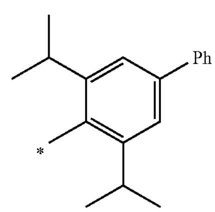
10-74
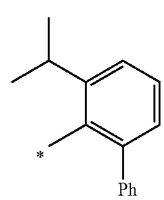
10-75
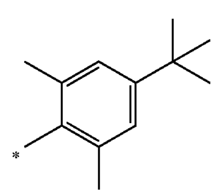

-continued
10-76
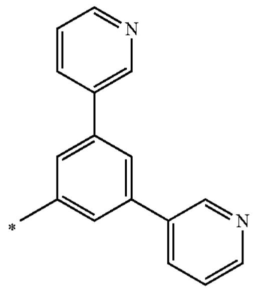
10-77
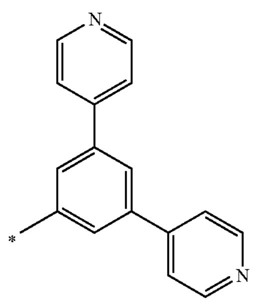
10-78
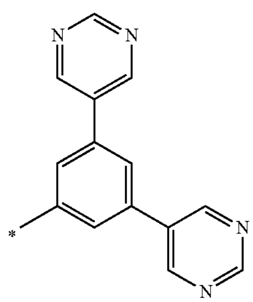
10-79
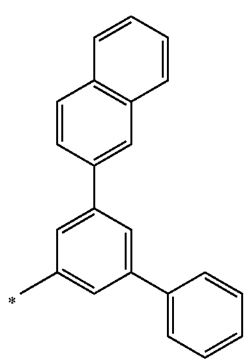
10-80
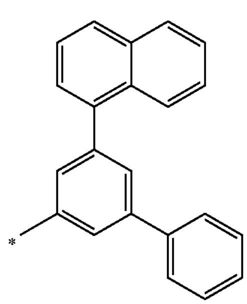
-continued
10-81
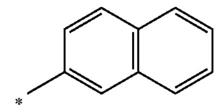
10-82
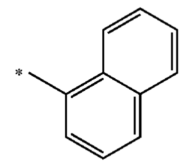
10-83
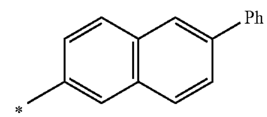
10-84
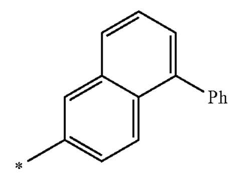
10-85
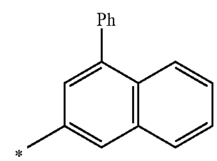
10-86
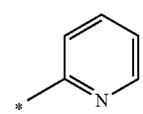
10-87
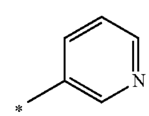
10-88
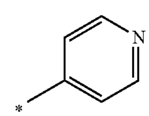
10-89
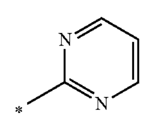
10-90
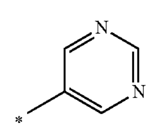
10-91
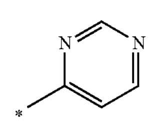

-continued
10-92
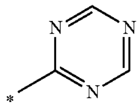
10-93
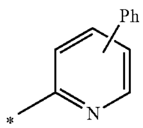
10-94
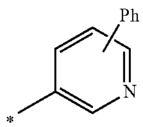
10-95
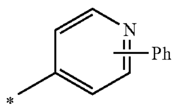
10-96
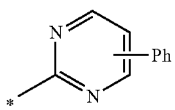
10-97
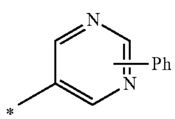
10-98
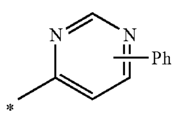
10-99
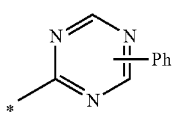
10-100
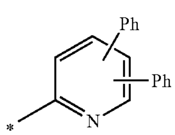
10-101
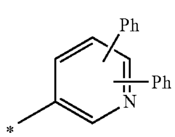
10-102
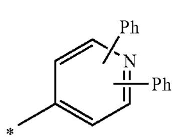
-continued
10-103
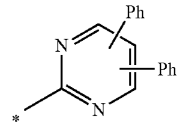
10-104
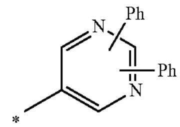
10-105
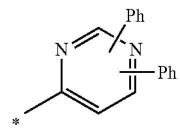
10-106
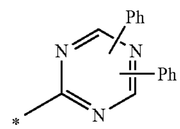
10-107
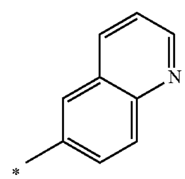
10-108
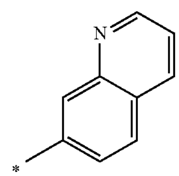
10-109
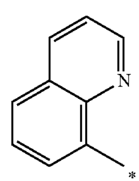
10-110
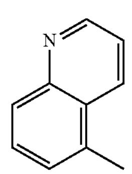
10-111
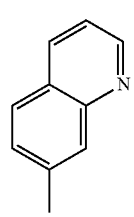

-continued
10-112
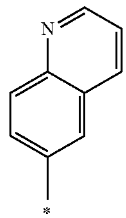
10-113
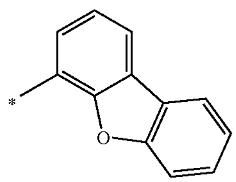
10-114
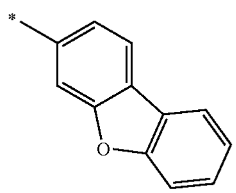
10-115
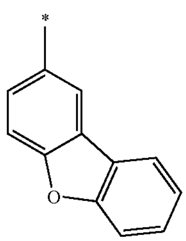
10-116
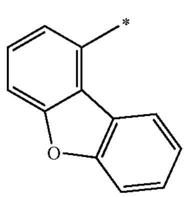
10-117
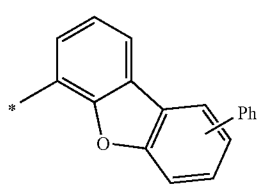
10-118
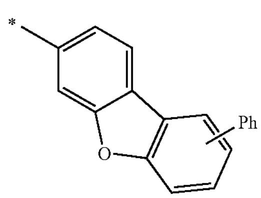
-continued
10-119
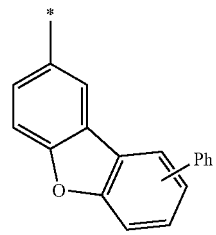
10-120
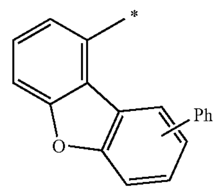
10-121
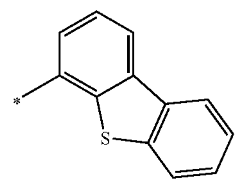
10-122
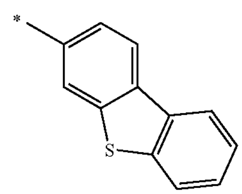
10-123
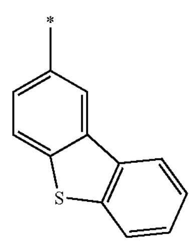
10-124
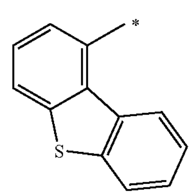
10-125
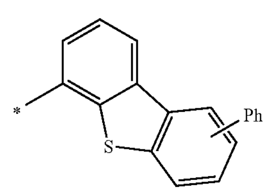

-continued
10-126
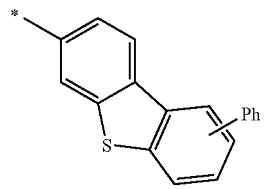
10-127
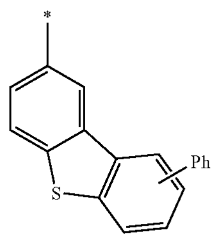
10-128
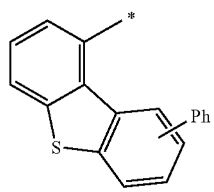
10-129
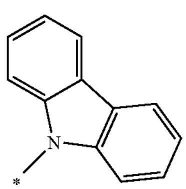
10-130
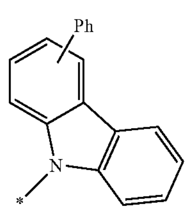
10-131
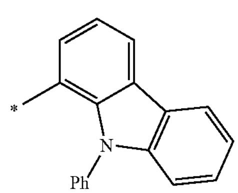
10-132
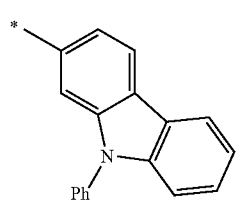
-continued
10-133
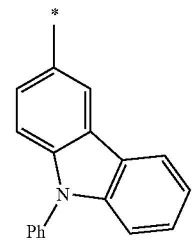
10-134
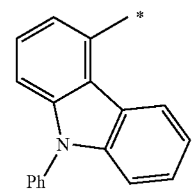
10-135
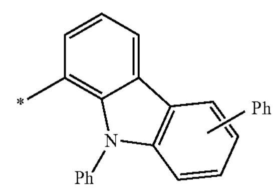
10-136
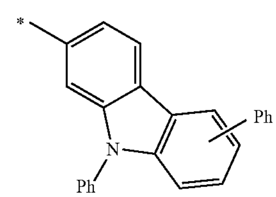
10-137
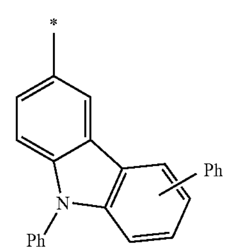
10-138
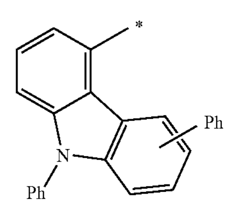
10-139
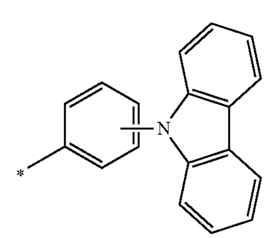

-continued
10-140
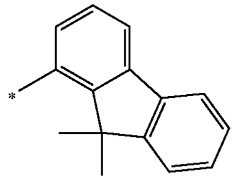
10-141
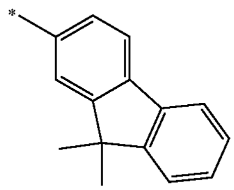
10-142
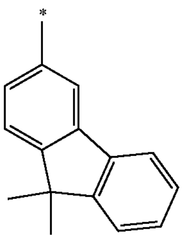
10-143
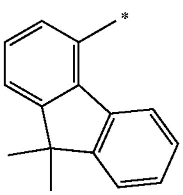
10-144
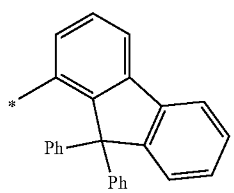
10-145
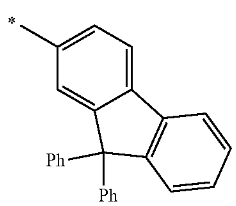
10-146
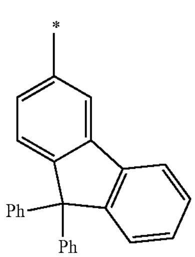
-continued
10-147
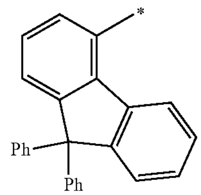
10-148
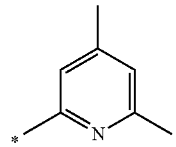
10-149
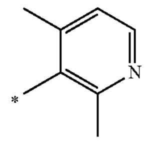
10-150
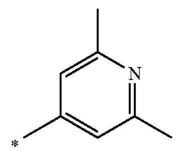
10-151
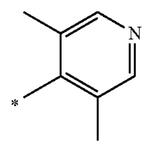
10-152
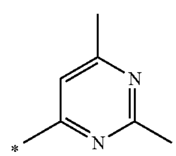
10-153
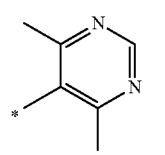
10-154
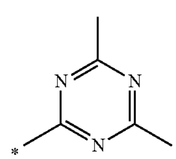
10-155
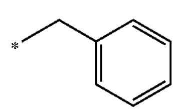

-continued
10-156
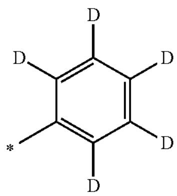
10-157
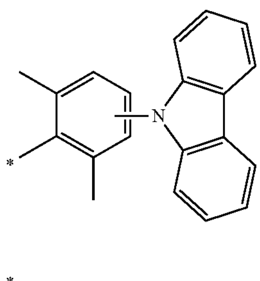
10-158
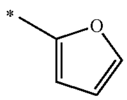
10-159
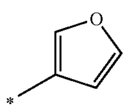
10-160
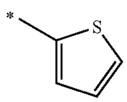
10-161
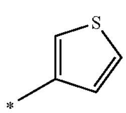
10-162
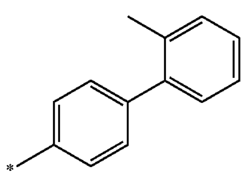
10-163
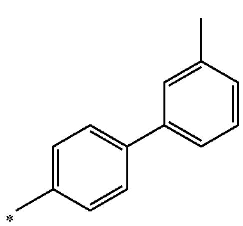
10-164
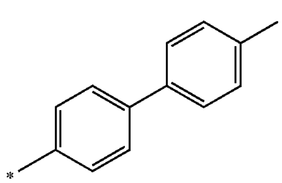
-continued
10-165
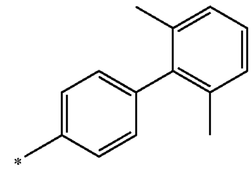
10-166
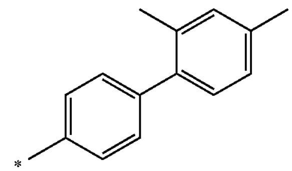
10-167
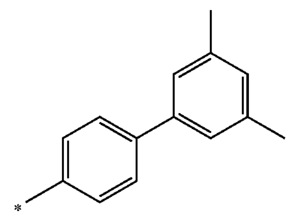
10-168
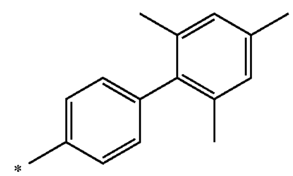
10-169
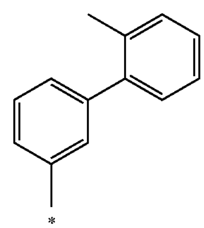
10-170
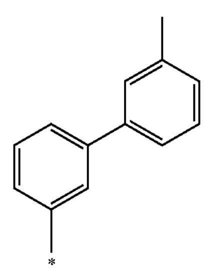
10-171
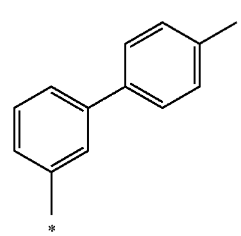

-continued
10-172
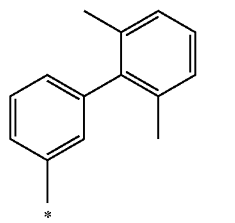
10-173
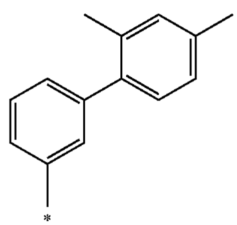
10-174
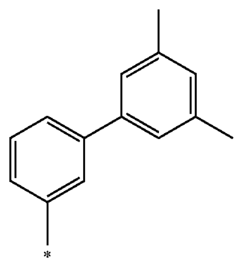
10-175
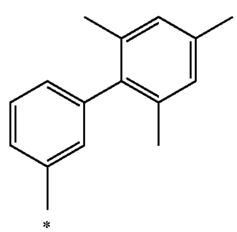
10-176
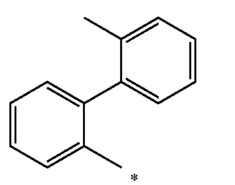
10-177
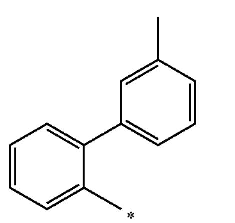
10-178
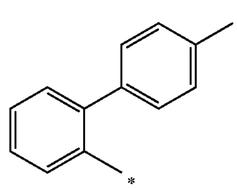
-continued
10-179
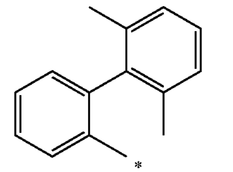
10-180
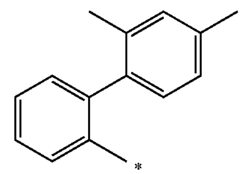
10-181
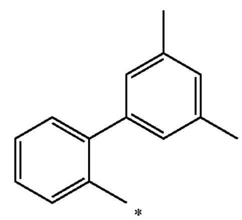
10-182
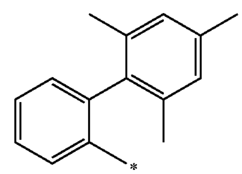
10-183
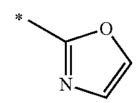
10-184
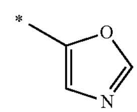
10-185
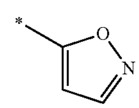
10-186
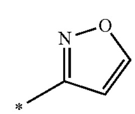
10-187
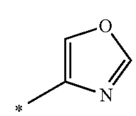
10-188
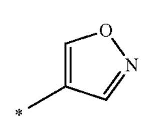
10-189
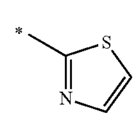

-continued
10-190
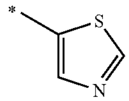
10-191
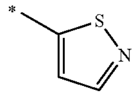
10-192
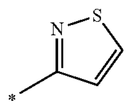
10-193
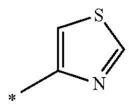
10-194
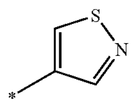
10-195
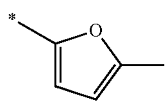
10-196
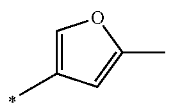
10-197
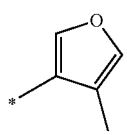
10-198
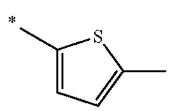
10-199
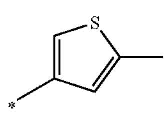
10-200
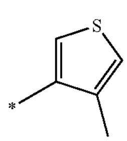
10-201
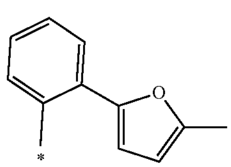
-continued
10-202
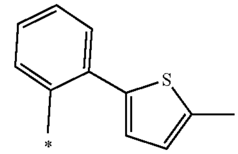
10-203
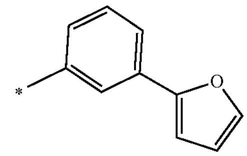
10-204
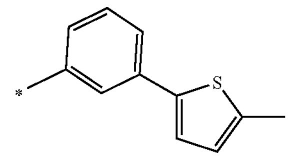
10-205
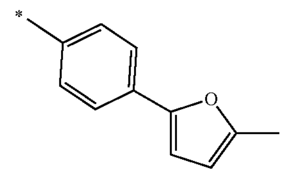
10-206
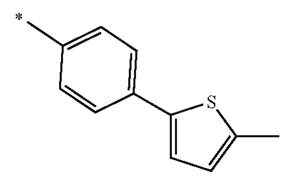
10-207
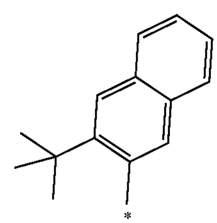
10-208
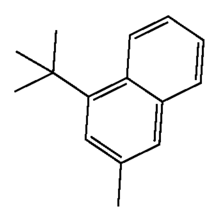
10-209
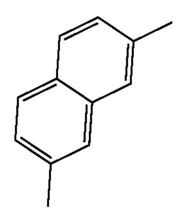

-continued
10-210
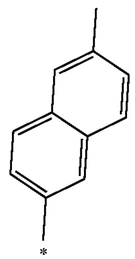
10-211
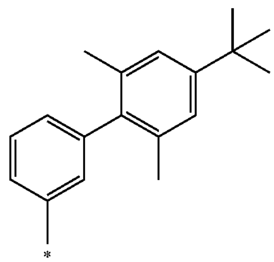
10-212
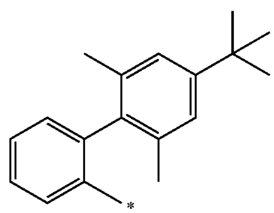
10-213
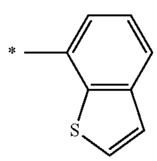
10-214
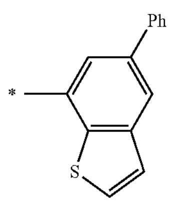
10-215
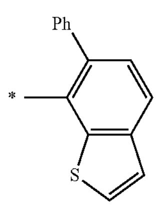
10-216
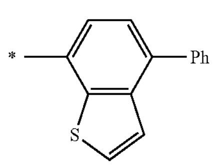
-continued
10-217
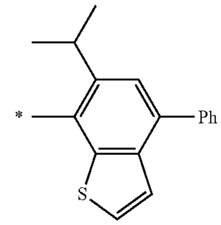
10-218
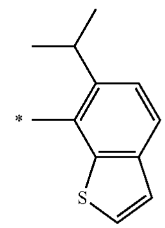
10-219
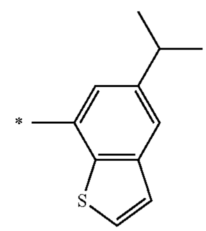
10-220
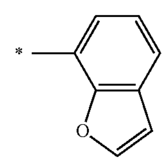
10-221
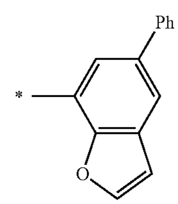
10-222
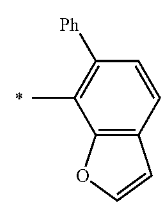
10-223
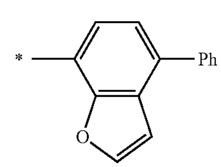

-continued 10-224

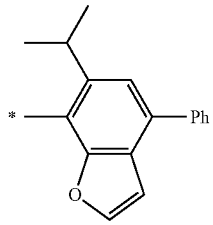

10-225

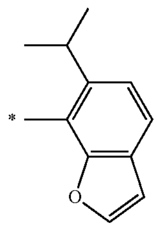

10-226

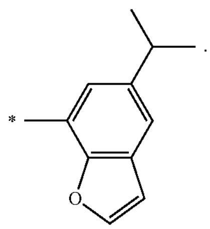

In Formulae 9-1 to 9-19 and 10-1 to 10-226, * indicates a binding site to a neighboring atom, Ph indicates a phenyl group, and TMS indicates a trimethylsilyl group.

a1 to a4 in Formula 1 indicate the number of groups $R_1$ to $R_4$, respectively, and may each independently be an integer from 0 to 20. When a1 is two or more, two or more groups $R_1$ may be identical to or different from each other, when a2 is two or more, two or more groups $R_2$ may be identical to or different from each other, when a3 is two or more, two or more groups $R_3$ may be identical to or different from each other, and when a4 is two or more, two or more groups $R_4$ may be identical to or different from each other. For example, a1 to a4 may each independently be an integer from 0 to 7.

In Formula 1, i) two of a plurality of neighboring groups $R_1$ may optionally be linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, ii) two of a plurality of neighboring groups $R_2$ may optionally be linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, iii) two of a plurality of neighboring groups $R_3$ may optionally be linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, iv) two of a plurality of neighboring groups $R_4$ may optionally be linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, v) two of $R_1$ to $R_8$, R', and R" may optionally be linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$. The "$C_5$-$C_{30}$ carbocyclic group" and the "$C_1$-$C_{30}$ heterocyclic group" are the same as described in connection with ring $CY_1$, and $R_{10a}$ is the same as described in connection with $R_1$.

* and *' each indicate a binding site to a neighboring atom.

In an embodiment, the organometallic compound represented by Formula 1 may satisfy one of Condition 1 and Condition 2:

Condition 1 i) $X_5$ and $X_6$ are each a chemical bond, ii) $T_2$ is not a single bond, iii) a moiety represented by

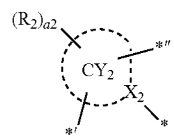

is represented by Formula A2-1, and iv) a moiety represented by

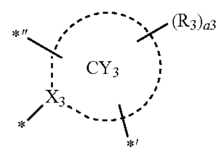

is represented by Formula A3-1; and

Condition 2 i) $X_5$ and $X_6$ are each a chemical bond, ii) $T_2$ is a single bond, iii) a moiety represented by

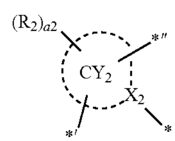

is represented by Formula A2-2, or a moiety represented by

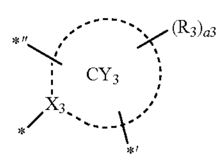

is represented by Formula A3-3:

A2-1

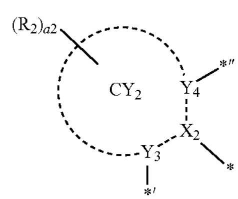

-continued

A2-2

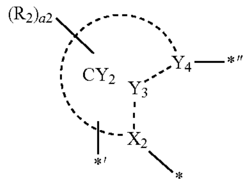

A3-1

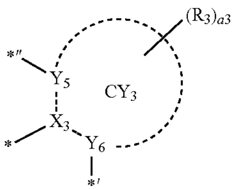

A3-3

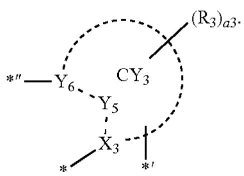

In Formulae A2-1, A2-2, A3-1, and A3-3, $X_2$, $X_3$, $R_2$, $R_3$, a2, and a3 are the same as described herein, and $Y_3$ to $Y_6$ may each independently be N or C, in Formulae A2-1 and A2-2, * indicates a binding site to $X_5$ or M in Formula 1, *' indicates a binding site to $T_1$ in Formula 1, and *" indicates a binding site to $T_2$ in Formula 1, and in Formulae A3-1 and A3-3, * indicates a binding site to $X_6$ or M in Formula 1, *" indicates a binding site to $T_2$ in Formula 1, and *' indicates a binding site to $T_3$ in Formula 1.

In one or more embodiments, a moiety represented by

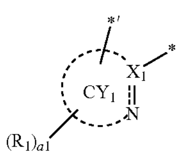

in Formula 1 may be represented by one of Formulae A1-1(1) to A1-1(28) and A1-2(1) to A1-2(9):

A1-1(1)

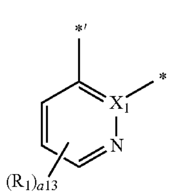

A1-1(2)

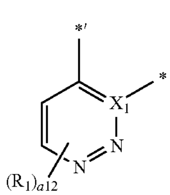

-continued

A1-1(3)

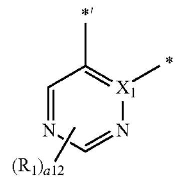

A1-1(4)

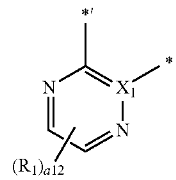

A1-1(5)

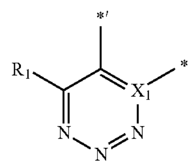

A1-1(6)

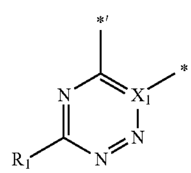

A1-1(7)

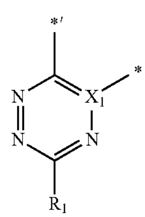

A1-1(8)

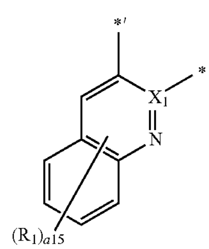

A1-1(9)

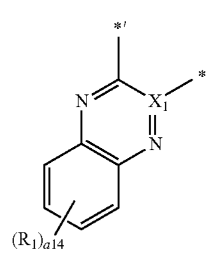

-continued
A1-1(10)
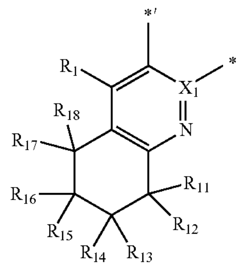
A1-1(11)
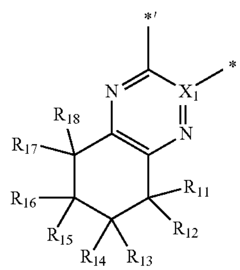
A1-1(12)
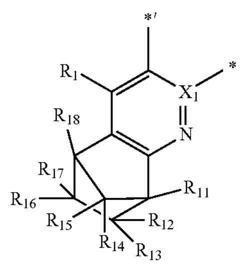
A1-1(13)
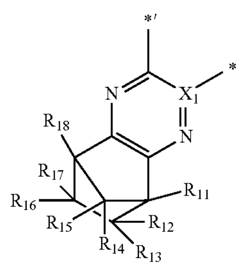
A1-1(14)
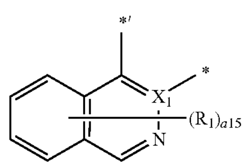
A1-1(15)
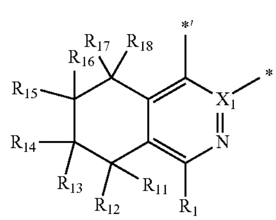
-continued
A1-1(16)
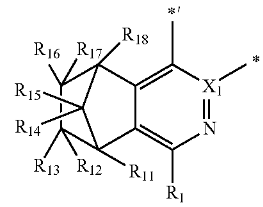
A1-1(17)
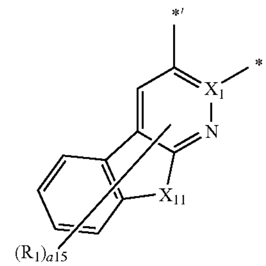
A1-1(18)
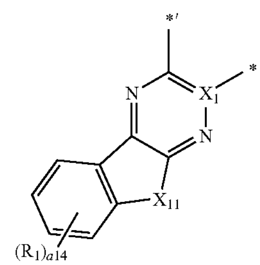
A1-1(19)
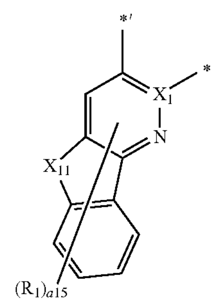
A1-1(20)
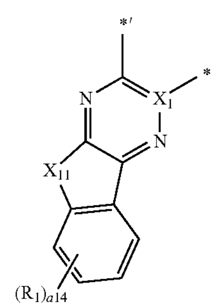
A1-1(21)
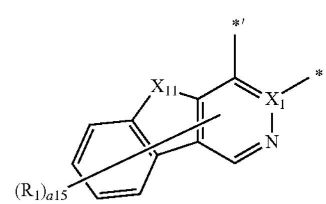

-continued
A1-1(22)
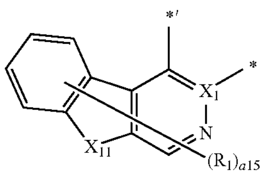
A1-1(23)
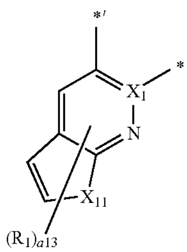
A1-1(24)
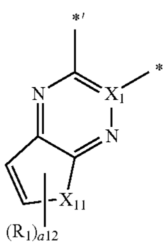
A1-1(25)
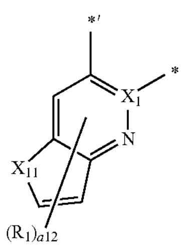
A1-1(26)
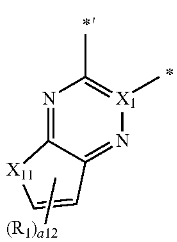
A1-1(27)
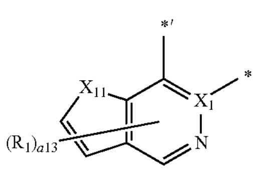
A1-1(28)
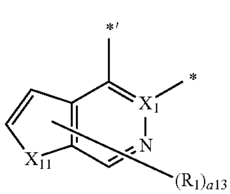
-continued
A1-2(1)
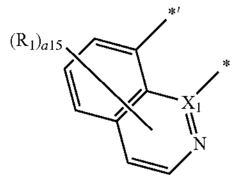
A1-2(2)
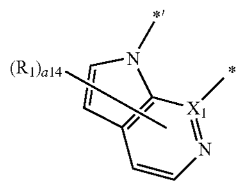
A1-2(3)
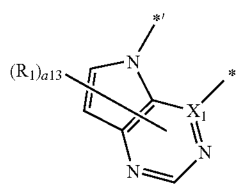
A1-2(4)
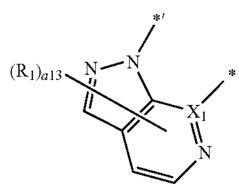
A1-2(5)
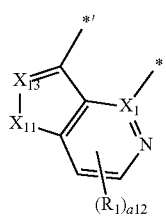
A1-2(6)
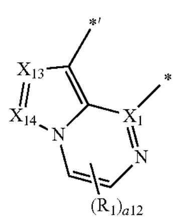
A1-2(7)
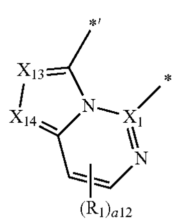

-continued

A1-2(8)

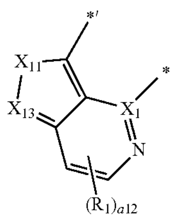

A1-2(9)

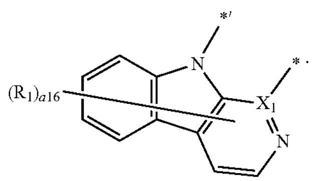

In Formulae A1-1(1) to A1-1(28) and A1-2(1) to A1-2(9), $X_1$ and $R_1$ are the same as described herein, $X_{11}$ may be O, S, $N(R_{11})$, $C(R_{11})(R_{12})$, or $Si(R_{11})(R_{12})$, $X_{13}$ may be N or $C(R_{13})$, $X_{14}$ may be N or $C(R_{14})$, $R_{11}$ to $R_{18}$ are the same as described in connection with a15 may be an integer from 0 to 5, a14 may be an integer from 0 to 4, a13 may be an integer from 0 to 3, a12 may be an integer from 0 to 2,

*indicates a binding site to M in Formula 1, and

*' indicates a binding site to $T_1$ in Formula 1.

In one or more embodiments, a moiety represented by

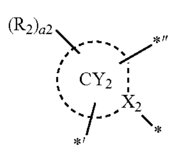

in Formula 1 may be represented by one of Formulae A2-1(1) to A2-1(21), A2-2(1) to A2-2(58), and A2-3(1) to A2-3(58):

A2-1(1)

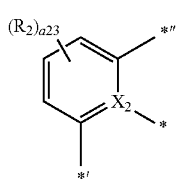

A2-1(2)

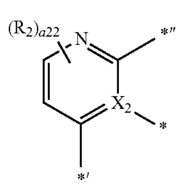

-continued

A2-1(3)

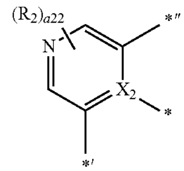

A2-1(4)

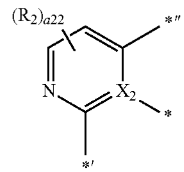

A2-1(5)

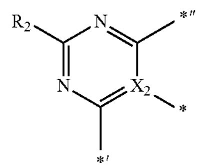

A2-1(6)

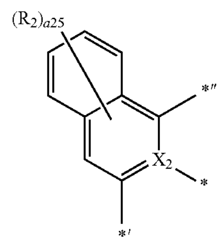

A2-1(7)

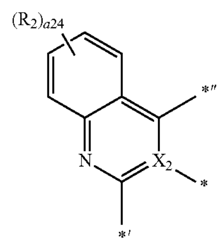

A2-1(8)

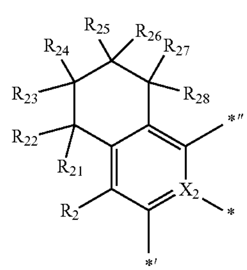

A2-1(9)

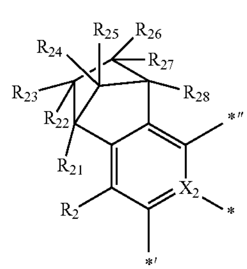

-continued
A2-1(10)
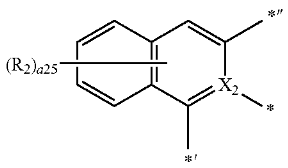
A2-1(11)
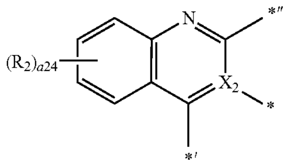
A2-1(12)
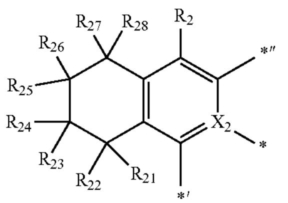
A2-1(13)
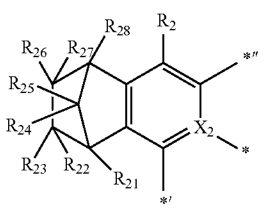
A2-1(14)
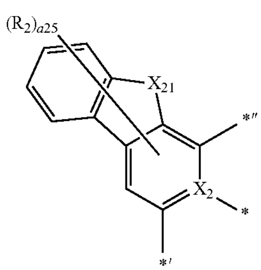
A2-1(15)
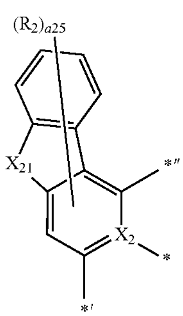
A2-1(16)
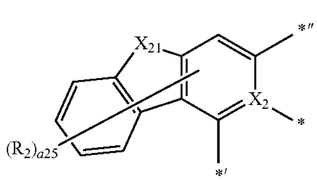
-continued
A2-1(17)
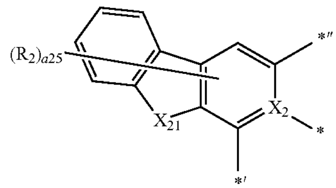
A2-1(18)
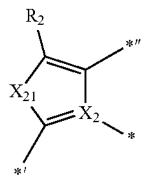
A2-1(19)
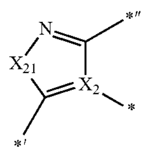
A2-1(20)
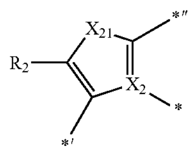
A2-1(21)
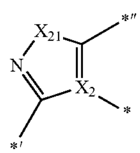
A2-2(1)
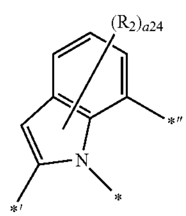
A2-2(2)
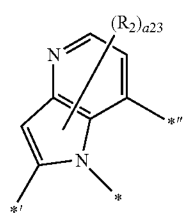
A2-2(3)
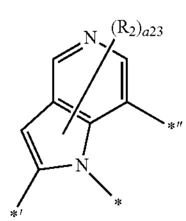

A2-2(4)
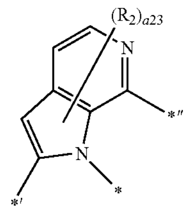
A2-2(5)
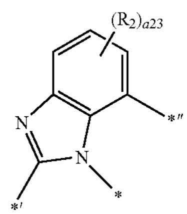
A2-2(6)
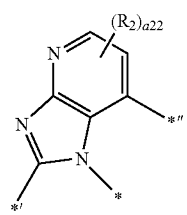
A2-2(7)
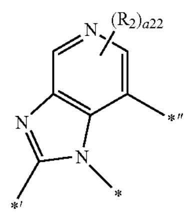
A2-2(8)
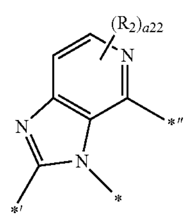
A2-2(9)
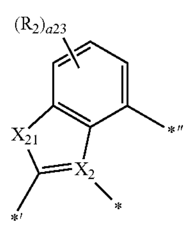
A2-2(10)
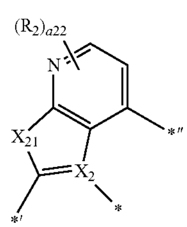
A2-2(11)
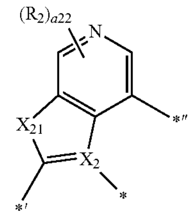
A2-2(12)
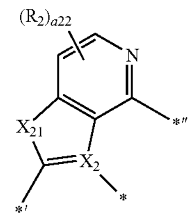
A2-2(13)
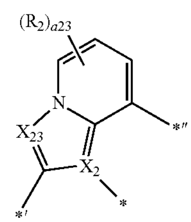
A2-2(14)
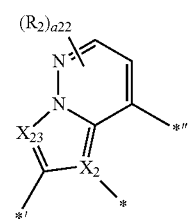
A2-2(15)
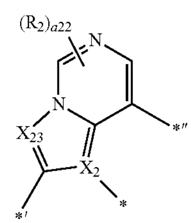
A2-2(16)
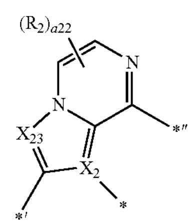
A2-2(17)
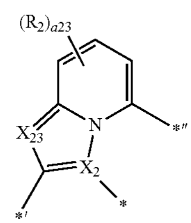

-continued
A2-2(18)
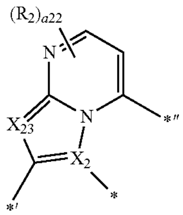
A2-2(19)
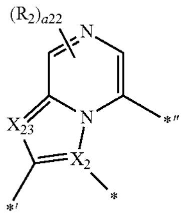
A2-2(20)
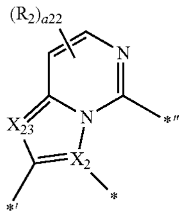
A2-2(21)
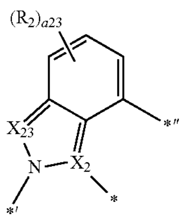
A2-2(22)
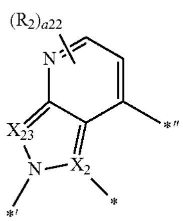
A2-2(23)
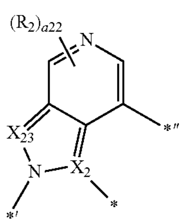
A2-2(24)
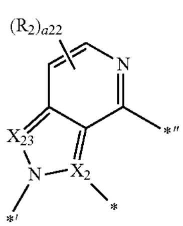
-continued
A2-2(25)
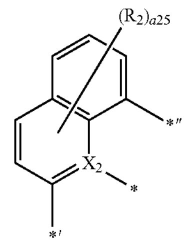
A2-2(26)
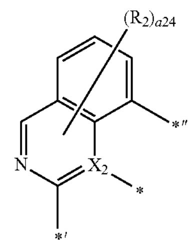
A2-2(27)
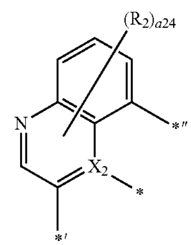
A2-2(28)
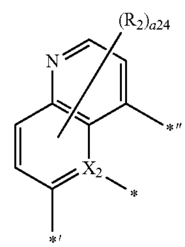
A2-2(29)
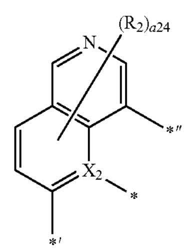
A2-2(30)
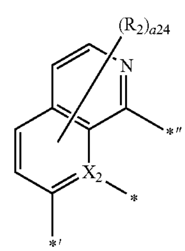

-continued
A2-2(31)
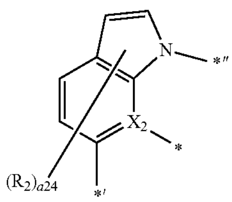
A2-2(32)
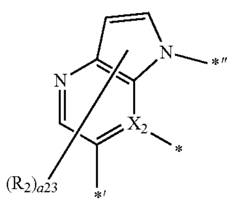
A2-2(33)
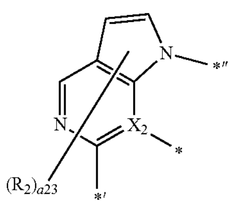
A2-2(34)
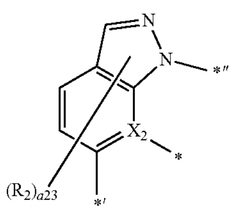
A2-2(35)
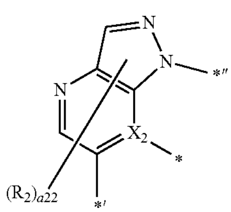
A2-2(36)
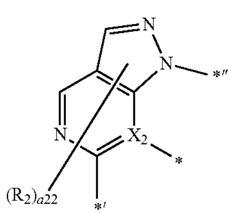
A2-2(37)
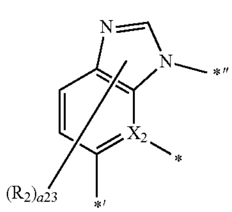
-continued
A2-2(38)
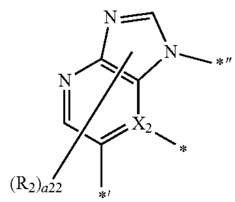
A2-2(39)
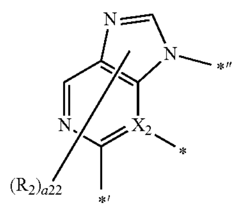
A2-2(40)
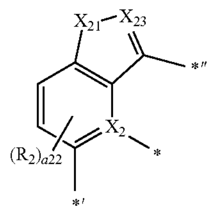
A2-2(41)
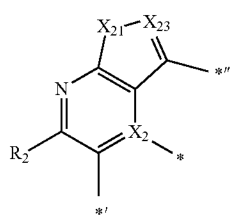
A2-2(42)
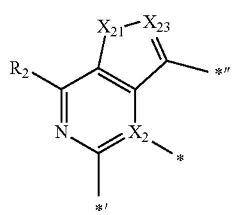
A2-2(43)
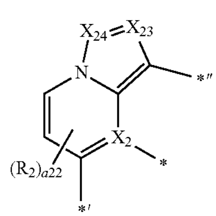
A2-2(44)
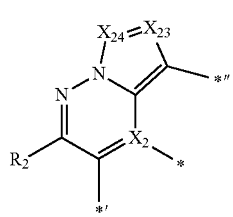

-continued
A2-2(45)
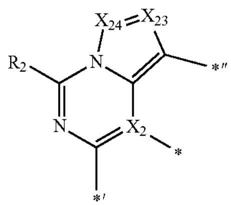
A2-2(46)
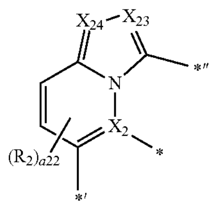
A2-2(47)
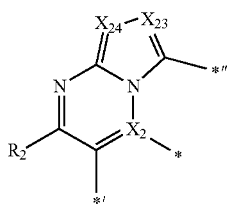
A2-2(48)
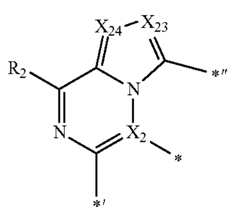
A2-2(49)
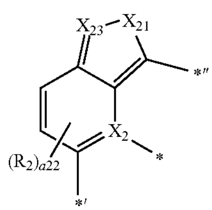
A2-2(50)
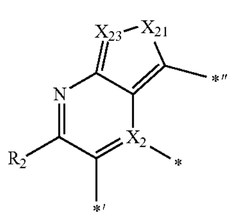
A2-2(51)
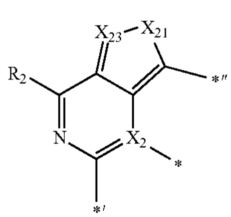
-continued
A2-2(52)
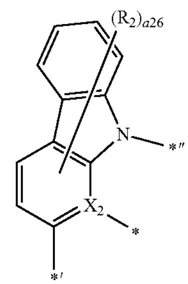
A2-2(53)
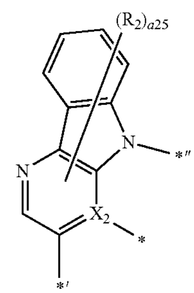
A2-2(54)
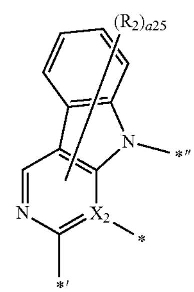
A2-2(55)
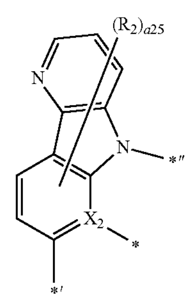
A2-2(56)
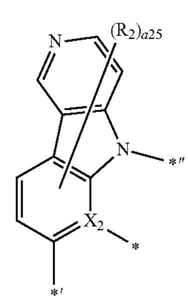

-continued
A2-2(57)
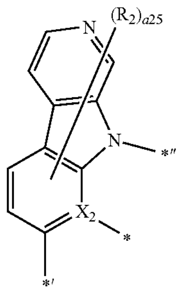
A2-2(58)
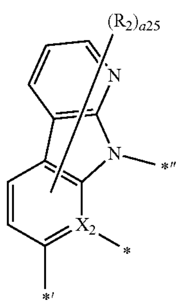
A2-3(1)
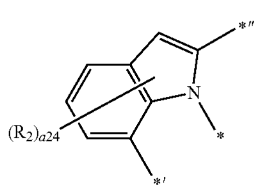
A2-3(2)
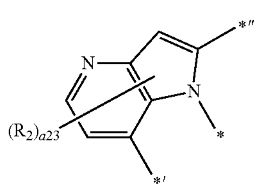
A2-3(3)
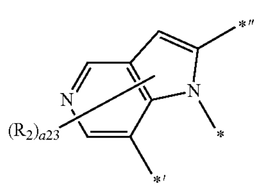
A2-3(4)
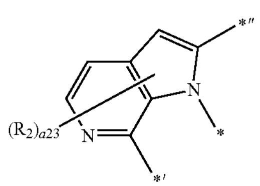
A2-3(5)
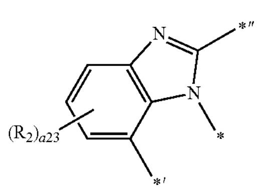
-continued
A2-3(6)
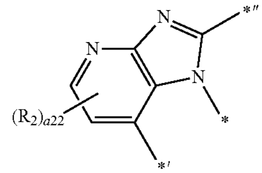
A2-3(7)
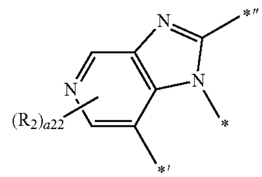
A2-3(8)
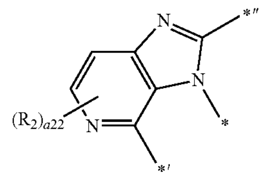
A2-3(9)
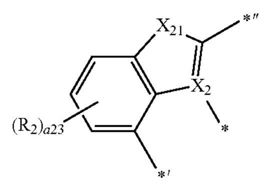
A2-3(10)
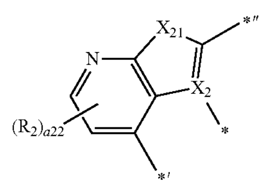
A2-3(11)
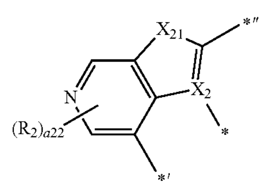
A2-3(12)
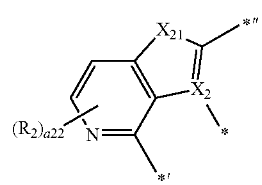
A2-3(13)
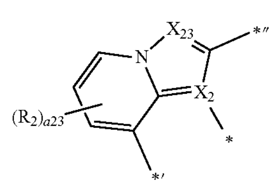

-continued
A2-3(14)
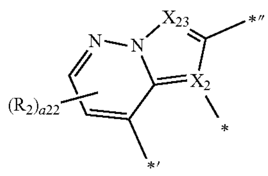
A2-3(15)
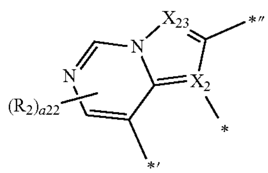
A2-3(16)
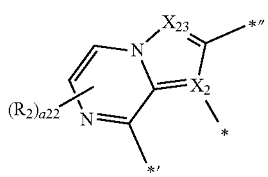
A2-3(17)
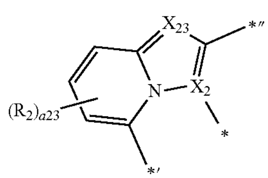
A2-3(18)
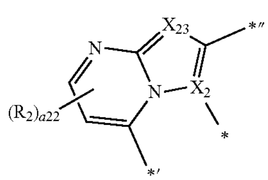
A2-3(19)
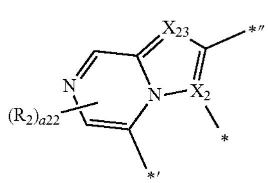
A2-3(20)
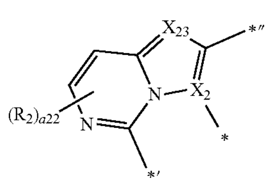
A2-3(21)
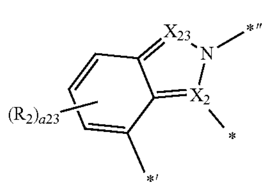
-continued
A2-3(22)
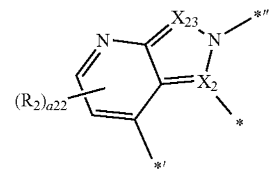
A2-3(23)
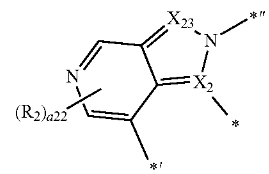
A2-3(24)
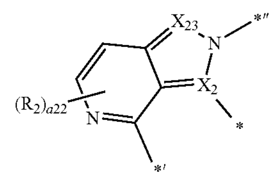
A2-3(25)
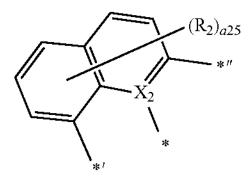
A2-3(26)
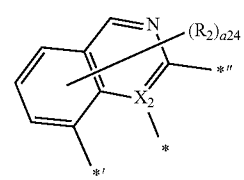
A2-3(27)
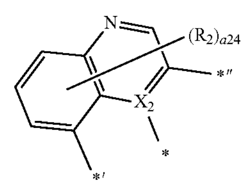
A2-3(28)
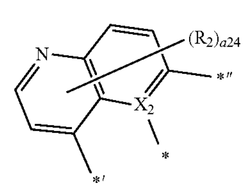
A2-3(29)
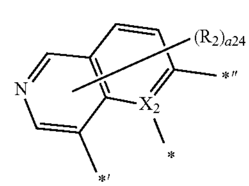

-continued
A2-3(30)
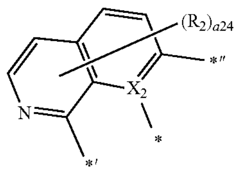
A2-3(31)
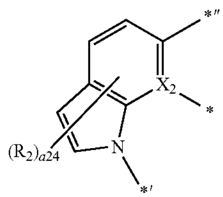
A2-3(32)
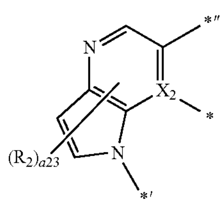
A2-3(33)
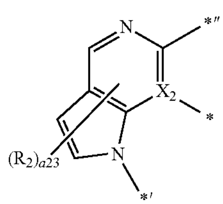
A2-3(34)
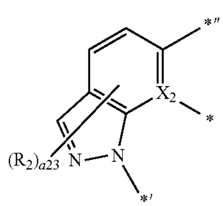
A2-3(35)
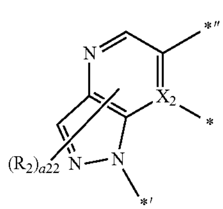
A2-3(36)
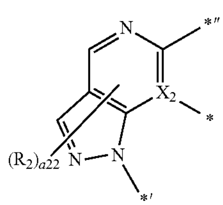
-continued
A2-3(37)
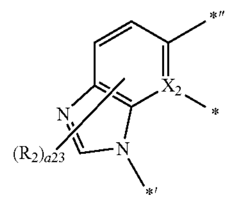
A2-3(38)
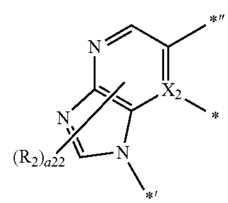
A2-3(39)
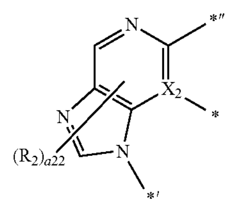
A2-3(40)
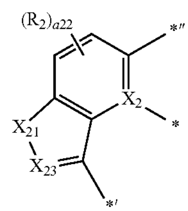
A2-3(41)
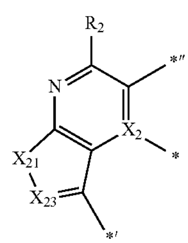
A2-3(42)
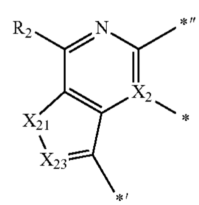
A2-3(43)
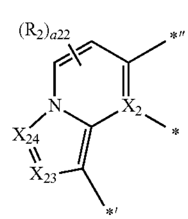

-continued
A2-3(44)
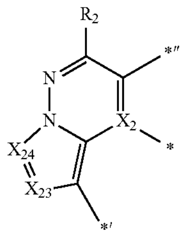
A2-3(45)
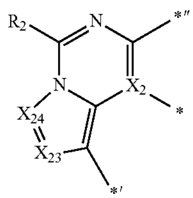
A2-3(46)
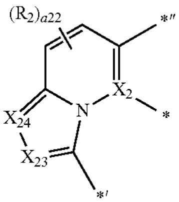
A2-3(47)
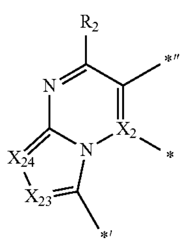
A2-3(48)
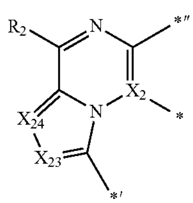
A2-3(49)
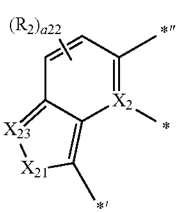
A2-3(50)
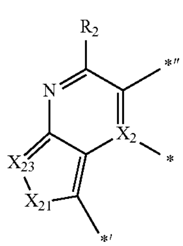
-continued
A2-3(51)
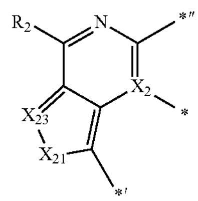
A2-3(52)
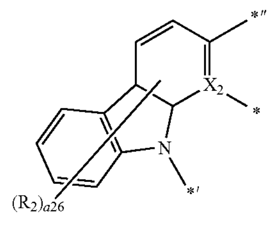
A2-3(53)
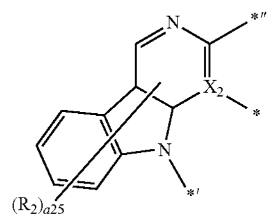
A2-3(54)
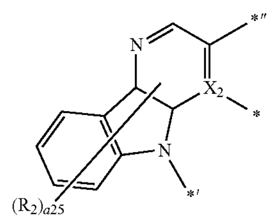
A2-3(55)
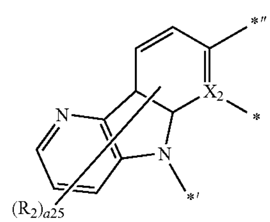
A2-3(56)
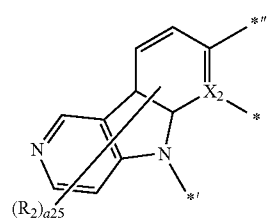
A2-3(57)
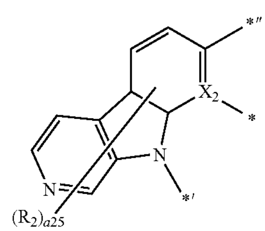

-continued

A2-3(58)

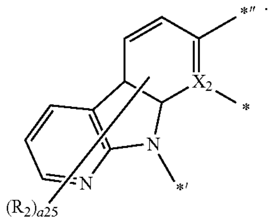

In Formulae A2-1(1) to A2-1(21), A2-2(1) to A2-2(58), and A2-3(1) to A2-3(58), $X_2$ and $R_2$ are the same as described herein, $X_{21}$ may be O, S, $N(R_{21})$, $C(R_{21})(R_{22})$, or $Si(R_{21})(R_{22})$, $X_{23}$ may be N or $C(R_{23})$, $X_{24}$ may be N or $C(R_{24})_7$ $R_{21}$ to $R_{28}$ are the same as described in connection with $R_2$, a26 may be an integer from 0 to 6, a25 may be an integer from 0 to 5, a24 may be an integer from 0 to 4, a23 may be an integer from 0 to 3, a22 may be an integer from 0 to 2,

* indicates a binding site to $X_5$ or M in Formula 1,

*' indicates a binding site to $T_1$ in Formula 1, and

*" indicates a binding site to $T_2$ in Formula 1.

In one or more embodiments, a moiety represented by

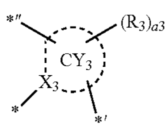

in Formula 1 may be selected from groups represented by Formulae A3-1(1) to A3-1(21), A3-2(1) to A3-2(58), and A3-3(1) to A3-3(58):

A3-1(1)

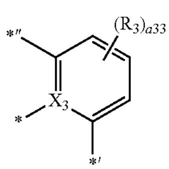

A3-1(2)

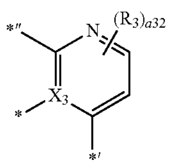

A3-1(3)

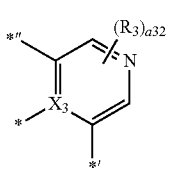

-continued

A3-1(4)

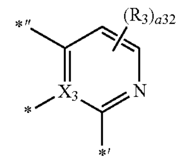

A3-1(5)

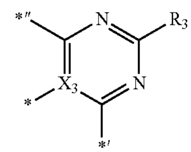

A3-1(6)

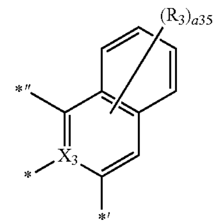

A3-1(7)

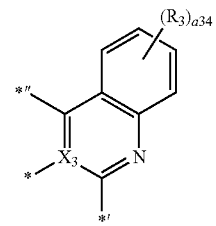

A3-1(8)

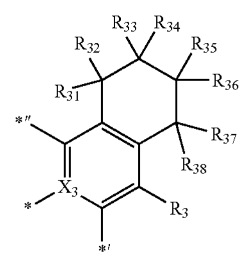

A3-1(9)

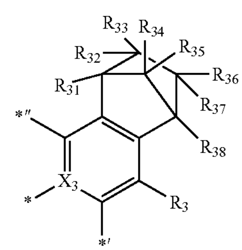

A3-1(10)

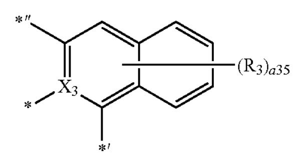

A3-1(11)

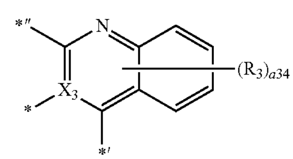

-continued
A3-1(12)
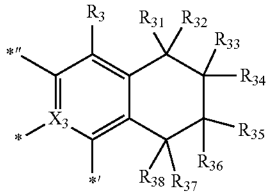
A3-1(13)
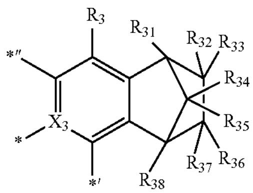
A3-1(14)
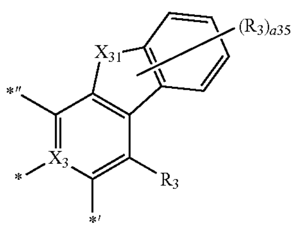
A3-1(15)
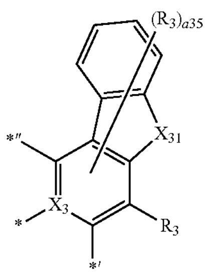
A3-1(16)
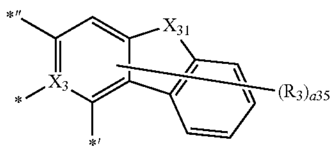
A3-1(17)
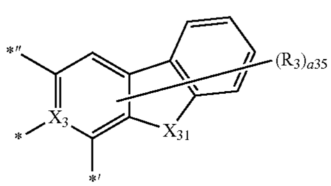
A3-1(18)
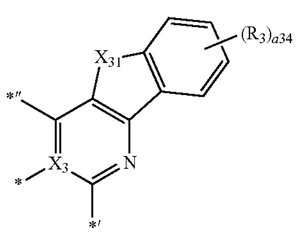
-continued
A3-1(19)
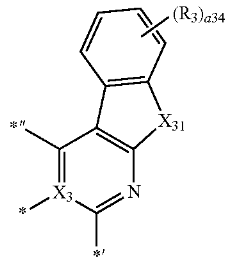
A3-1(20)
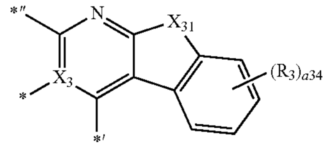
A3-1(21)
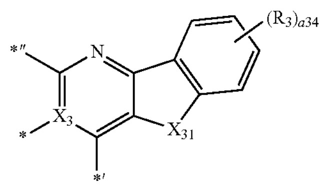
A3-2(1)
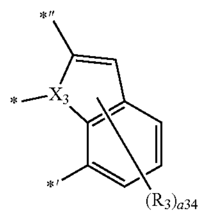
A3-2(2)
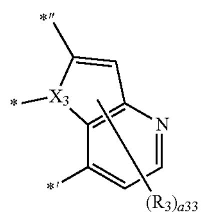
A3-2(3)
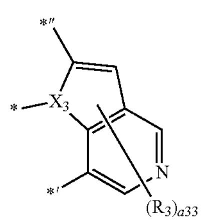
A3-2(4)
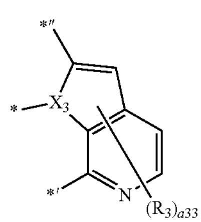

-continued
A3-2(5)
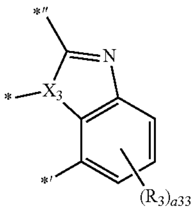
A3-2(6)
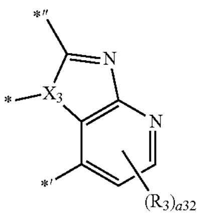
A3-2(7)
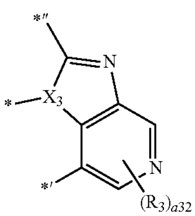
A3-2(8)
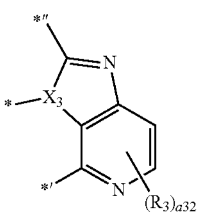
A3-2(9)
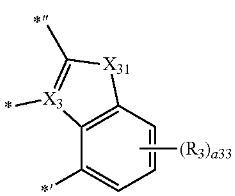
A3-2(10)
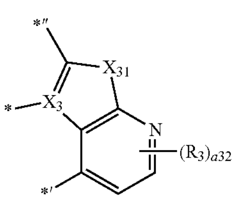
A3-2(11)
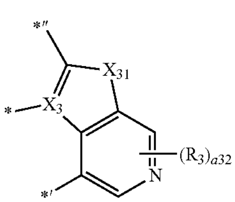
-continued
A3-2(12)
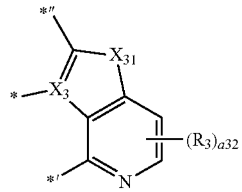
A3-2(13)
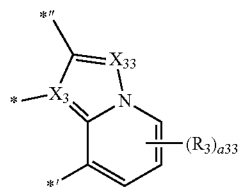
A3-2(14)
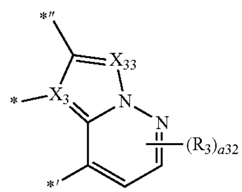
A3-2(15)
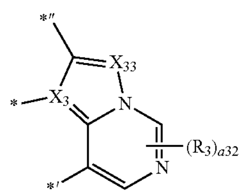
A3-2(16)
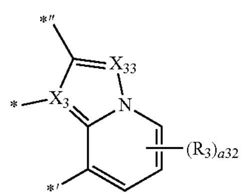
A3-2(17)
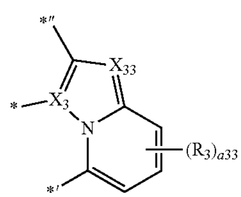
A3-2(18)
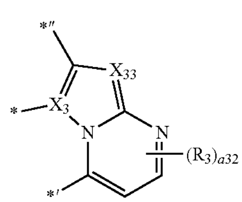
A3-2(19)
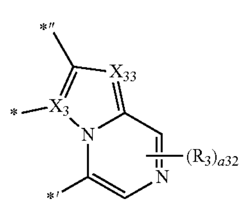

-continued
A3-2(20)
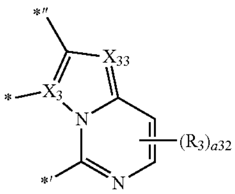
A3-2(21)
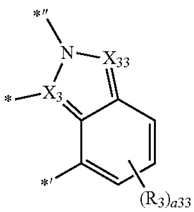
A3-2(22)
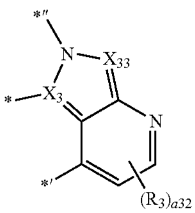
A3-2(24)
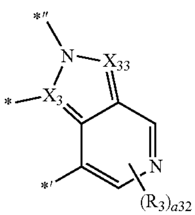
A3-2(25)
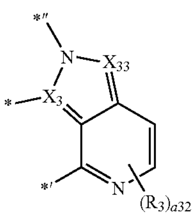
A3-2(26)
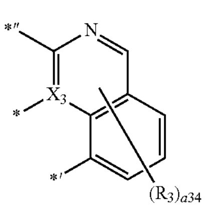
A3-2(27)
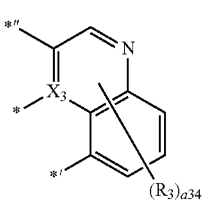
-continued
A3-2(28)
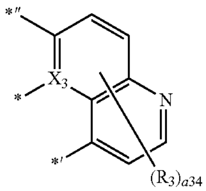
A3-2(29)
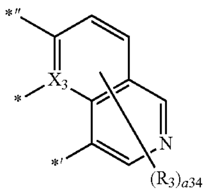
A3-2(30)
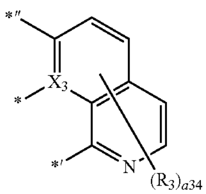
A3-2(31)
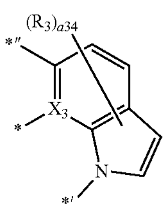
A3-2(32)
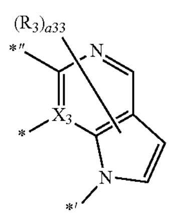
A3-2(33)
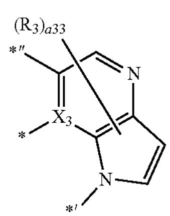
A3-2(34)
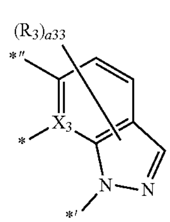

-continued
A3-2(35)
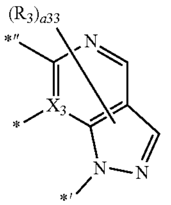
A3-2(36)
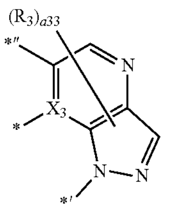
A3-2(37)
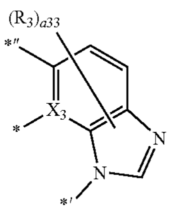
A3-2(38)
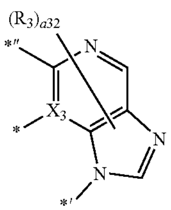
A3-2(39)
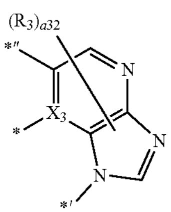
A3-2(40)
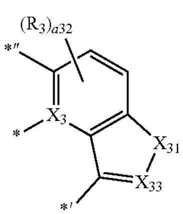
A3-2(41)
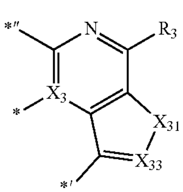
-continued
A3-2(42)
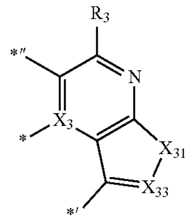
A3-2(43)
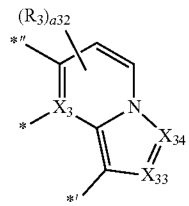
A3-2(44)
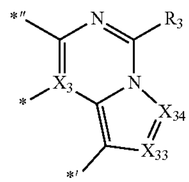
A3-2(45)
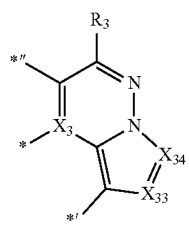
A3-2(46)
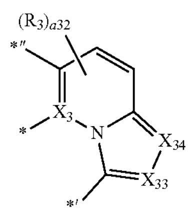
A3-2(47)
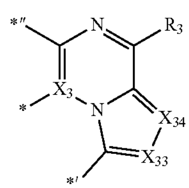
A3-2(48)
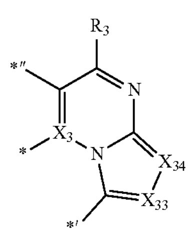

-continued
A3-2(49)
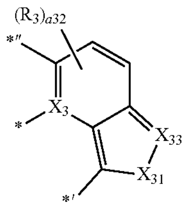
A3-2(50)
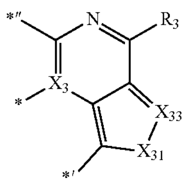
A3-2(51)
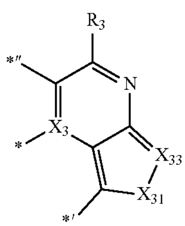
A3-2(52)
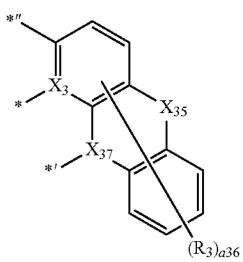
A3-2(53)
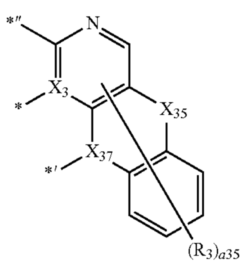
A3-2(54)
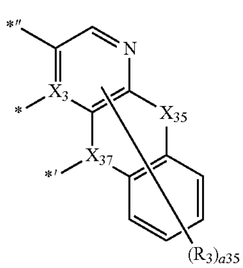
-continued
A3-2(55)
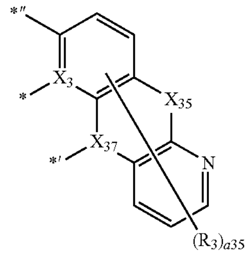
A3-2(56)
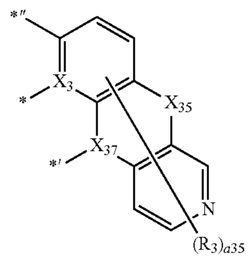
A3-2(57)
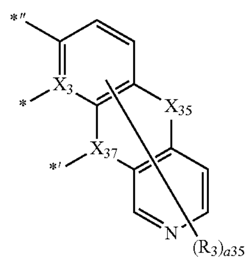
A3-2(58)
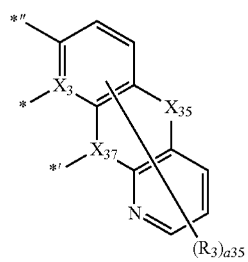
A3-3(1)
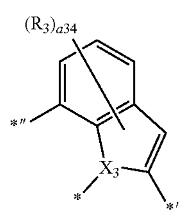
A3-3(2)
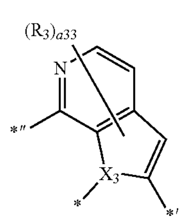

-continued
A3-3(3)
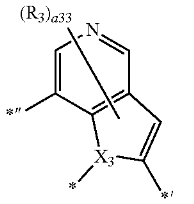
A3-3(4)
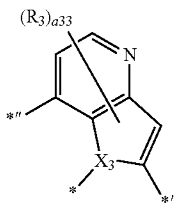
A3-3(5)
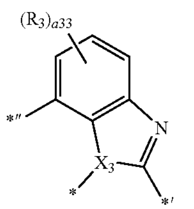
A3-3(6)
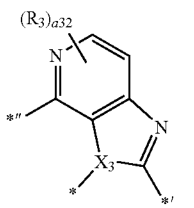
A3-3(7)
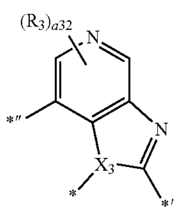
A3-3(8)
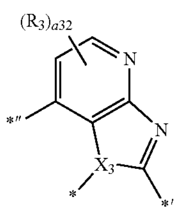
A3-3(9)
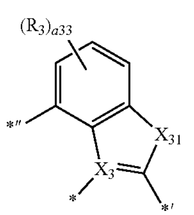
-continued
A3-3(10)
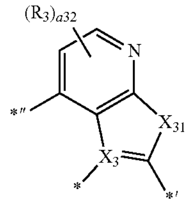
A3-3(11)
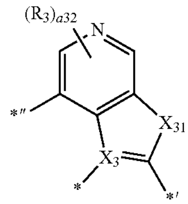
A3-3(12)
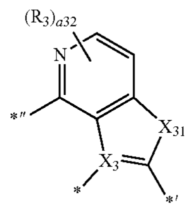
A3-3(13)
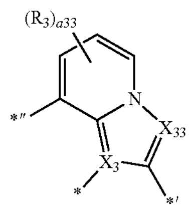
A3-3(14)
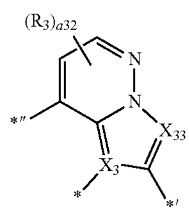
A3-3(15)
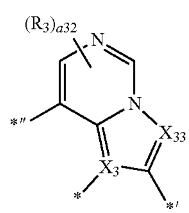
A3-3(16)
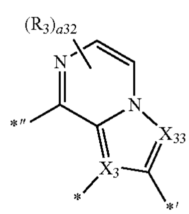

-continued
A3-3(17)
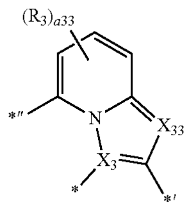
A3-3(18)
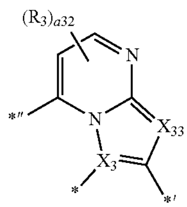
A3-3(19)
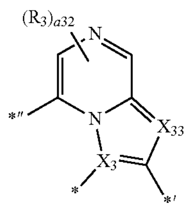
A3-3(20)
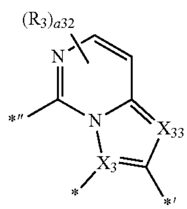
A3-3(21)
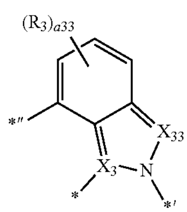
A3-3(22)
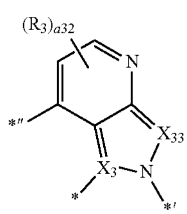
A3-3(23)
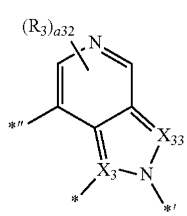
-continued
A3-3(24)
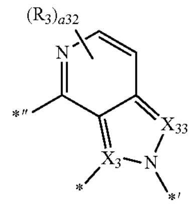
A3-3(25)
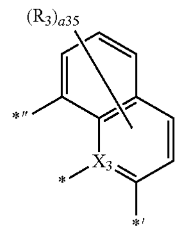
A3-3(26)
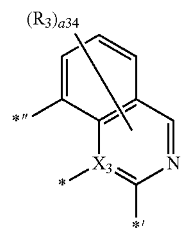
A3-3(27)
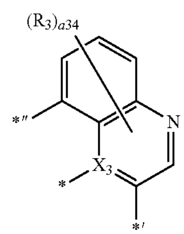
A3-3(28)
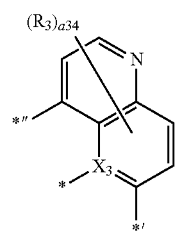
A3-3(29)
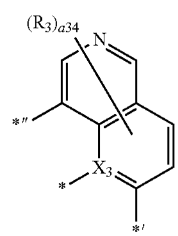
A3-3(30)
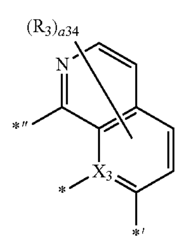

-continued
A3-3(31)
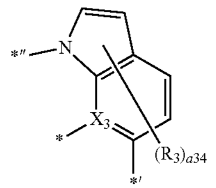
A3-3(32)
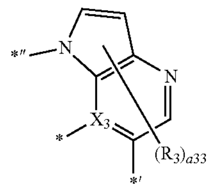
A3-3(33)
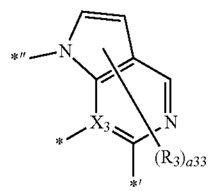
A3-3(34)
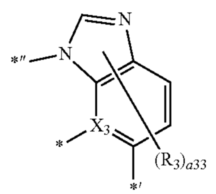
A3-3(35)
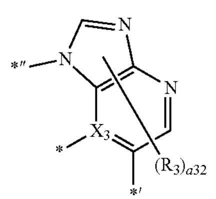
A3-3(36)
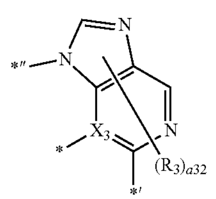
A3-3(37)
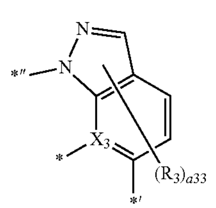
A3-3(38)
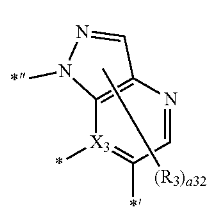
-continued
A3-3(39)
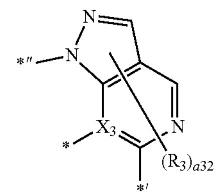
A3-3(40)
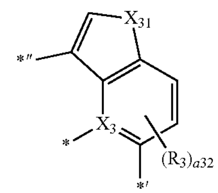
A3-3(41)
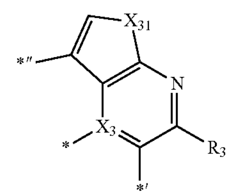
A3-3(42)
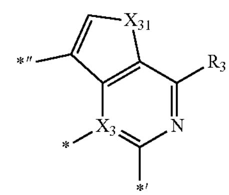
A3-3(43)
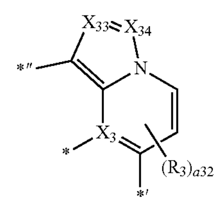
A3-3(44)
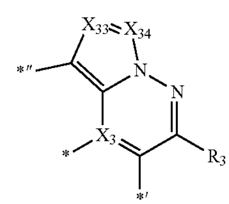
A3-3(45)
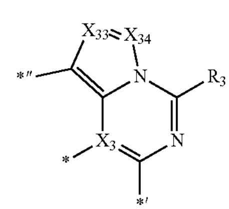
A3-3(46)
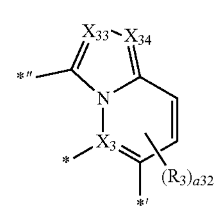

-continued
A3-3(47)
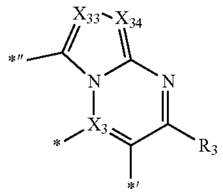
A3-3(48)
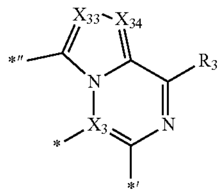
A3-3(49)
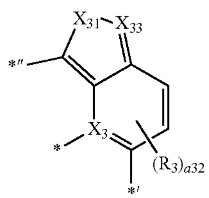
A3-3(50)
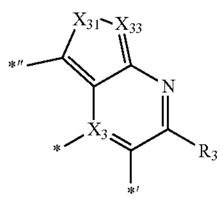
A3-3(51)
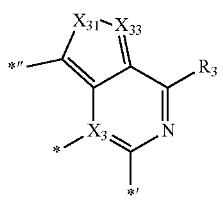
A3-3(52)
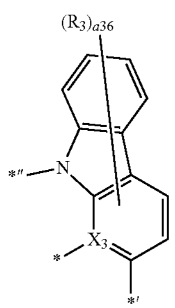
A3-3(53)
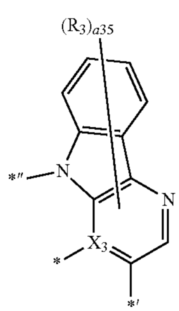
-continued
A3-3(54)
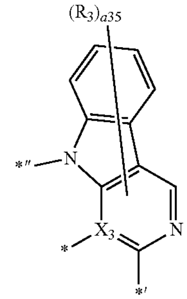
A3-3(55)
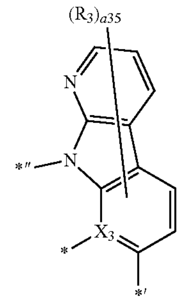
A3-3(56)
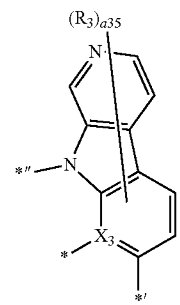
A3-3(57)
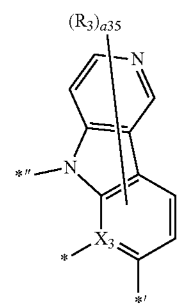
A3-3(58)
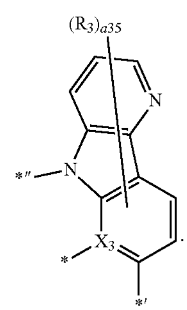
In Formulae A3-1(1) to A3-1(21), A3-2(1) to A3-2(58), and A3-3(1) to A3-3(58),
$X_3$ and $R_3$ are the same as described herein,
$X_{31}$ may be O, S, $N(R_{31})$, $C(R_{31})(R_{32})$, or $Si(R_{31})(R_{32})$, $X_{33}$ may be N or $C(R_{33})$,
$X_{34}$ may be N or $C(R_{34})$,
$X_{35}$ is O, S, $N(R_{35})$, $C(R_{35})(R_{36})$, or $Si(R_{35})(R_{36})$,
$X_{37}$ is N or $C(R_{37})$,
$R_{31}$ to $R_{38}$ are the same as described in connection with $R_3$,
a36 may be an integer from 0 to 6,
a35 may be an integer from 0 to 5,
a34 may be an integer from 0 to 4,
a33 may be an integer from 0 to 3,
a32 may be an integer from 0 to 2,
*" indicates a binding site to $T_2$ in Formula 1,
* indicates a binding site to $X_6$ or M in Formula 1, and
*' indicates a binding site to $T_3$ in Formula 1.

In one or more embodiments, a moiety represented by

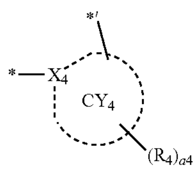

in Formula 1 may be represented by one of Formulae A4-1(1) to A4-1(51) and A4-2(1) to A4-2(71):

A4-1(1)

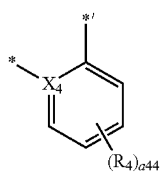

A4-1(2)

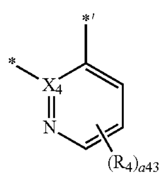

A4-1(3)

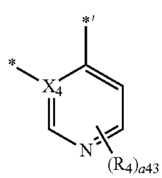

A4-1(4)

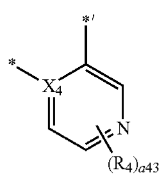

A4-1(5)

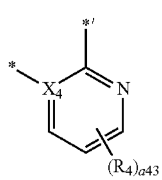

-continued

A4-1(6)

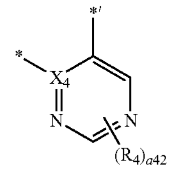

A4-1(7)

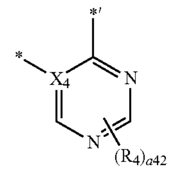

A4-1(8)

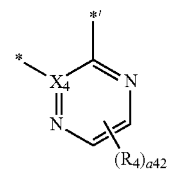

A4-1(9)

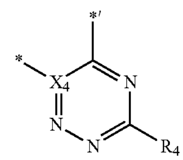

A4-1(10)

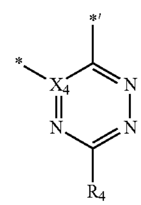

A4-1(11)

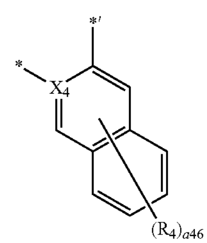

A4-1(12)

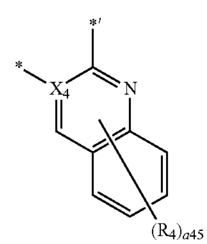

-continued
A4-1(13)
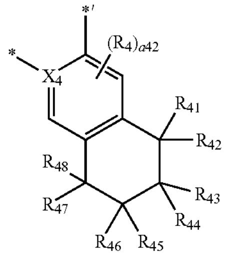
A4-1(14)
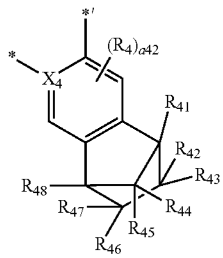
A4-1(15)
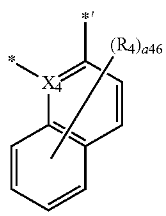
A4-1(16)
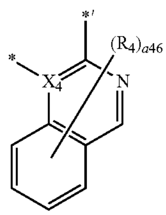
A4-1(17)
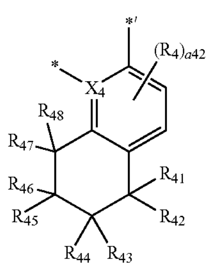
A4-1(18)
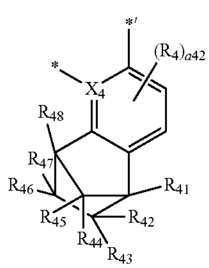
A4-1(19)
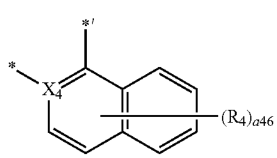
-continued
A4-1(20)
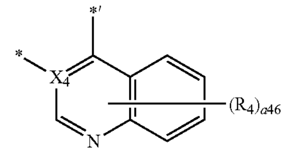
A4-1(21)
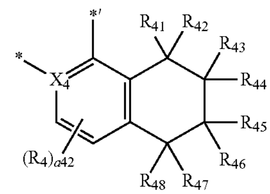
A4-1(22)
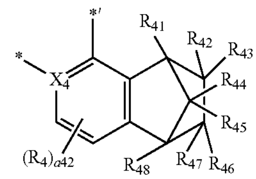
A4-1(23)
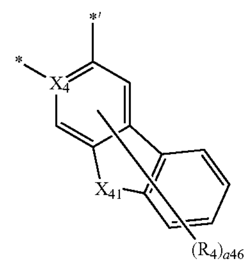
A4-1(24)
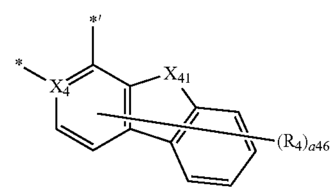
A4-1(25)
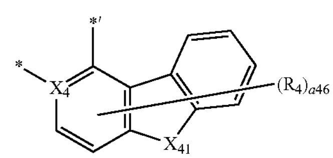
A4-1(26)
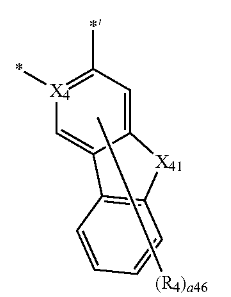

-continued
A4-1(27)
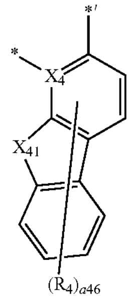
A4-1(28)
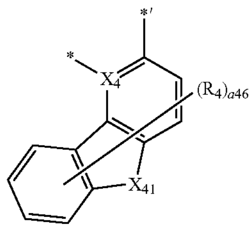
A4-1(29)
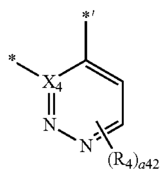
A4-1(30)
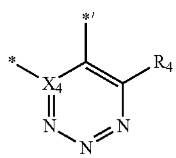
A4-1(31)
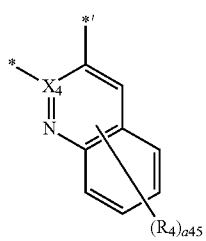
A4-1(32)
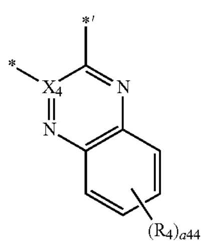
A4-1(33)
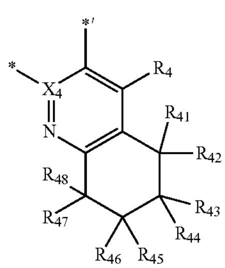
-continued
A4-1(34)
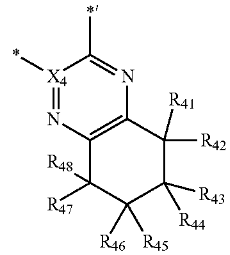
A4-1(35)
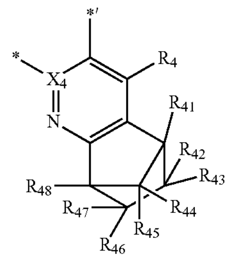
A4-1(36)
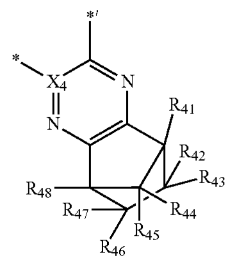
A4-1(37)
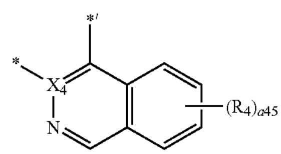
A4-1(38)
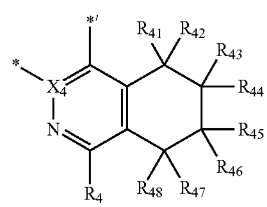
A4-1(39)
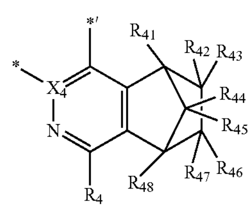
A4-1(40)
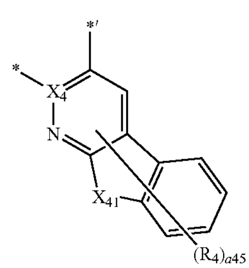

-continued
A4-1(41)
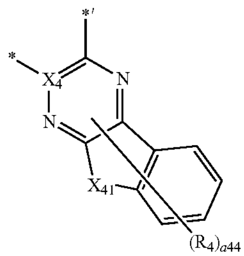
A4-1(42)
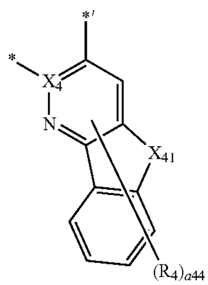
A4-1(43)
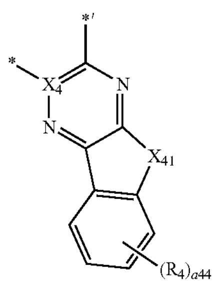
A4-1(44)
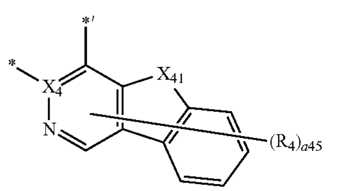
A4-1(45)
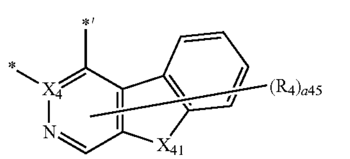
A4-1(46)
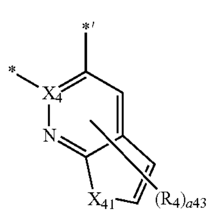
A4-1(47)
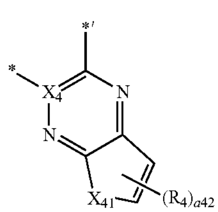
-continued
A4-1(48)
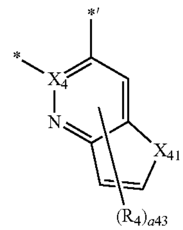
A4-1(49)
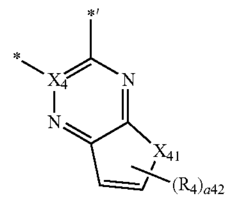
A4-1(50)
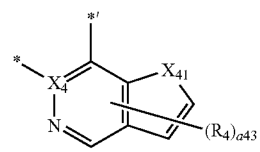
A4-1(51)
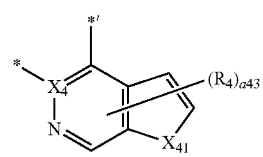
A4-2(1)
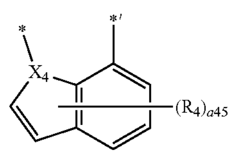
A4-2(2)
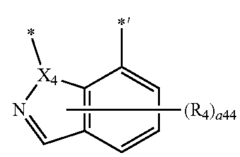
A4-2(3)
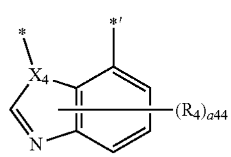
A4-2(4)
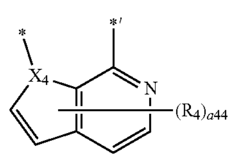
A4-2(5)
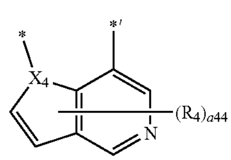

-continued
A4-2(6)
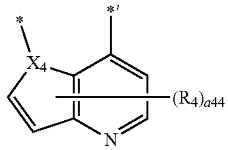
A4-2(7)
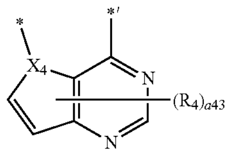
A4-2(8)
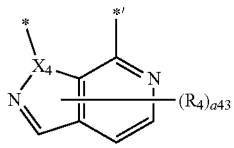
A4-2(9)
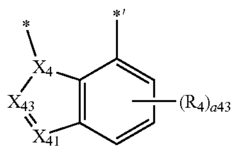
A4-2(10)
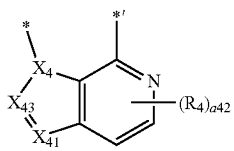
A4-2(11)
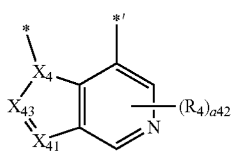
A4-2(12)
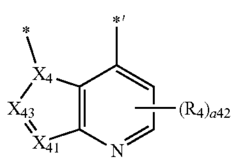
A4-2(13)
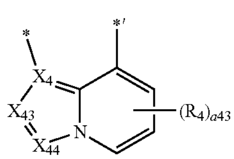
A4-2(14)
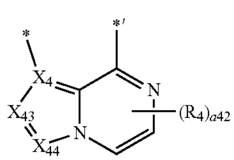
A4-2(15)
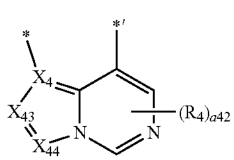
-continued
A4-2(16)
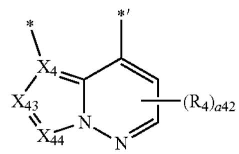
A4-2(17)
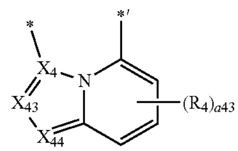
A4-2(18)
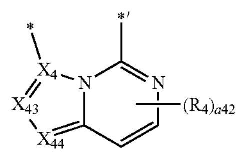
A4-2(19)
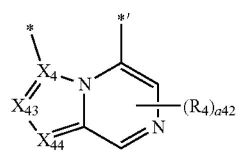
A4-2(20)
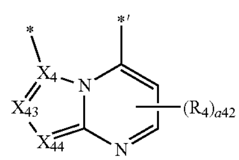
A4-2(21)
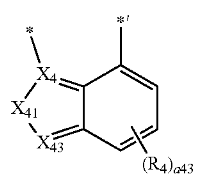
A4-2(22)
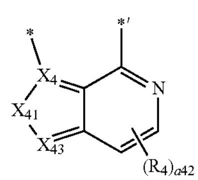
A4-2(23)
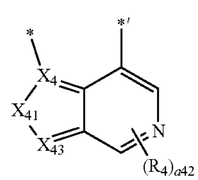
A4-2(24)
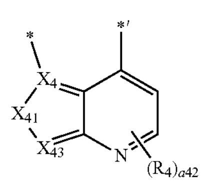

-continued
A4-2(25)
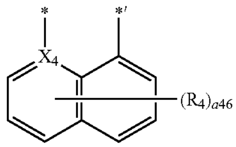
A4-2(26)
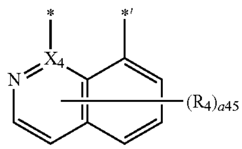
A4-2(27)
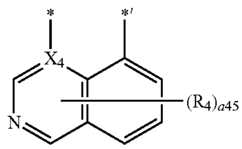
A4-2(28)
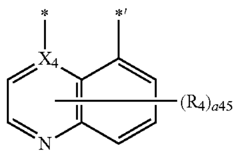
A4-2(29)
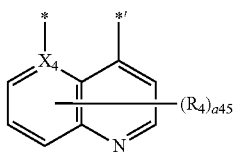
A4-2(30)
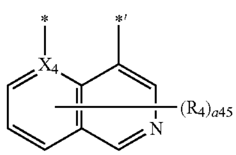
A4-2(31)
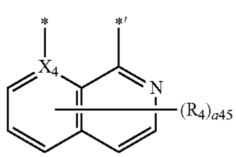
A4-2(32)
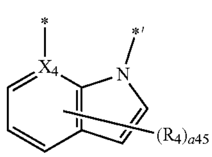
A4-2(33)
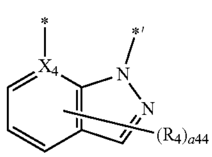
A4-2(34)
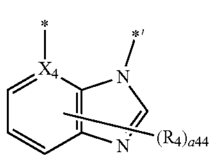
-continued
A4-2(35)
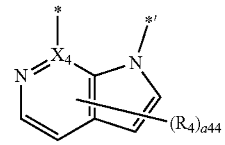
A4-2(36)
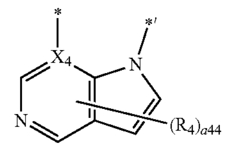
A4-2(37)
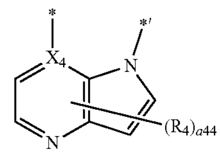
A4-2(38)
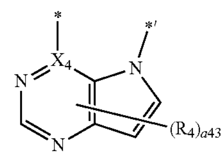
A4-2(39)
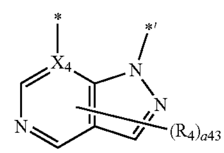
A4-2(40)
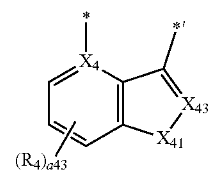
A4-2(41)
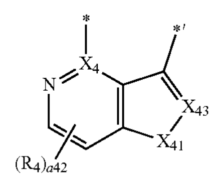
A4-2(42)
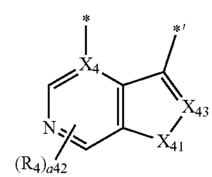
A4-2(43)
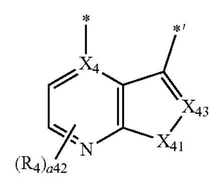

-continued
A4-2(44)
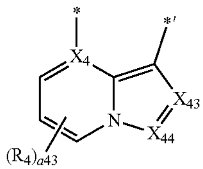
A4-2(45)
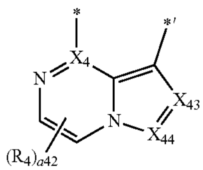
A4-2(46)
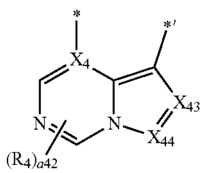
A4-2(47)
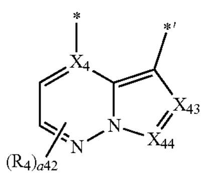
A4-2(48)
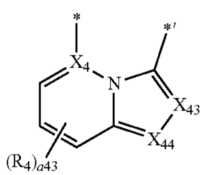
A4-2(49)
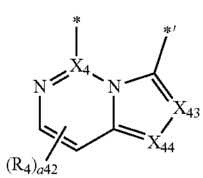
A4-2(50)
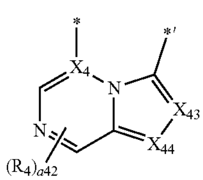
A4-2(51)
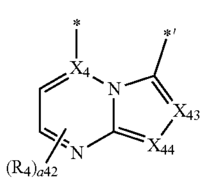
A4-2(52)
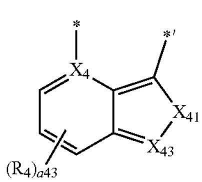
-continued
A4-2(53)
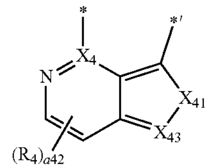
A4-2(54)
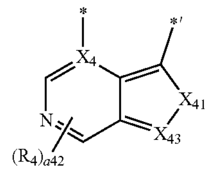
A4-2(55)
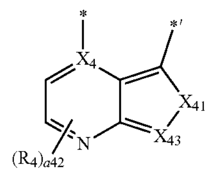
A4-2(56)
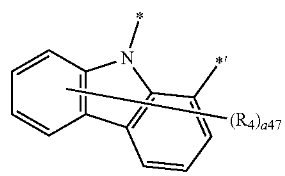
A4-2(57)
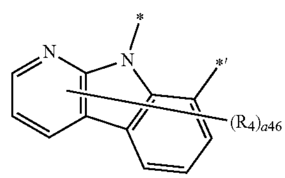
A4-2(58)
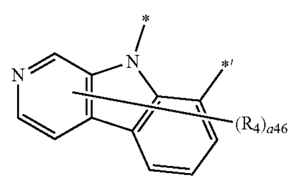
A4-2(59)
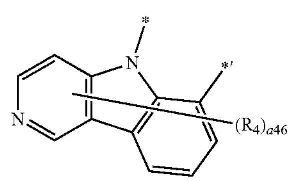
A4-2(60)
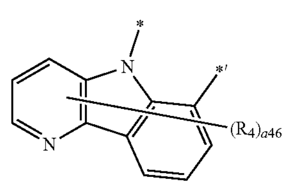
A4-2(61)
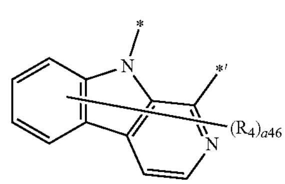

-continued

A4-2(62)

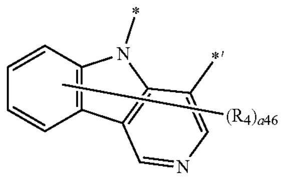

A4-2(63)

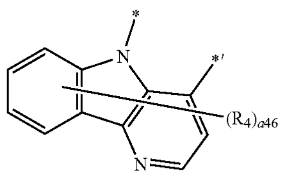

A4-2(64)

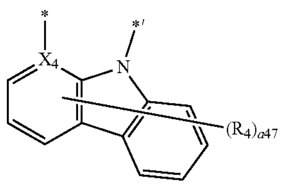

A4-2(65)

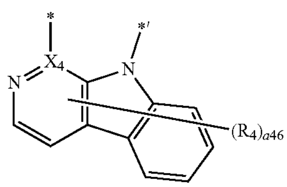

A4-2(66)

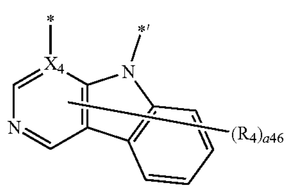

A4-2(67)

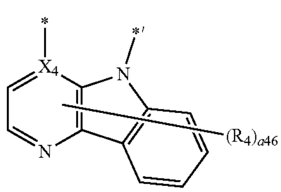

A4-2(68)

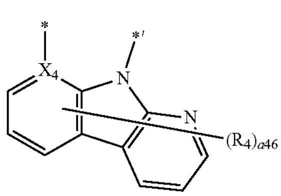

A4-2(69)

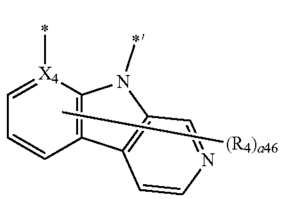

-continued

A4-2(70)

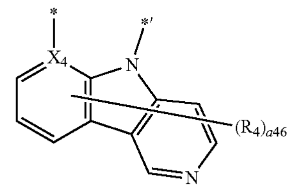

A4-2(71)

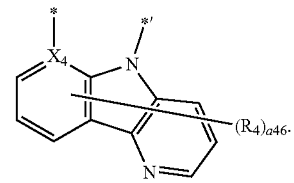

In Formulae A4-1(1) to A4-1(51) and A4-2(1) to A4-2(71), $X_4$ and $R_4$ are the same as described herein, $X_{41}$ may be O, S, $N(R_{41})$, $C(R_{41})(R_{42})$, or $Si(R_{41})(R_{42})$, $X_{43}$ may be N or $C(R_{43})$, $X_{44}$ may be N or $C(R_{44})$, $R_{41}$ to $R_{48}$ are the same as described in connection with $R_4$, a47 may be an integer from 0 to 7, a46 may be an integer from 0 to 6, a45 may be an integer from 0 to 5, a44 may be an integer from 0 to 4, a43 may be an integer from 0 to 3, a42 may be an integer from 0 to 2,

* indicates a binding site to $X_7$ or M in Formula 1, and

*' indicates a binding site to $T_3$ in Formula 1.

In one or more embodiments, in Formula 1, a moiety represented by

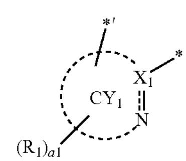

may be represented by one of Formulae CY1-1 to CY1-18, and/or a moiety represented by

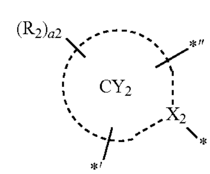

may be represented by one of Formulae CY2-1 to CY2-15, and/or a moiety represented by
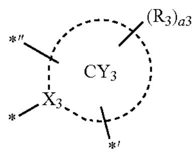
may be represented by one of Formulae CY3-1 to CY3-15, and/or
a moiety represented by
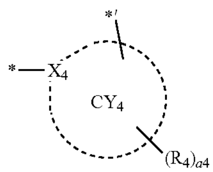
may be represented by one of Formulae CY4-1 to CY4-47, but embodiments of the present disclosure are not limited thereto:
CY1-1
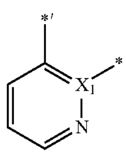
CY1-2
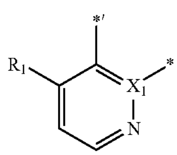
CY1-3
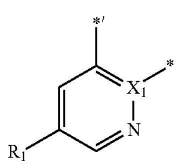
CY1-4
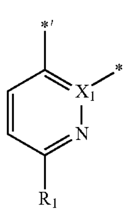
CY1-5
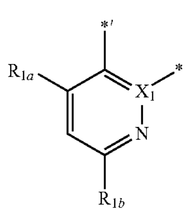
-continued
CY1-6
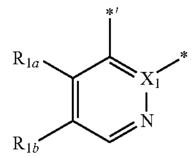
CY1-7
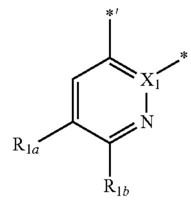
CY1-8
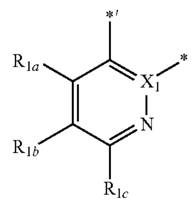
CY1-9
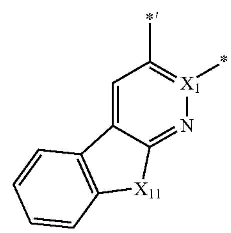
CY1-10
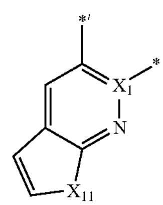
CY1-11
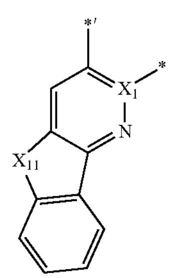
CY1-12
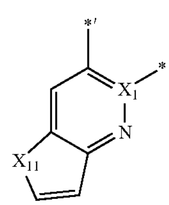

CY1-13
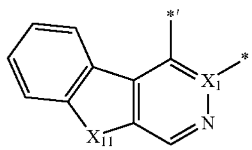
CY1-14
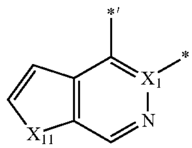
CY1-15
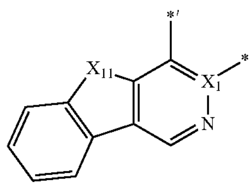
CY1-16
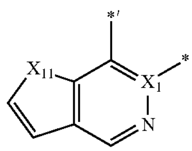
CY1-17
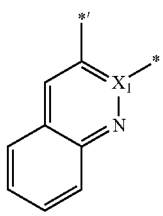
CY1-18
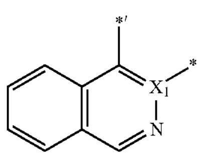
CY2-1
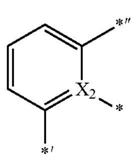
CY2-2
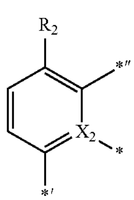
CY2-3
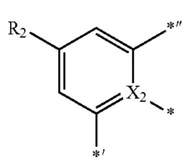
CY2-4
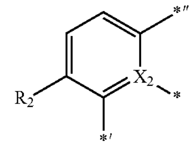
CY2-5
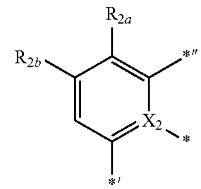
CY2-6
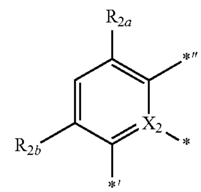
CY2-7
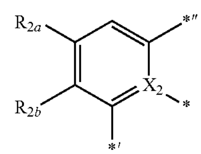
CY2-8
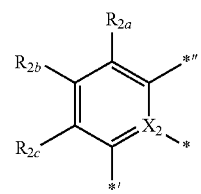
CY2-9
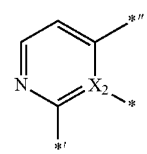
CY2-10
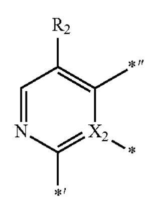
CY2-11
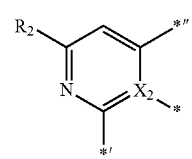
CY2-12
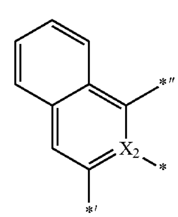

-continued
CY2-13
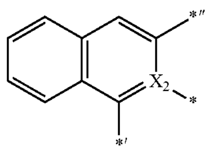
CY2-14
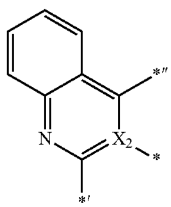
CY2-15
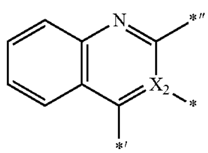
CY3-1
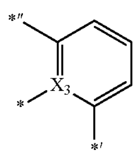
CY3-2
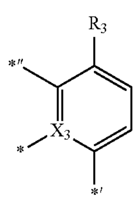
CY3-3
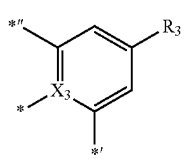
CY3-4
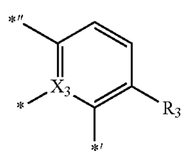
CY3-5
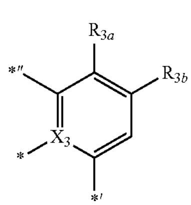
CY3-6
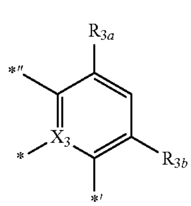
-continued
CY3-7
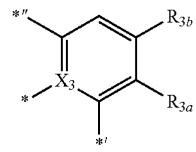
CY3-8
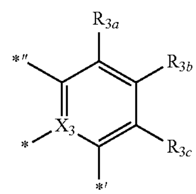
CY3-9
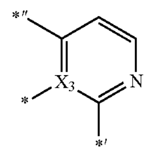
CY3-10
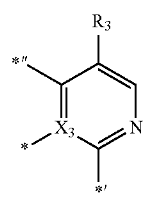
CY3-11
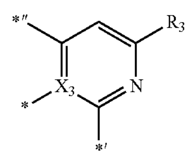
CY3-12
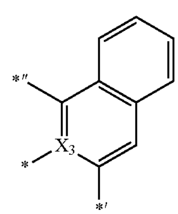
CY3-13
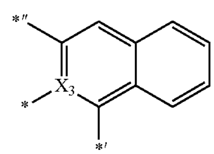
CY3-14
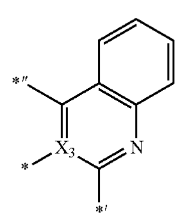
CY3-15
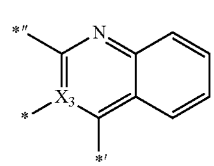

-continued
CY4-1
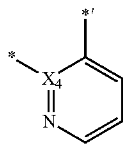
CY4-2
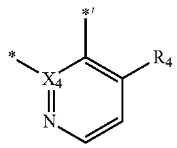
CY4-3
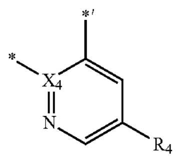
CY4-4
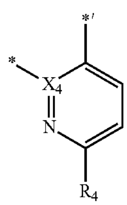
CY4-5
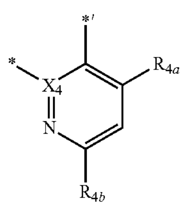
CY4-6
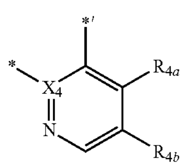
CY4-7
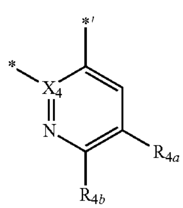
CY4-8
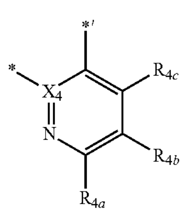
-continued
CY4-9
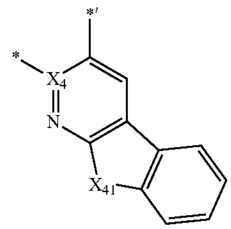
CY4-10
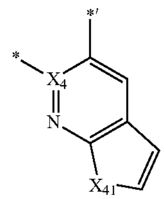
CY4-11
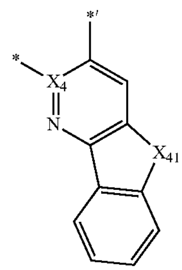
CY4-12
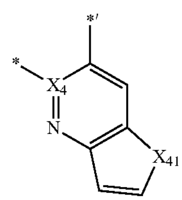
CY4-13
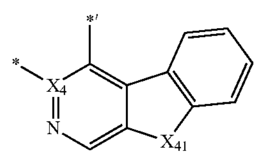
CY4-14
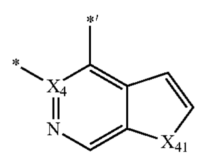
CY4-15
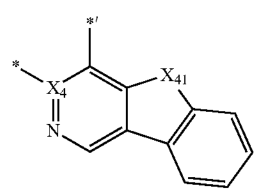
CY4-16
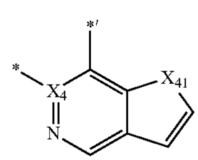

-continued
CY4-17
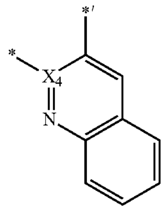
CY4-18
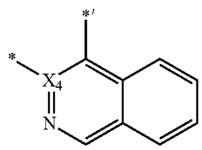
CY4-19
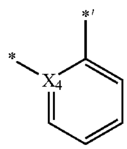
CY4-20
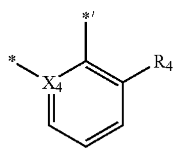
CY4-21
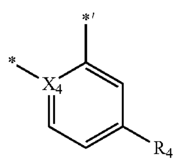
CY4-22
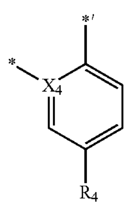
CY4-23
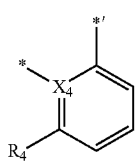
CY4-24
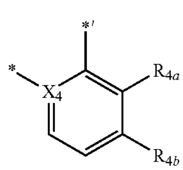
CY4-25
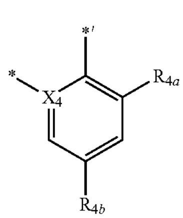
-continued
CY4-26
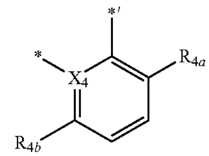
CY4-27
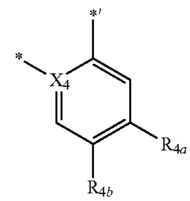
CY4-28
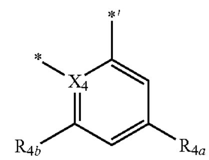
CY4-29
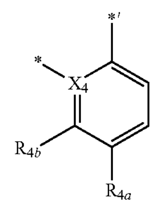
CY4-30
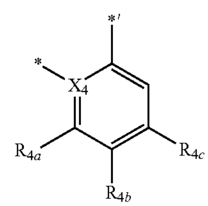
CY4-31
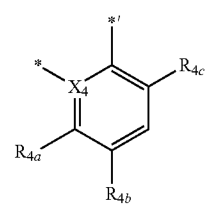
CY4-32
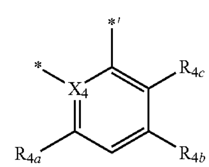
CY4-33
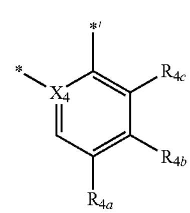

-continued

CY4-34

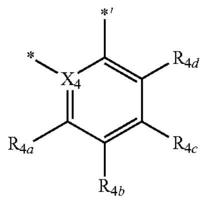

CY4-35

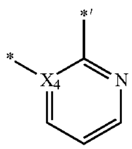

CY4-36

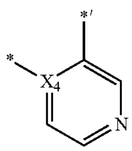

CY4-37

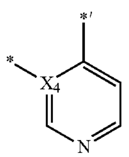

CY4-38

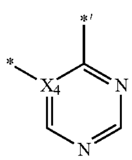

CY4-39

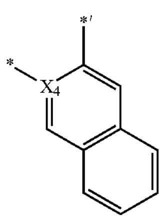

CY4-40

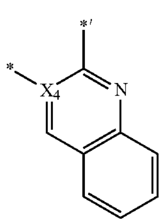

CY4-41

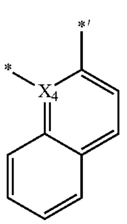

-continued

CY4-42

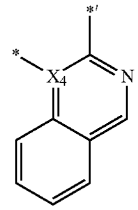

CY4-43

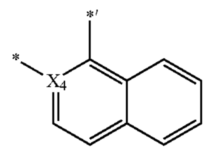

CY4-44

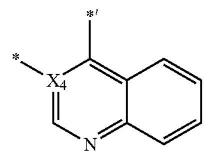

CY4-45

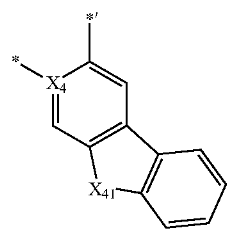

CY4-46

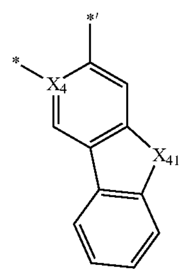

CY4-47

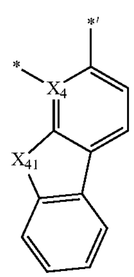

In Formulae CY1-1 to CY1-18, CY2-1 to CY2-15, CY3-1 to CY3-15, and CY4-1 to CY4-47, $X_1$ to $X_4$ and $R_1$ to $R_4$ are the same as described herein, $X_{11}$ may be O, S, $N(R_{11})$, $C(R_{11})(R_{12})$, or $Si(R_{11})(R_{12})$, $X_{41}$ may be O, S, $N(R_{41})$, $C(R_{41})(R_{42})$, or $Si(R_{41})(R_{42})$, $R_{1a}$ to $R_{1c}$, $R_{11}$, and $R_{12}$ are the same as described in connection with $R_1$, $R_{2a}$ to $R_{2c}$ are the same as described in connection with $R_2$, $R_{3a}$ to $R_{3c}$ are the same as described in connection with $R_3$, $R_{4a}$ to $R_{4d}$, $R_{41}$, and $R_{42}$ are the same as described in connection with $R_4$, $R_1$ to $R_4$, $R_{1a}$ to $R_{1c}$, $R_{2a}$ to $R_{2c}$, $R_{3a}$ to $R_{3c}$, and $R_{4a}$ to $R_{4d}$ are not hydrogen, in Formulae CY1-1 to CY1-18, * indicates a binding site to M in Formula 1, and *' indicates a binding site to $T_1$ in Formula 1, in Formulae CY2-1 to CY2-15, * indicates a binding site to $X_5$ or M in Formula 1, *' indicates a binding site to $T_1$ in Formula 1, and *" indicates a binding site to $T_2$ in Formula 1, in Formulae CY3-1 to CY3-15, * indicates a binding site to $X_6$ or M in Formula 1, *" indicates a binding site to $T_2$ in Formula 1, and *' indicates a binding site to $T_3$ in Formula 1, and in Formulae CY4-1 to CY4-47, * indicates a binding site to $X_7$ or M in Formula 1, and *' indicates a binding site to $T_3$ in Formula 1.

In one or more embodiments, in Formula 1, a group represented by

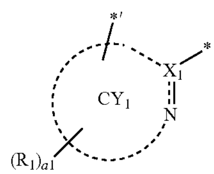

may be selected from groups represented by Formulae A1-1(1) to A1-1(28) (for example, Formulae CY1-1 to CY1-18), and a group represented by

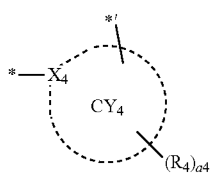

may be selected from groups represented by Formulae A4-1(2), A4-1(29), A4-1(6), A4-1(8), A4-1(30), A4-1(9), A4-1(10), and A4-1(31) to A4-1(51) (for example, Formulae CY4-1 to CY4-18), but embodiments of the present disclosure are not limited thereto.

In one or more embodiments, the organometallic compound may be represented by Formula 1A:

Formula 1A

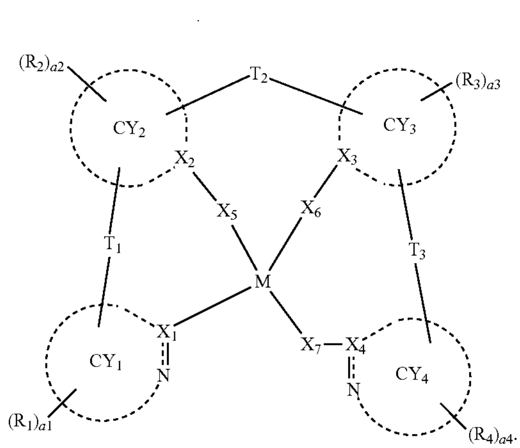

In Formula 1A, M, $X_1$ to $X_7$, rings $CY_1$ to $CY_3$, $T_1$ to $T_3$, $R_1$ to $R_4$, and a1 to a4 are the same as described herein, and ring $CY_4$ may be a $C_1$-$C_{30}$ heterocyclic group having at least one N atom as a ring-forming atom.

For example, $X_4$ in Formula 1A may be N, and ring $CY_4$ is the same as described in connection with ring $CY_1$, but embodiments of the present disclosure are not limited thereto.

In an embodiment, ring $CY_1$ and ring $CY_4$ in Formulae 1 and 1A may be identical to each other.

In one or more embodiments, ring $CY_1$ and ring $CY_4$ in Formulae 1 and 1A may be identical to each other, and ring $CY_2$ and ring $CY_3$ may be identical to each other.

In one or more embodiments, in Formulae 1 and 1A, a group represented by

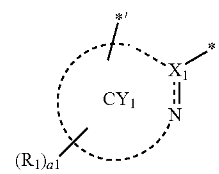

and a group represented by

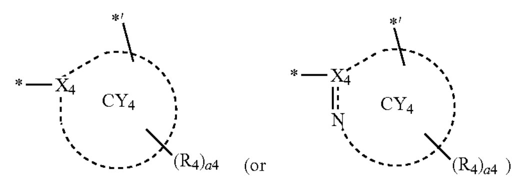

may be identical to each other and/or a group represented by

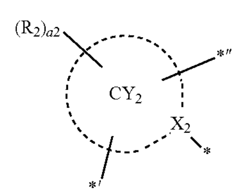

and a group represented by

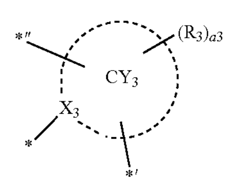

may be identical to each other.

In one or more embodiments, the organometallic compound may have a linearly symmetrical structure with respect to a symmetrical axis connecting M and $T_2$ in Formulae 1 and 1A.

In one or more embodiments, the organometallic compound may be represented by Formula 1(1):

Formula 1(1)

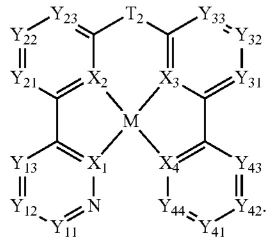

In Formula 1(1),

M, $X_1$ to $X_4$, and $T_2$ are the same as described herein, $Y_{11}$ may be $C(Z_{11})$ or N, $Y_{12}$ may be $C(Z_{12})$ or N, $Y_{13}$ may be $C(Z_{13})$ or N, $Y_{21}$ may be $C(Z_{21})$ or N, $Y_{22}$ may be $C(Z_{22})$ or N, $Y_{23}$ may be $C(Z_{23})$ or N, $Y_{31}$ may be $C(Z_{31})$ or N, $Y_{32}$ may be $C(Z_{32})$ or N, $Y_{33}$ may be $C(Z_{33})$ or N, $Y_{41}$ may be $C(Z_{41})$ or N, $Y_{42}$ may be $C(Z_{42})$ or N, $Y_{43}$ may be $C(Z_{43})$ or N, and $Y_{44}$ may be $C(Z_{44})$ or N, $Z_{11}$ to $Z_{13}$ are the same as described in connection with $R_1$, and at least two of to $Z_{13}$ may optionally be linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$ (for example, a benzene group, a cyclopentane group, a cyclopentadiene group, a furan group, a thiophene group, a pyrrole group, a silole group, an indene group, a benzofuran group, a benzothiophene group, an indole group, or a benzosilole group, each unsubstituted or substituted with at least one $R_{10a}$), $Z_{21}$ to $Z_{23}$ are the same as described in connection with $R_2$, and at least two of $Z_{21}$ to $Z_{23}$ may optionally be linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$ (for example, a benzene group, a cyclopentane group, a cyclopentadiene group, a furan group, a thiophene group, a pyrrole group, a silole group, an indene group, a benzofuran group, a benzothiophene group, an indole group, or benzosilole group, each unsubstituted or substituted with at least one $R_{10a}$), $Z_{31}$ to $Z_{33}$ are the same as described in connection with $R_3$, and at least two of $Z_{31}$ to $Z_{33}$ may optionally be linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$ (for example, a benzene group, a cyclopentane group, a cyclopentadiene group, a furan group, a thiophene group, a pyrrole group, a silole group, an indene group, a benzofuran group, a benzothiophene group, an indole group, or benzosilole group, each unsubstituted or substituted with at least one $R_{10a}$), $Z_{41}$ to $Z_{44}$ are the same as described in connection with $R_4$, and at least two of $Z_{41}$ to $Z_{44}$ may optionally be linked to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$ (for example, a benzene group, a cyclopentane group, a cyclopentadiene group, a furan group, a thiophene group, a pyrrole group, a silole group, an indene group, a benzofuran group, a benzothiophene group, an indole group, or a benzosilole group, each unsubstituted or substituted with at least one $R_{10a}$), $R_{10a}$ is the same as described in connection with $R_1$.

For example, $Y_{44}$ in Formula 1(1) may be N.

In an embodiment, in Formula 1(1), $Y_{11}$ and $Y_{41}$ may be identical to each other, $Y_{12}$ and $Y_{42}$ may be identical to each other, $Y_{13}$ and $Y_{43}$ may be identical to each other, $Y_{21}$ and $Y_{31}$ may be identical to each other, $Y_{22}$ and $Y_{32}$ may be identical to each other, and $Y_{23}$ and $Y_{33}$ may be identical to each other, but embodiments of the present disclosure are not limited thereto.

In the present disclosure, "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, and an azadibenzothiophene 5,5-dioxide group" as used herein each refer to a heteroring having the same backbone as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, and a dibenzothiophene 5,5-dioxide group", in which at least one carbon constituting rings thereof is substituted with nitrogen.

The organometallic compound represented by Formula 1 may be one selected from Compounds 1 to 16, but embodiments of the present disclosure are not limited thereto:

1

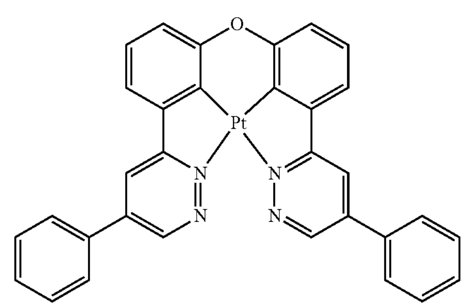

2

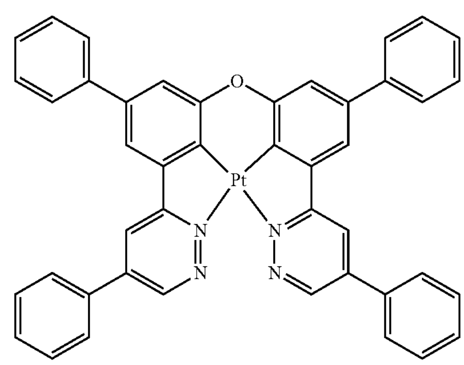

3
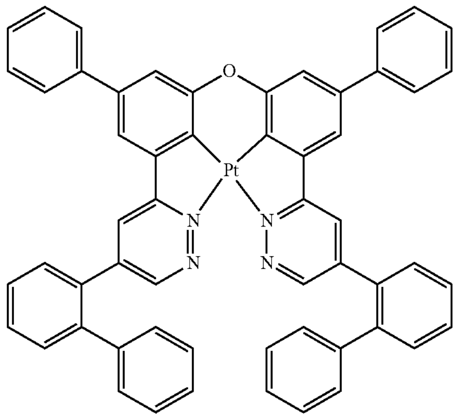
4
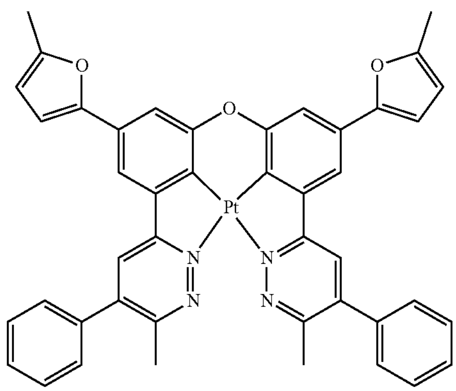
5
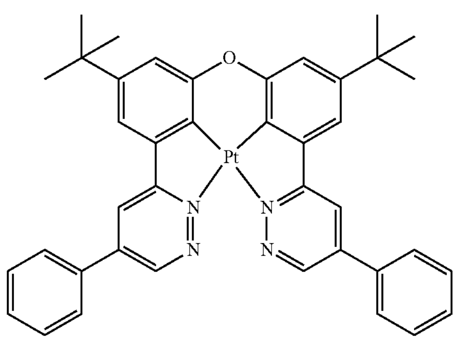
6
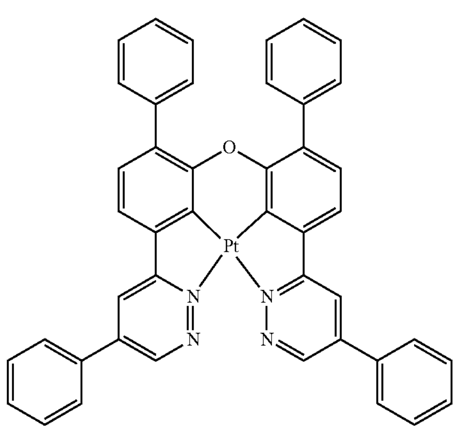
7
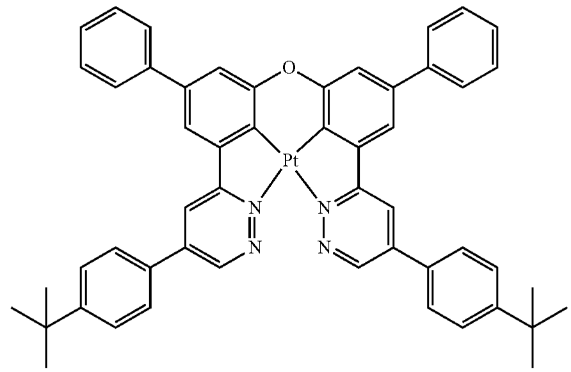
8
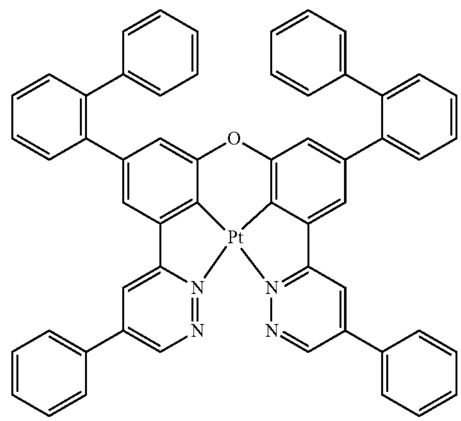
9
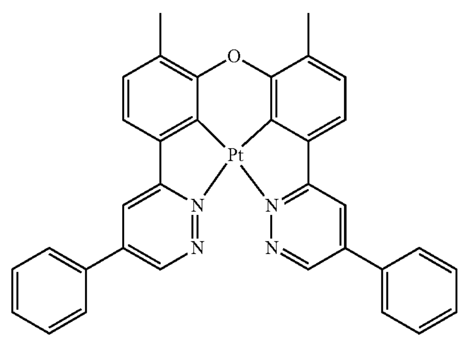
10
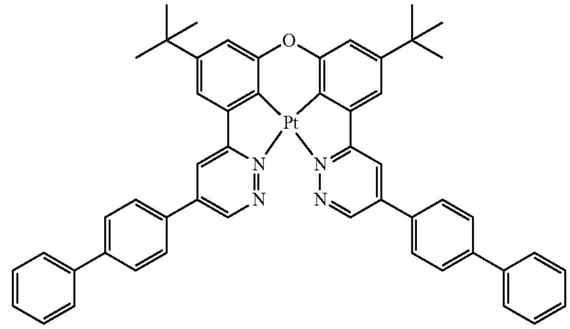

-continued

11

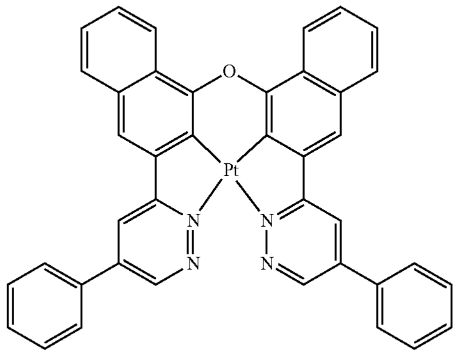

12

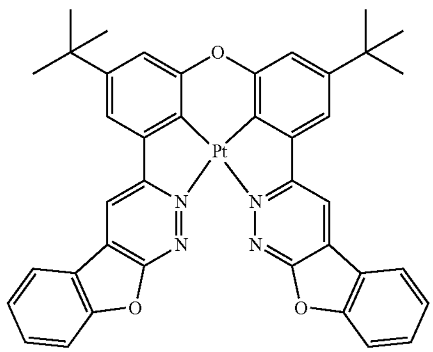

13

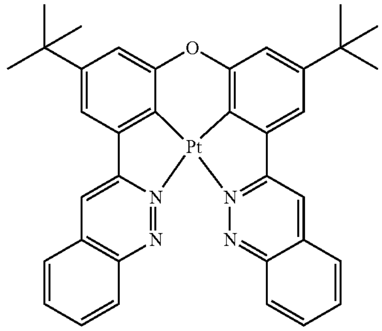

14

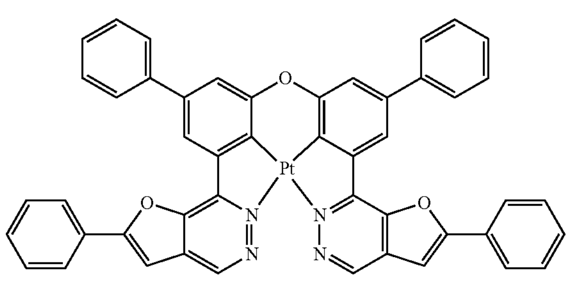

-continued

15

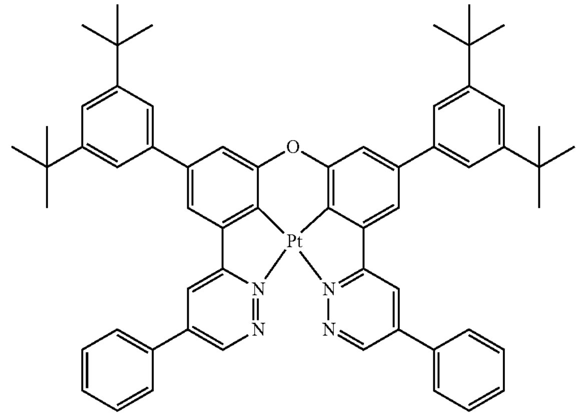

16

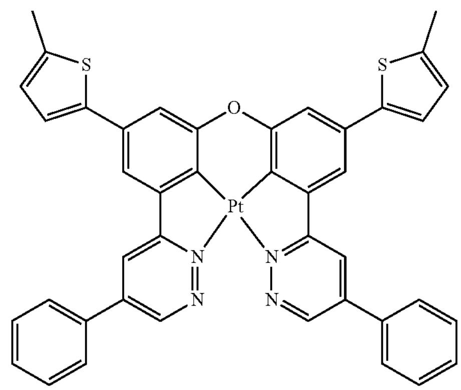

In Formula 1, since $X_1$ is N and a bond between $X_1$ and M is a coordinate bond, ring $CY_1$ in Formula 1 may contribute to a lowest unoccupied molecular orbital (LUMO) energy level of the organometallic compound represented by Formula 1. An atom that is closest to ring $CY_4$ among neighboring atoms of $X_1$ of ring $CY_1$ is essentially "nitrogen" as represented in Formula 1'.

Formula 1'

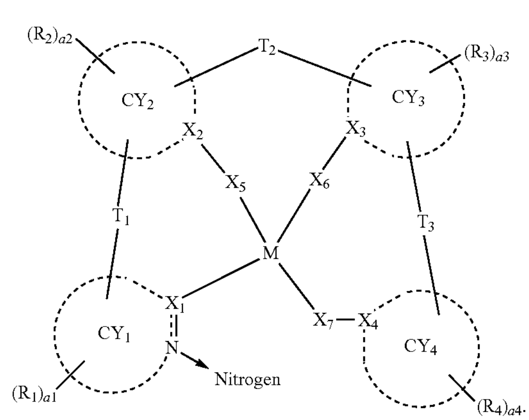

As such, since a bond between $X_1$ and M in Formula 1 is a coordinate bond and an atom that is closest to ring $CY_4$ among neighboring atoms of $X_1$ of ring $CY_1$ is essentially "nitrogen", a bond strength between $X_1$ of ring $CY_1$ and M in Formula 1 may be stronger, as compared with that in a virtual compound in which two atoms neighboring to $X_1$ of ring $CY_1$ are "carbon". Although not limited by a particular theory, for example, when ring $CY_1$ is a pyridazine group, a bond length between N of the pyridazine group and a metal is shorter than a bond length between N of a pyridine group and a metal, and thus, a bond strength between N of the pyridazine group and the metal may be stronger than a bond strength between N of the pyridine group and the metal. Therefore, an emission peak in a photoluminescence spectrum of a solution of the organometallic compound represented by Formula 1 may have a relatively narrow full width at half maximum (FWHM) (for example, an FWHM of about 50 nm to about 70 nm or an FWHM of about 55 nm to about 64 nm), a non-radiative decay rate of the organometallic compound represented by Formula 1 may decrease, and/or a radiative decay rate may increase.

In addition, since the atom that is closest to ring $CY_4$ among the atoms neighboring to $X_1$ of ring $CY_1$ in Formula 1 is essentially "nitrogen", a repulsion between ring $CY_1$ and ring $CY_4$ decreases (see Formula 1" or 1(1)), and a tetradentate ligand in Formula 1 may not be structurally twisted. Although not limited by a particular theory, for example, in the following "virtual Formula" in which a moiety that is closest to ring $CY_4$ among neighboring atoms of $X_1$ of ring $CY_1$ is "CH", there is a high probability that a tetradentate ligand will be twisted by a repulsion between hydrogen of ring $CY_1$ and hydrogen of ring $CY_4$. Therefore, an electronic device, for example, an organic light-emitting device, which includes the organometallic compound represented by Formula 1, may have excellent quantum emission efficiency.

Formula 1″

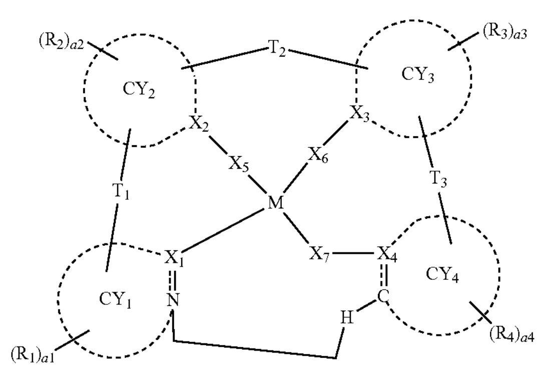

There is no repulsion.

Virtual Formula

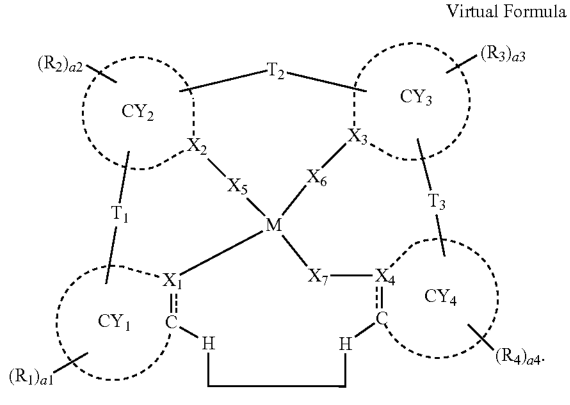

There is a repulsion.

Therefore, the electronic device, for example, the organic light-emitting device, which includes the organometallic compound represented by Formula 1, may have excellent color purity, quantum emission efficiency, and long lifespan characteristics.

For example, highest occupied molecular orbital (HOMO), LUMO, and $T_1$ energy levels of some Compounds were evaluated by a DFT method of Gaussian program (structurally optimized at a level of B3LYP, 6-31G(d,p)), and evaluation results thereof are shown in Table 1.

TABLE 1

| Compound No. | HOMO (eV) | LUMO (eV) | Ti (eV) |
|---|---|---|---|
| 1 | −4.900 | −2.107 | 1.981 |
| 2 | −4.919 | −2.167 | 1.949 |
| 3 | −4.859 | −2.044 | 1.990 |
| 4 | −4.619 | −1.979 | 1.865 |
| 5 | −4.786 | −2.055 | 1.933 |
| 6 | −4.915 | −2.125 | 1.990 |
| 7 | −4.859 | −2.085 | 1.967 |
| 8 | −4.851 | −2.104 | 1.911 |
| 9 | −4.875 | −2.052 | 2.009 |
| 10 | −4.768 | −2.099 | 1.907 |
| 11 | −4.683 | −2.087 | 1.854 |
| 12 | −4.788 | −2.228 | 1.821 |
| 13 | −4.843 | −2.211 | 1.901 |
| 14 | −4.777 | −2.205 | 1.987 |
| 15 | −4.862 | −2.126 | 1.937 |
| 16 | −4.833 | −2.175 | 1.882 |

From Table 1, it is confirmed that the organometallic compound represented by Formula 1 has such electric characteristics that are suitable for use in an electronic device, for example, for use as a dopant for an organic light-emitting device.

Synthesis methods of the organometallic compound represented by Formula 1 may be recognizable by one of ordinary skill in the art by referring to Synthesis Examples provided below.

The organometallic compound represented by Formula 1 is suitable for use in an organic layer of an organic light-emitting device, for example, for use as a dopant in an emission layer of the organic layer. Thus, another aspect provides an organic light-emitting device that includes:

a first electrode;

a second electrode; and an organic layer that is disposed between the first electrode and the second electrode, wherein the organic layer includes an emission layer and at least one organometallic compound represented by Formula 1.

The organic light-emitting device may have, due to the inclusion of an organic layer including the organometallic compound represented by Formula 1, a low driving voltage, high efficiency, high power, high quantum efficiency, a long lifespan, a low roll-off ratio, and excellent color purity.

The organometallic compound of Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host).

In one or more embodiment, the emission layer may include a host and a dopant, and the dopant may include the organometallic compound represented by Formula 1. The organometallic compound represented by Formula 1 may be a red phosphorescent dopant.

The expression "(an organic layer) includes at least one organometallic compounds" as used herein may include an embodiment in which "(an organic layer) includes identical organometallic compounds represented by Formula 1" and an embodiment in which "(an organic layer) includes two or more different organometallic compounds represented by Formula 1."

For example, the organic layer may include, as the organometallic compound, only Compound 1. In this regard, Compound 1 may be included in an emission layer of the organic light-emitting device. In one or more embodiments, the organic layer may include, as the organometallic compound, Compound 1 and Compound 2. In this regard, Compound 1 and Compound 2 may be included in the same layer (for example, Compound 1 and Compound 2 all may be included in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In an embodiment, in the organic light-emitting device, the first electrode is an anode, and the second electrode is a cathode, and the organic layer further includes a hole transport region disposed between the first electrode and the emission layer and an electron transport region disposed between the emission layer and the second electrode, wherein the hole transport region includes a hole injection layer, a hole transport layer, an electron blocking layer, or any combination thereof, and wherein the electron transport region includes a hole blocking layer, an electron transport layer, an electron injection layer, or any combination thereof.

The term "organic layer" as used herein refers to a single layer and/or a plurality of layers disposed between the first electrode and the second electrode of the organic light-emitting device. The "organic layer" may include, in addition to an organic compound, an organometallic complex including metal.

The FIGURE is a schematic view of an organic light-emitting device 10 according to an embodiment. Hereinafter, the structure of an organic light-emitting device according to an embodiment and a method of manufacturing an organic light-emitting device according to an embodiment will be described in connection with the FIGURE. The organic light-emitting device 10 includes a first electrode 11, an organic layer 15, and a second electrode 19, which are sequentially stacked.

A substrate may be additionally disposed under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

The first electrode 11 may be formed by depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. The material for forming the first electrode may be, for example, indium tin oxide (ITO), indium zinc oxide (IZO), tin oxide ($SnO_2$), and zinc oxide (ZnO). In one or more embodiments, magnesium (Mg), aluminum (Al), aluminum-lithium (Al—Li), calcium (Ca), magnesium-indium (Mg—In), or magnesium-silver (Mg—Ag) may be used as the material for forming the first electrode.

The first electrode 11 may have a single-layered structure or a multi-layered structure including two or more layers. For example, the first electrode 11 may have a three-layered structure of ITO/Ag/ITO, but the structure of the first electrode 110 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

A hole injection layer may be formed on the first electrode 11 by using one or more suitable methods selected from vacuum deposition, spin coating, casting, or Langmuir-Blodgett deposition.

When a hole injection layer is formed by vacuum deposition, the deposition conditions may vary according to a compound that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Angstroms per second (A/sec) to about 100 Å/sec. However, embodiments of the present disclosure are not limited thereto.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one selected from m-MTDATA, TDATA, 2-TNATA, NPB, 8-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzene sulfonic acid (PANI/DBSA), poly(3,4-ethylenedioxythiophene)/poly(4-styrene sulfonate) (PEDOT/PSS), polyaniline/camphor sulfonic acid (PANI/CSA), polyaniline/poly(4-styrene sulfonate) (PANI/PSS), a compound represented by Formula 201 below, and a compound represented by Formula 202 below:

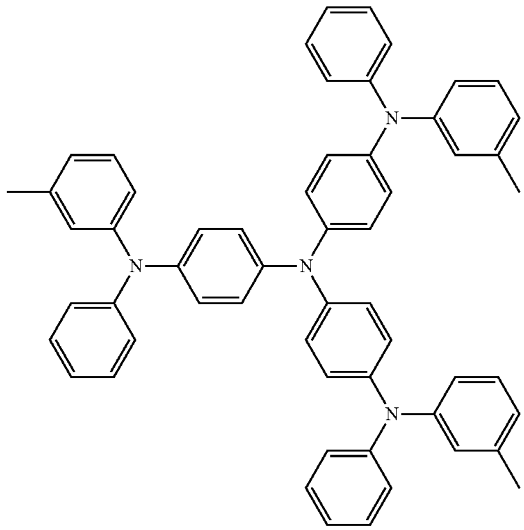
m-MTDATA
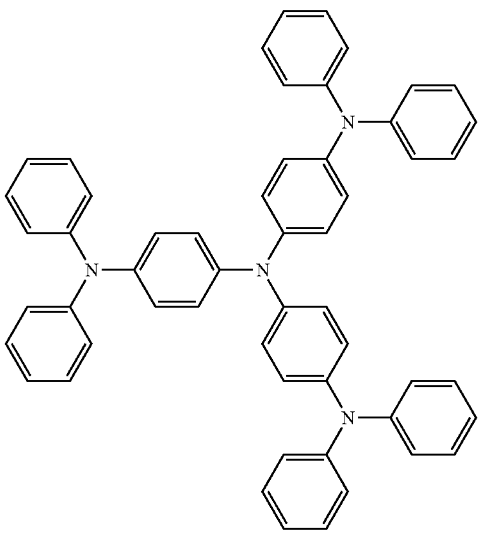
TDATA
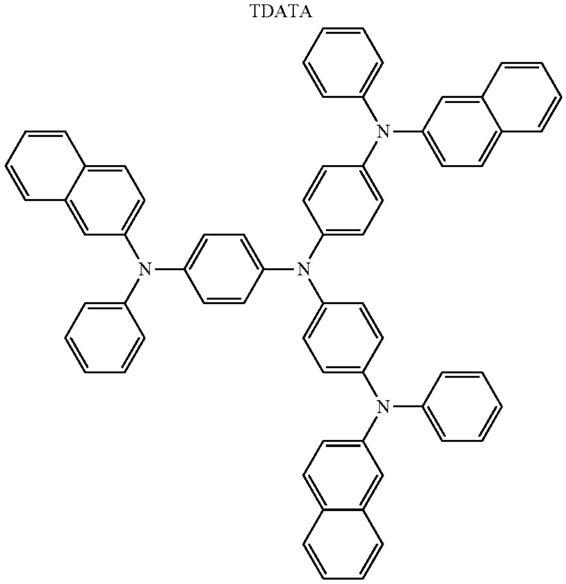
2-TNATA
-continued
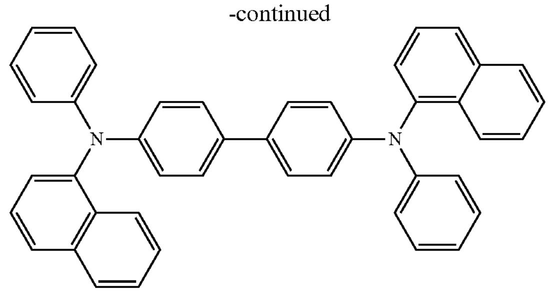
NPB
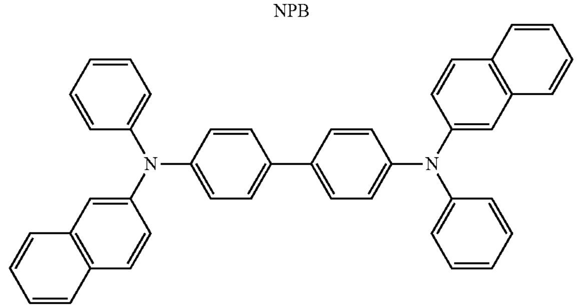
β-NPB
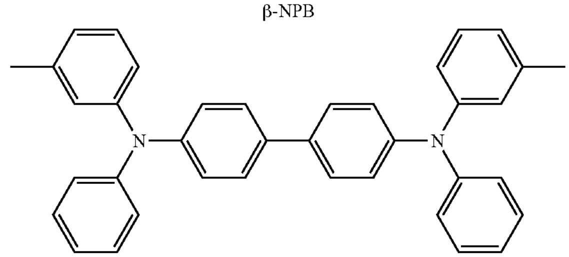
TPD
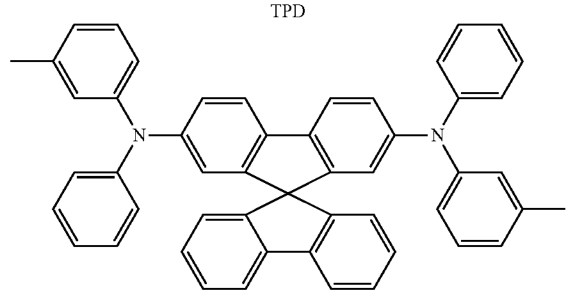
Spiro-TPD
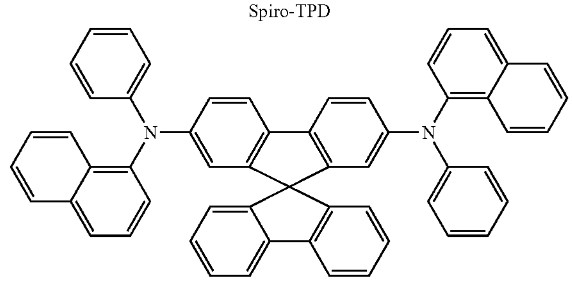
Spiro-NPD
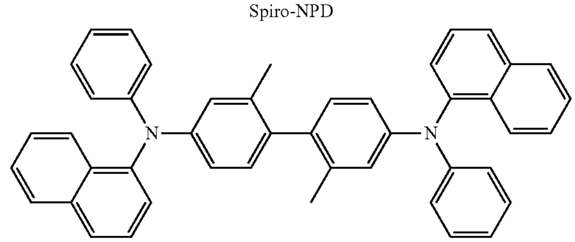
methylated NPB -continued

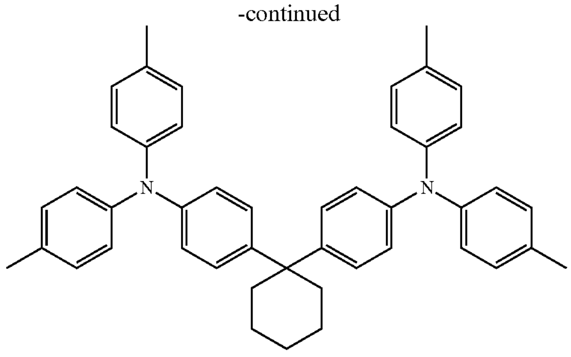

TAPC

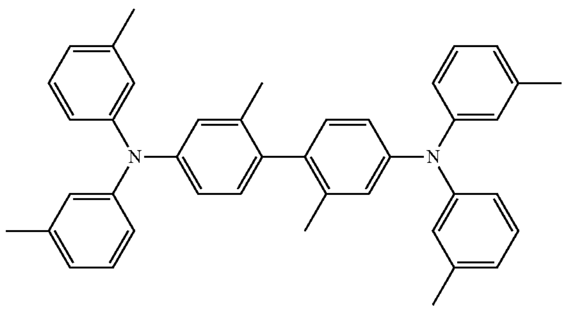

HMTPD

Formula 201

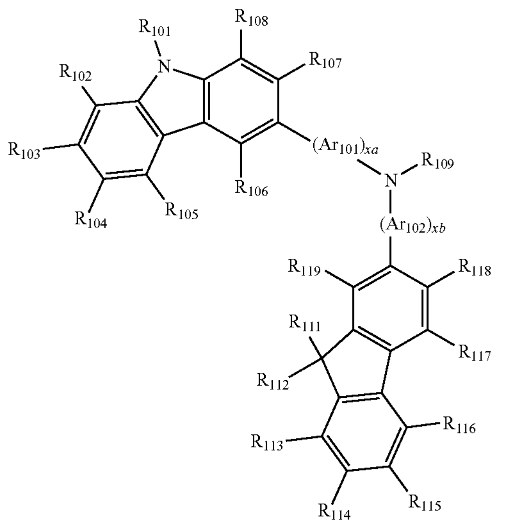

Formula 202

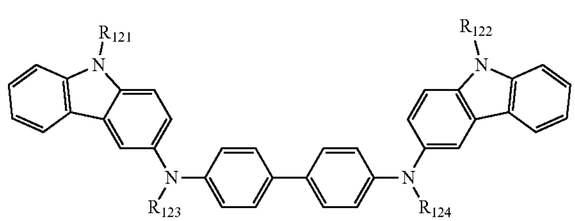

$Ar_{101}$ and $Ar_{102}$ in Formula 201 may each independently be selected from:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroaryl alkyl group, a monovalent non-aromatic condensed polycyclic group, and a monovalent non-aromatic condensed heteropolycyclic group.

In Formula 201, xa and xb may each independently be an integer from 0 to 5, or 0, 1, or 2. For example, xa is 1 and xb is 0, but xa and xb are not limited thereto.

$R_{101}$ to $R_{108}$, $R_{111}$ to $R_{119}$, and $R_{121}$ to $R_{124}$ in Formulae 201 and 202 may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, and so on), and a $C_1$-$C_{10}$ alkoxy group (for example, a methoxy group, an ethoxy group, a propoxy group, a butoxy group, a pentoxy group, and so on);

a $C_1$-$C_{10}$ alkyl group or a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but embodiments of the present disclosure are not limited thereto.

$R_{109}$ in Formula 201 may be selected from:

a phenyl group, a naphthyl group, an anthracenyl group, and a pyridinyl group; and a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

According to an embodiment, the compound represented by Formula 201 may be represented by Formula 201A, but embodiments of the present disclosure are not limited thereto:

Formula 201A

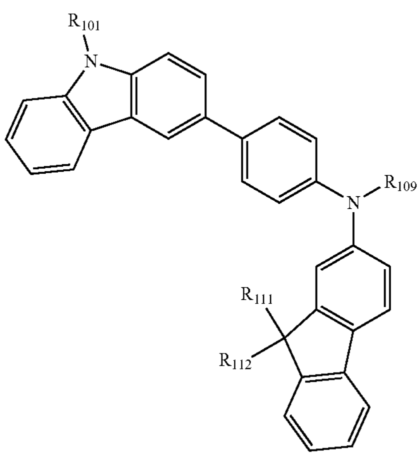

$R_{101}$, $R_{111}$, $R_{112}$, and $R_{109}$ in Formula 201A may be understood by referring to the description provided herein.

For example, the compound represented by Formula 201, and the compound represented by Formula 202 may include compounds HT1 to HT20 illustrated below, but are not limited thereto.

HT1

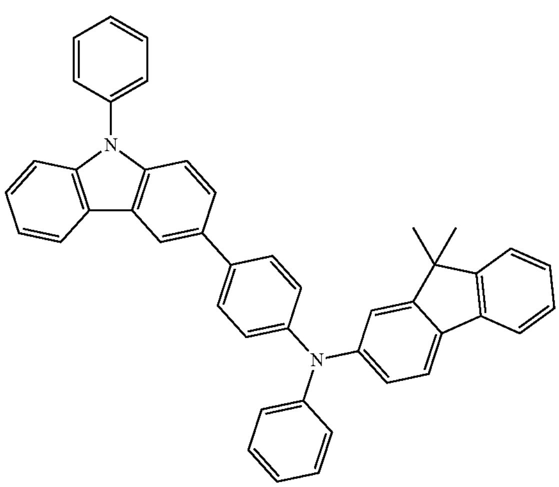

-continued

HT2

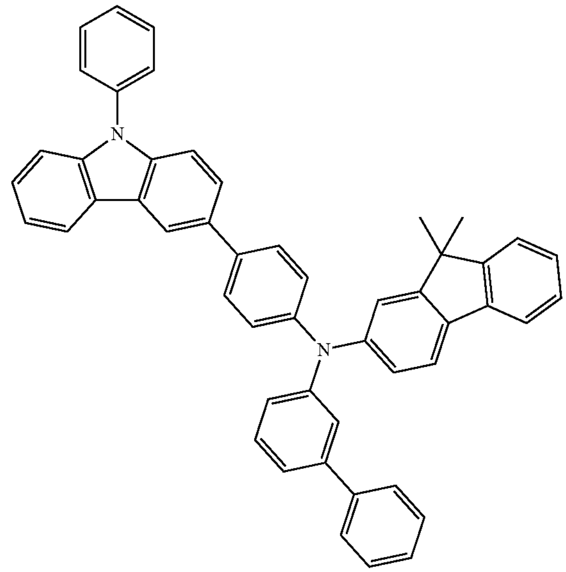

HT3

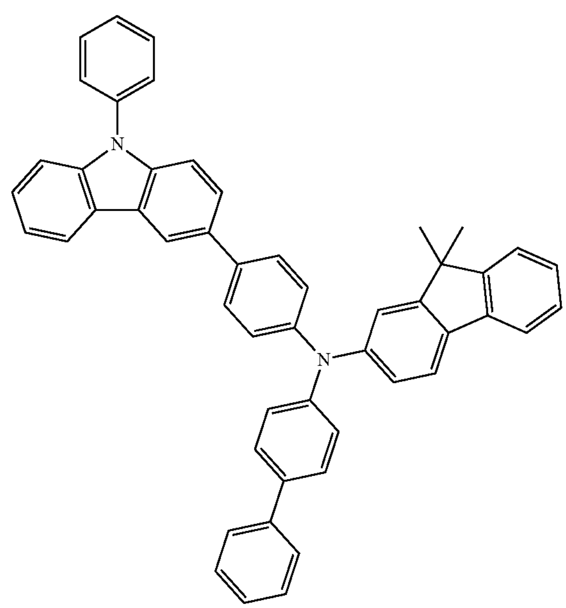

HT4
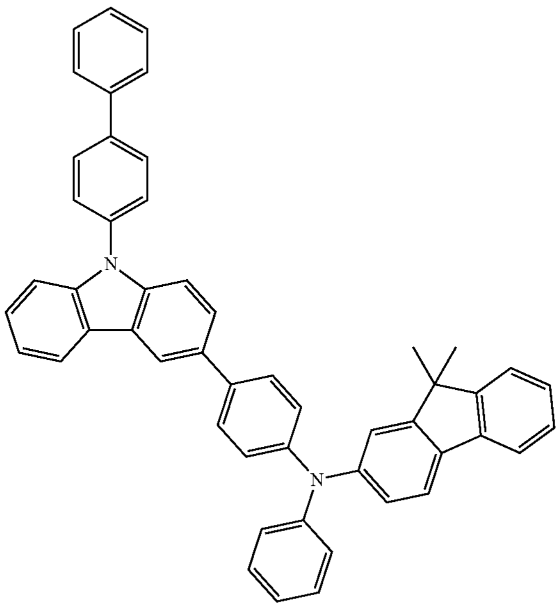
HT5
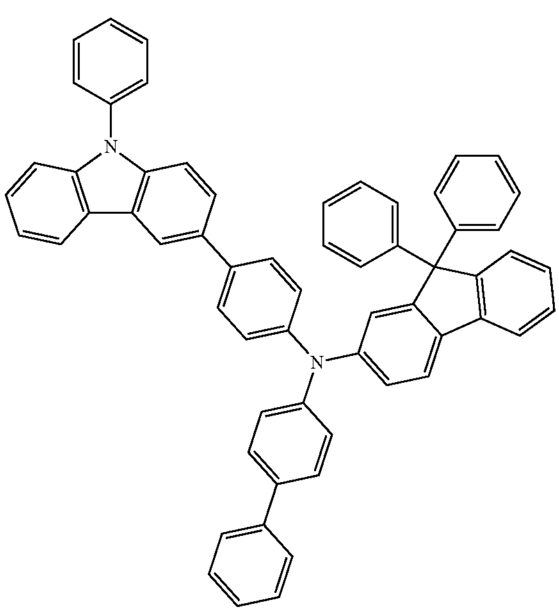
HT6
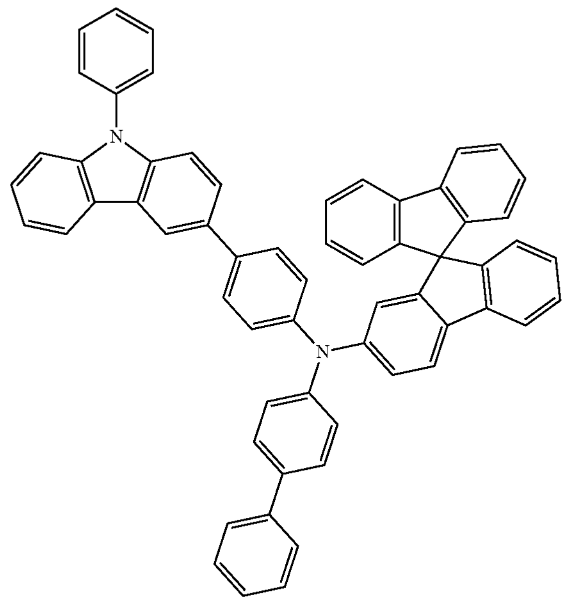
HT7
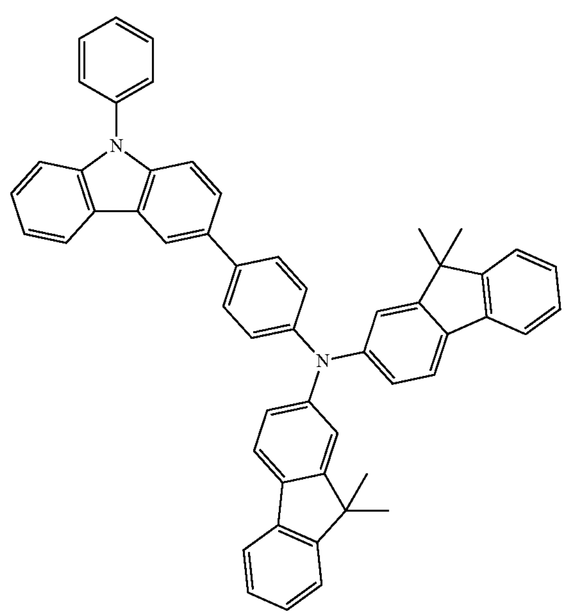

-continued
HT8
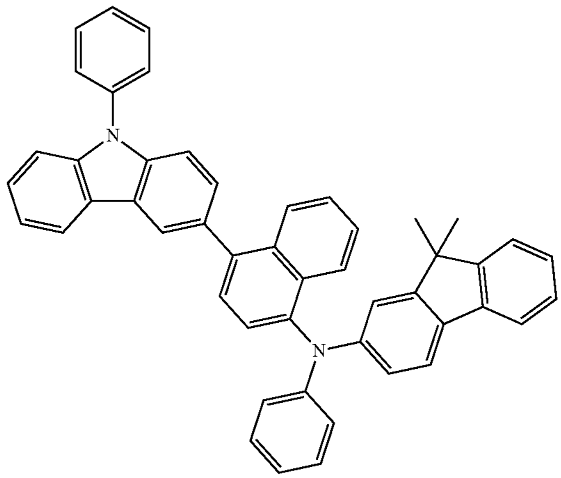
HT9
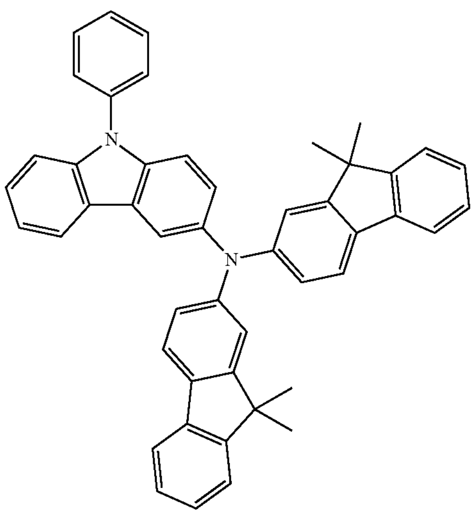
HT10
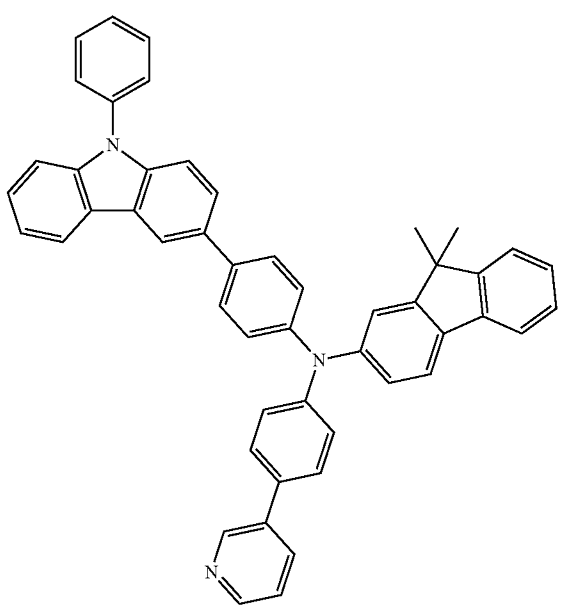
-continued
HT11
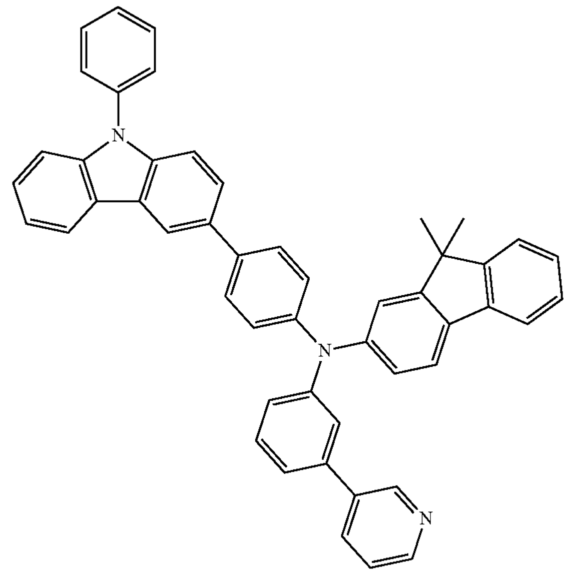
HT12
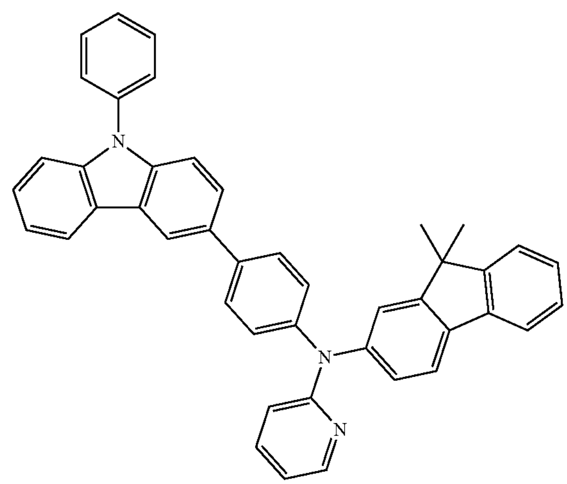
HT13
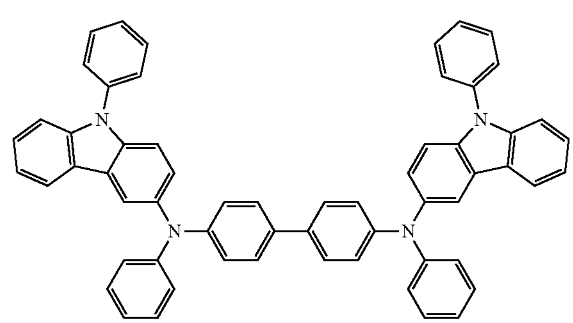

-continued

HT14

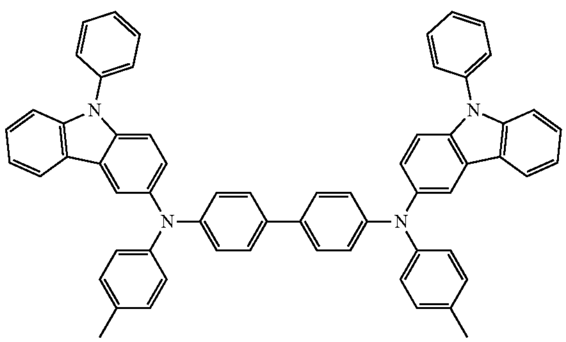

HT15

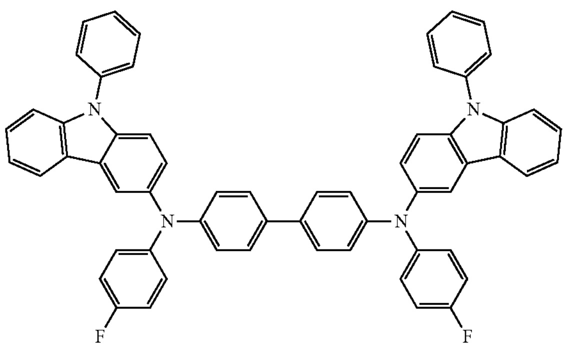

HT16

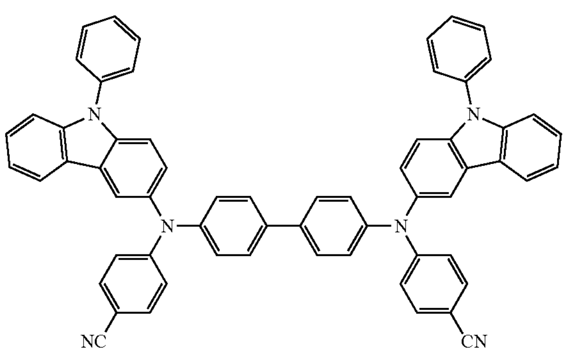

HT17

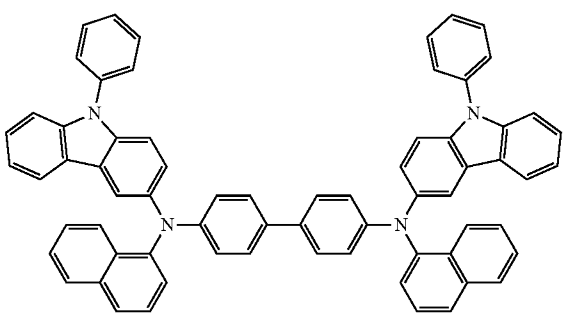

-continued

HT18

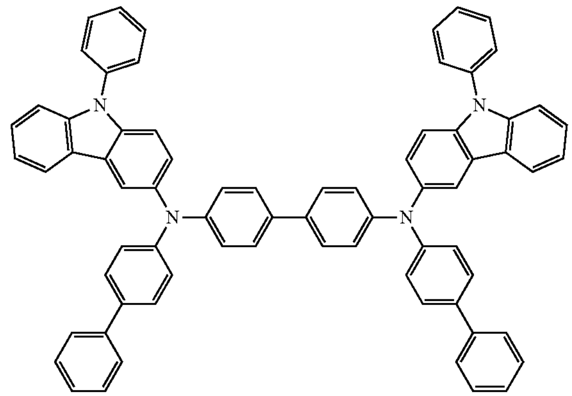

HT19

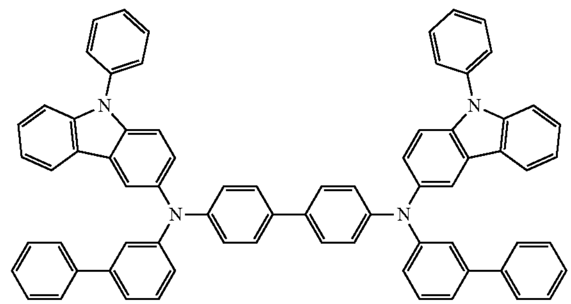

HT20

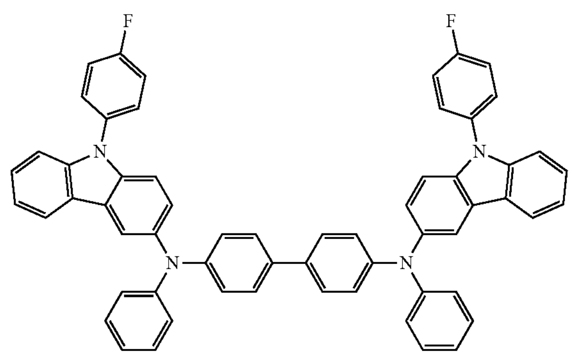

A thickness of the hole transport region may be in a range of about 100 Å to about 10,000 Å, for example, about 100 Å to about 1,000 Å. When the hole transport region includes at least one of a hole injection layer and a hole transport layer, the thickness of the hole injection layer may be in a range of about 100 Å to about 10,000 Å, and for example, about 100 Å to about 1,000 Å, and the thickness of the hole transport layer may be in a range of about 50 Å to about 2,000 Å, and for example, about 100 Å to about 1,500 Å. While not wishing to be bound by theory, it is understood that when the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a cyano group-containing compound, but embodiments of the present disclosure are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenium oxide; and a cyano group-containing compound, such as Compound HT-D1 below, but are not limited thereto.

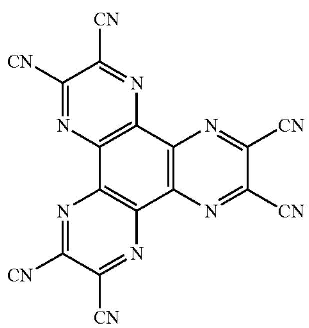

HT-D1

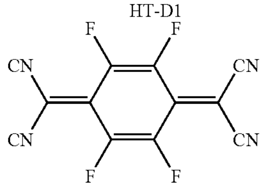

F4-TCNQ

The hole transport region may include a buffer layer.

Also, the buffer layer may compensate for an optical resonance distance according to a wavelength of light emitted from the emission layer, and thus, efficiency of a formed organic light-emitting device may be improved.

Then, an emission layer (EML) may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a compound that is used to form the emission layer.

Meanwhile, when the hole transport region includes an electron blocking layer, a material for the electron blocking layer may be selected from materials for the hole transport region described above and materials for a host to be explained later. However, the material for the electron blocking layer is not limited thereto. For example, when the hole transport region includes an electron blocking layer, a material for the electron blocking layer may be mCP, which will be explained later.

The emission layer may include a host and a dopant, and the dopant may include the organometallic compound represented by Formula 1.

The host may include at least one selected from TPBi, TBADN, ADN (also referred to as "DNA"), CBP, CDBP, TCP, mCP, Compound H50, and Compound H51:

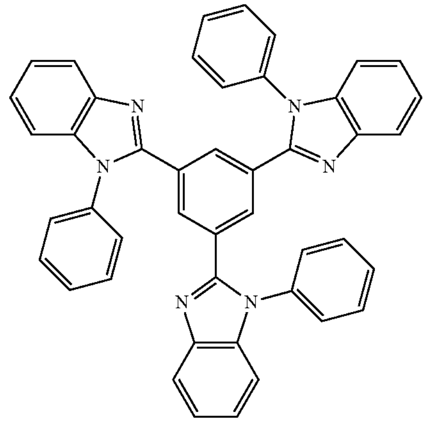

TPBi

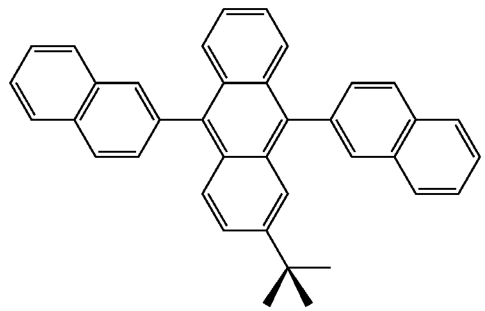

TBADN

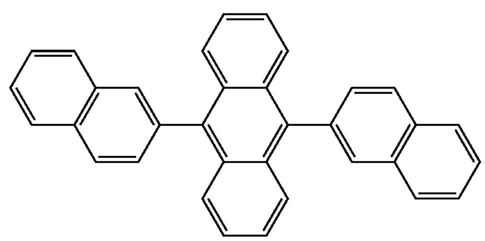

ADN

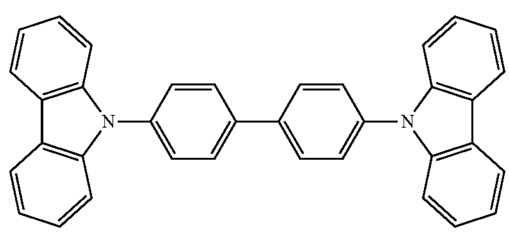

CBP

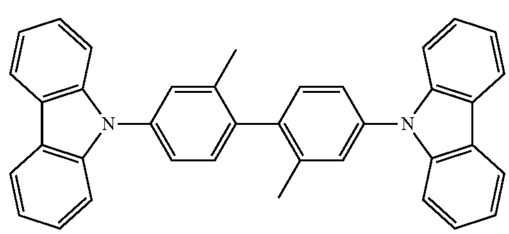

CDBP

-continued

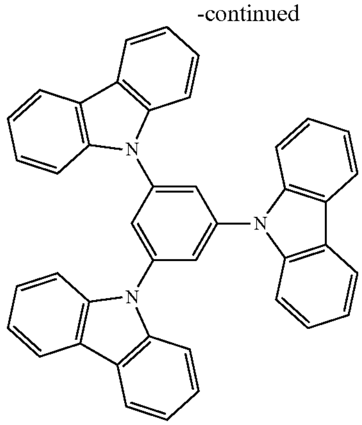

TCP

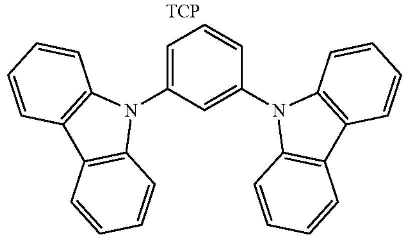

mCP

H50

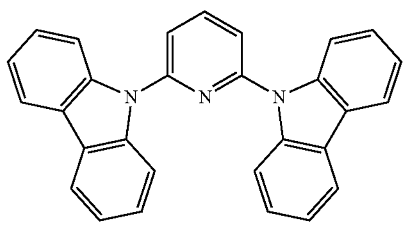

H51

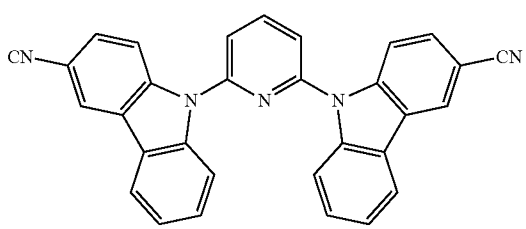

In one or more embodiments, the host may further include a compound represented by Formula 301 below.

Formula 301

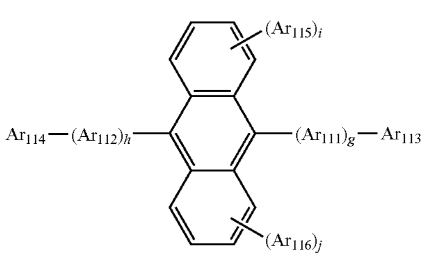

$Ar_{111}$ and $Ar_{112}$ in Formula 301 may each independently be selected from:

a phenylene group, a naphthylene group, a phenanthrenylene group, and a pyrenylene group; and a phenylene group, a naphthylene group, a phenanthrenylene group, and a pyrenylene group, each substituted with at least one selected from a phenyl group, a naphthyl group, and an anthracenyl group.

$Ar_{113}$ to $Ar_{116}$ in Formula 301 may each independently be selected from:

a $C_1$-$C_{10}$ alkyl group, a phenyl group, a naphthyl group, a phenanthrenyl group, and a pyrenyl group; and a phenyl group, a naphthyl group, a phenanthrenyl group, and a pyrenyl group, each substituted with at least one selected from a phenyl group, a naphthyl group, and an anthracenyl group.

g, h, i, and j in Formula 301 may each independently be an integer from 0 to 4, and may be, for example, 0, 1, or 2.

$Ar_{113}$ to $Ar_{116}$ in Formula 301 may each independently be selected from:

a $C_1$-$C_{10}$ alkyl group substituted with at least one selected from a phenyl group, a naphthyl group, and an anthracenyl group;

a phenyl group, a naphthyl group, an anthracenyl group, a pyrenyl, a phenanthrenyl group, and a fluorenyl group;

a phenyl group, a naphthyl group, an anthracenyl group, a pyrenyl group, a phenanthrenyl group, and a fluorenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a alkoxy group, a phenyl group, a naphthyl group, an anthracenyl group, a pyrenyl group, a phenanthrenyl group, and a fluorenyl group; and

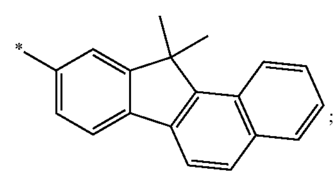 [SMILES: *c1ccc2c(c1)C(C)(C)c1c-2ccc2ccccc12]

but embodiments of the present disclosure are not limited thereto.

In one or more embodiments, the host may include a compound represented by Formula 302 below:

Formula 302

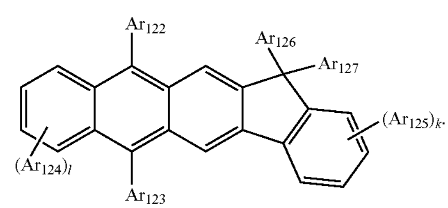

$Ar_{122}$ to $Ar_{125}$ in Formula 302 are the same as described in detail in connection with $Ar_{113}$ in Formula 301.

$Ar_{126}$ and $Ar_{127}$ in Formula 302 may each independently be a $C_1$-$C_{10}$ alkyl group (for example, a methyl group, an ethyl group, or a propyl group).

k and l in Formula 302 may each independently be an integer from 0 to 4. For example, k and l may be 0, 1, or 2.

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host, but embodiments of the present disclosure are not limited thereto.

The dopant may include the organometallic compound represented by Formula 1 above. For example, the dopant may be a red phosphorescent dopant.

A thickness of the emission layer may be in a range of about 100 Å to about 1,000 Å, for example, about 200 Å to about 600 Å. While not wishing to be bound by theory, it is understood that when the thickness of the emission layer is within this range, excellent light-emission characteristics may be obtained without a substantial increase in driving voltage.

Then, an electron transport region may be disposed on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, and BAlq but embodiments of the present disclosure are not limited thereto.

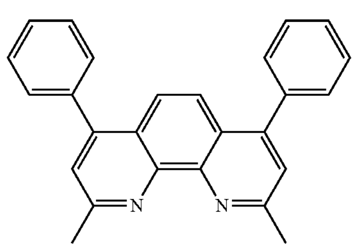

BCP

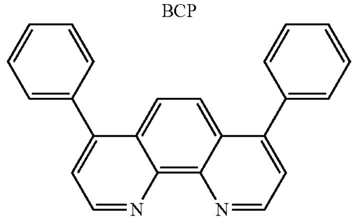

Bphen

A thickness of the hole blocking layer may be in a range of about 20 Å to about 1,000 Å, for example, about 30 Å to about 300 Å. While not wishing to be bound by theory, it is understood that when the thickness of the hole blocking layer is within these ranges, the hole blocking layer may have improved hole blocking ability without a substantial increase in driving voltage.

The electron transport layer may further include at least one selected from BCP, Bphen, $Alq_3$, BAlq, TAZ, and NTAZ.

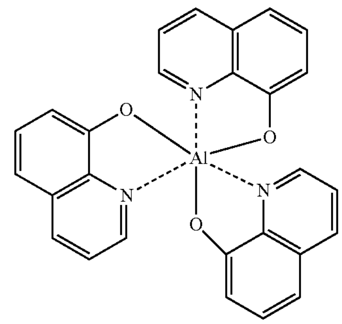

Alq3

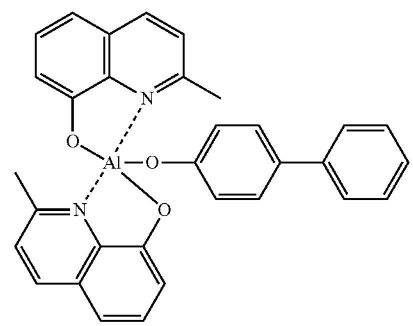

BAlq

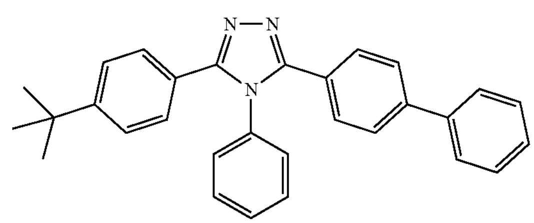

TAZ

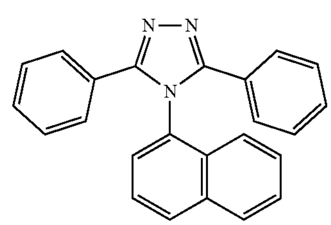

NTAZ

In one or more embodiments, the electron transport layer may include at least one of ET1 to ET25, but are not limited thereto:
ET1
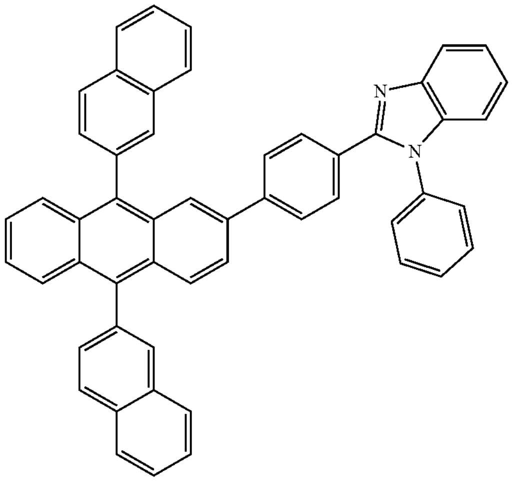
ET2
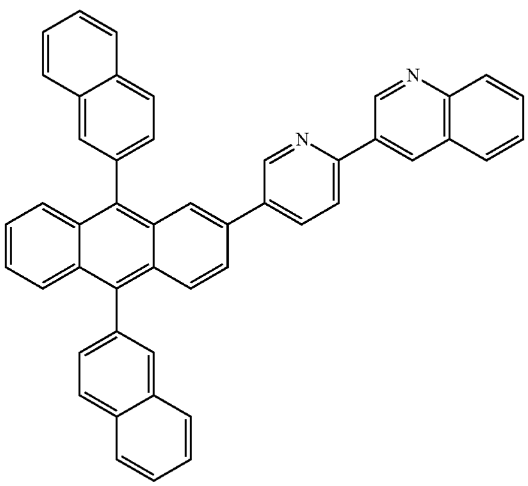
ET3
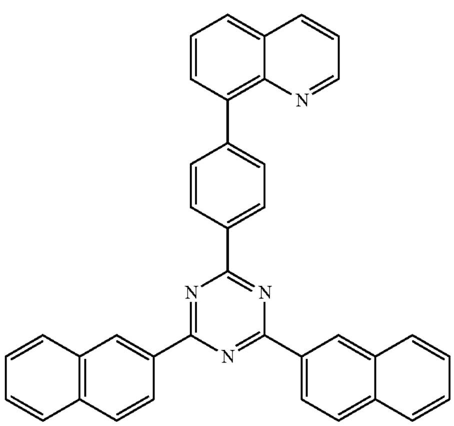
-continued
ET4
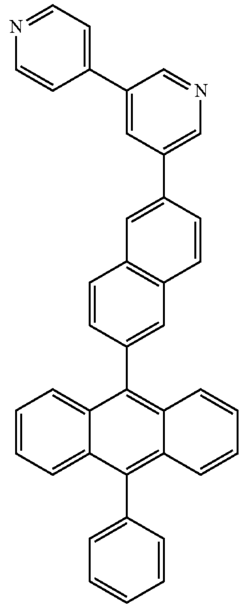
ET5
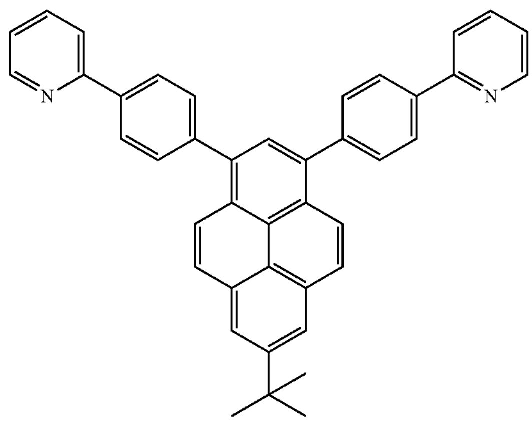
ET6
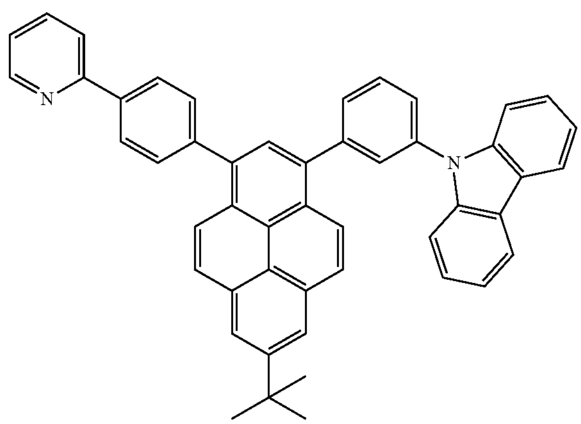

-continued
ET7
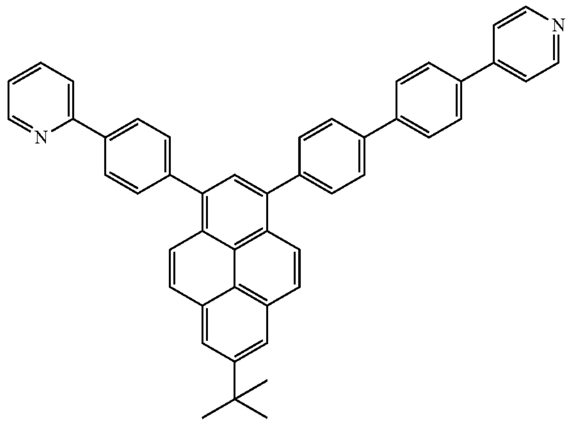
ET8
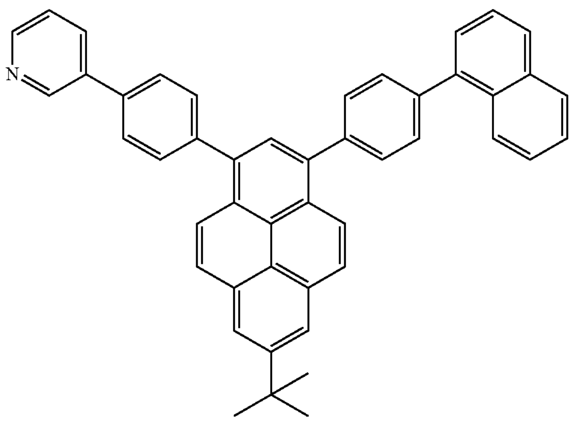
ET9
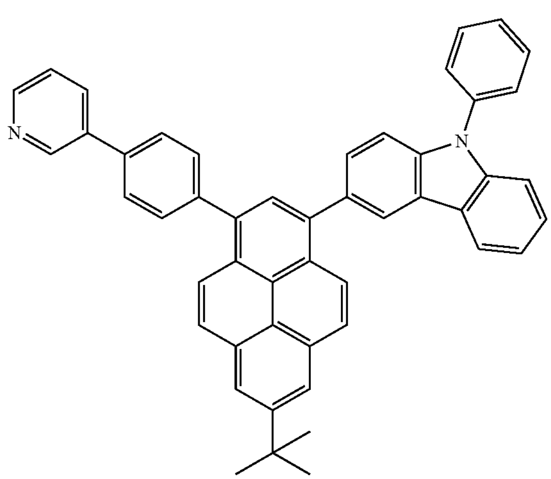
-continued
ET10
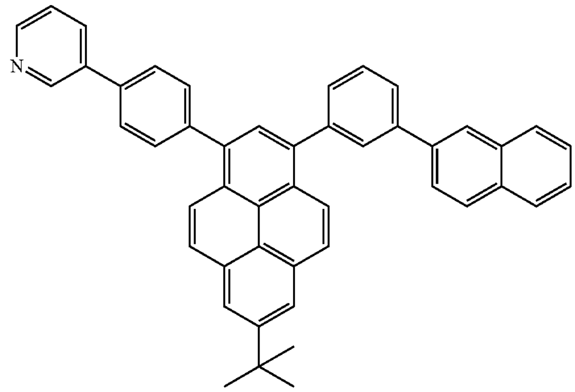
ET11
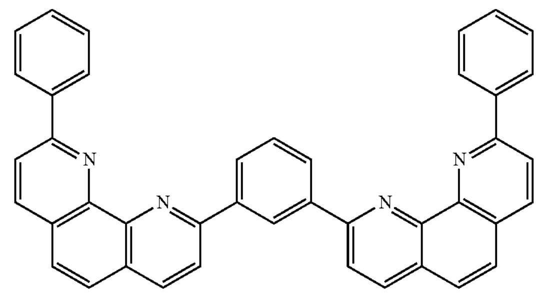
ET12
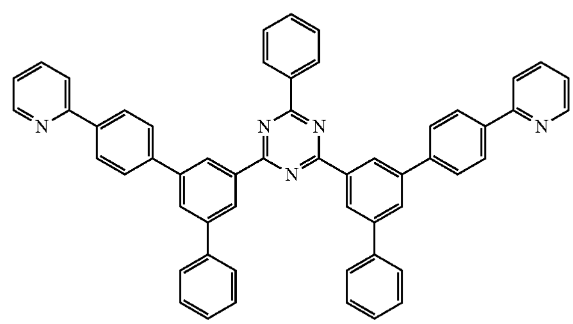
ET13
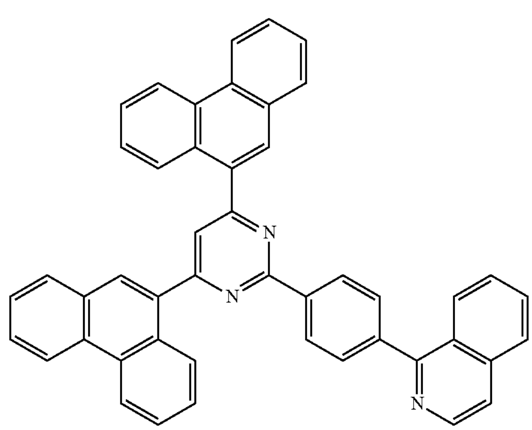

-continued
ET14
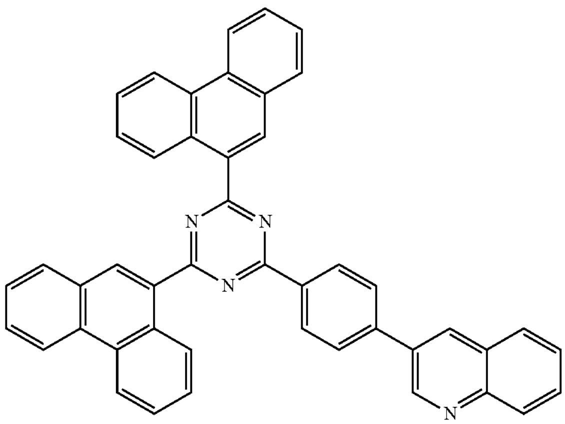
ET15
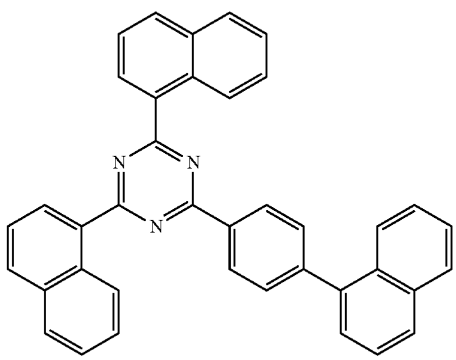
ET16
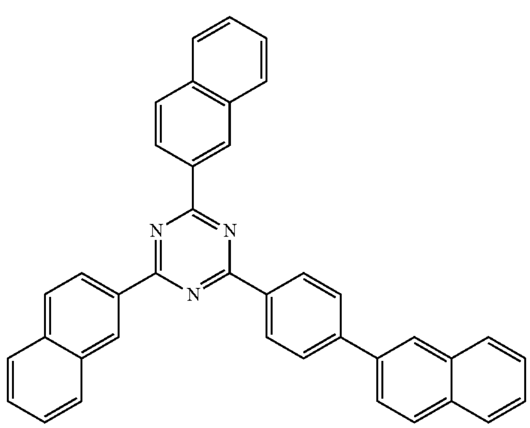
-continued
ET17
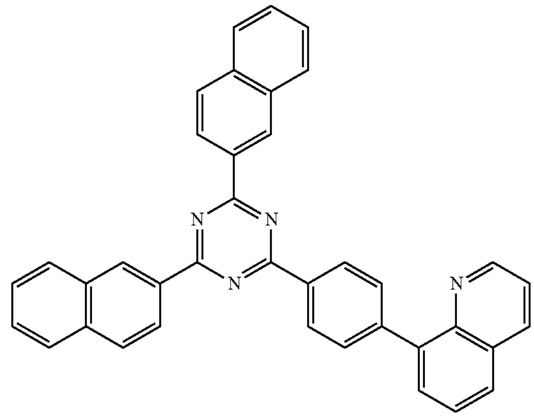
ET18
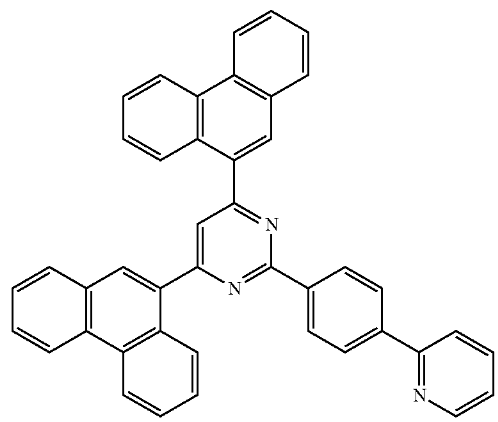
ET19
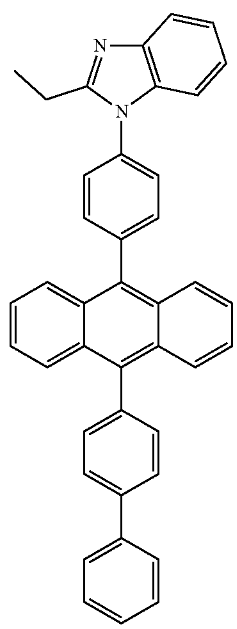

ET20
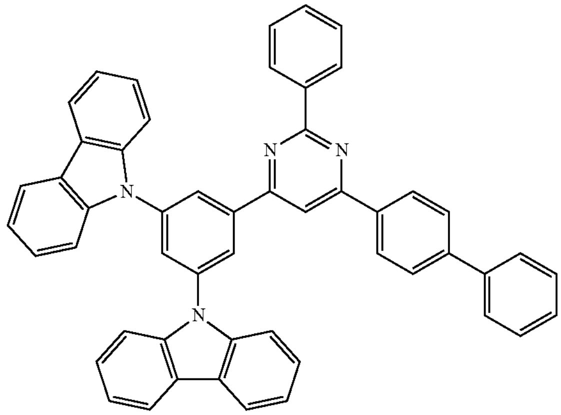
ET21
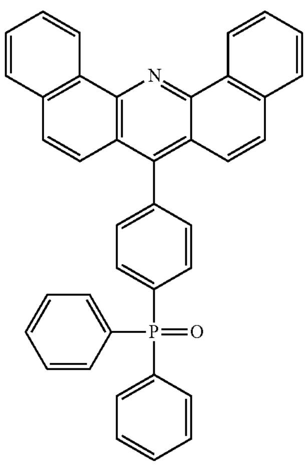
ET22
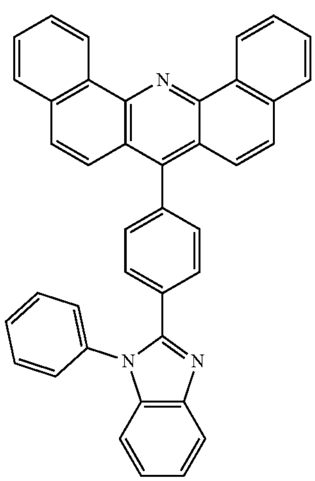
ET23
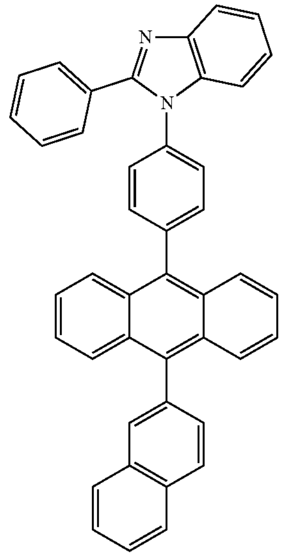
ET24
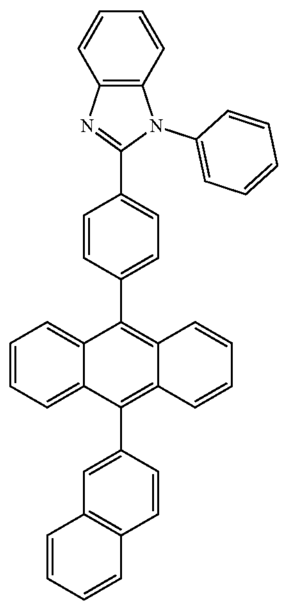
ET25
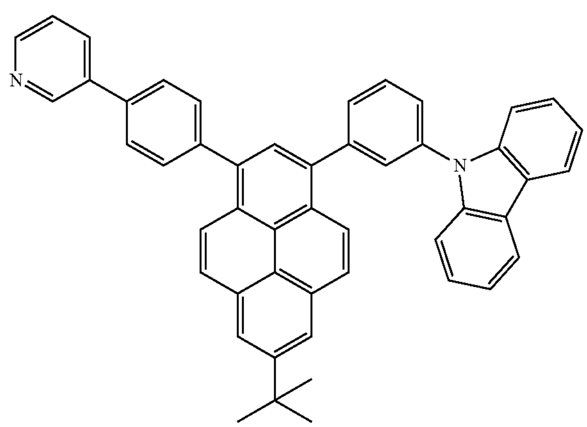
A thickness of the electron transport layer may be in a range of about 100 Å to about 1,000 Å, for example, about 150 Å to about 500 Å. While not wishing to be bound by theory, it is understood that when the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (8-hydroxylithium quinolate, LiQ) or ET-D2.

ET-D1

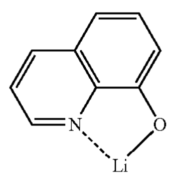

ET-D2

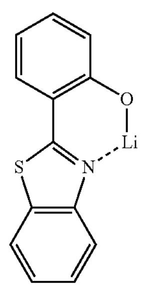

The electron transport region may include an electron injection layer (EIL) that promotes flow of electrons from the second electrode 19 thereinto.

The electron injection layer may include at least one selected from LiF, NaCl, CsF, $Li_2O$, and BaO.

A thickness of the electron injection layer may be in a range of about 1 Å to about 100 Å, for example, about 3 Å to about 90 Å. While not wishing to be bound by theory, it is understood that when the thickness of the electron injection layer is within the range described above, the electron injection layer may have satisfactory electron injection characteristics without a substantial increase in driving voltage.

The second electrode 19 is disposed on the organic layer 15. The second electrode 19 may be a cathode. A material for forming the second electrode 19 may be selected from metal, an alloy, an electrically conductive compound, and a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as a material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to the FIGURE, but embodiments of the present disclosure are not limited thereto.

Another aspect of the present disclosure provides a diagnostic composition including at least one organometallic compound represented by Formula 1.

The organometallic compound represented by Formula 1 provides high luminescent efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an iso-propyloxy group.

The term "$C_2$-$C_{60}$ alkenyl group" as used herein refers to a hydrocarbon group formed by including at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by including at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, P, Si and S as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and at least one carbon-carbon double bond in its ring. Examples of the $C_1$-$C_{10}$ heterocycloalkenyl group are a 2,3-dihydrofuranyl group, and a 2,3-dihydrothiophenyl group. The term "$C_1$-

$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_7$-$C_{60}$ alkylaryl group" as used herein refers to a $C_6$-$C_{60}$ aryl group substituted at least one $C_1$-$C_{60}$ alkyl group.

The term "$C_1$-$C_{60}$ heteroaryl group" as used herein refers to a monovalent group having a heterocyclic aromatic system that has at least one heteroatom selected from N, O, P, Si, and S as a ring-forming atom, and 1 to 60 carbon atoms. The term "$C_1$-$C_{60}$ heteroarylene group" as used herein refers to a divalent group having a heterocyclic aromatic system that has at least one heteroatom selected from N, O, P, Si, and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_2$-$C_{60}$ alkyl heteroaryl group" as used herein refers to a $C_1$-$C_{60}$ heteroaryl group substituted with at least one $C_1$-$C_{60}$ alkyl group.

The term "$C_6$-$C_{60}$ aryloxy group" as used herein indicates —$OA_{102}$ (wherein $A_{102}$ is the $C_6$-$C_{60}$ aryl group), and the term a "$C_6$-$C_{60}$ arylthio group" as used herein indicates —$SA_{103}$ (wherein $A_{103}$ is the $C_6$-$C_{60}$ aryl group), and the term "$C_7$-$C_{60}$ aryl alkyl group" as used herein indicates -$A_{104}A_{105}$ (wherein $A_{105}$ is the $C_6$-$C_{59}$ aryl group and $A_{104}$ is the $C_1$-$C_{53}$ alkylene group).

The term "$C_1$-$C_{60}$ heteroaryloxy group" as used herein refers to —$OA_{106}$ (wherein $A_{106}$ is the $C_2$-$C_{60}$ heteroaryl group), the term "$C_1$-$C_{60}$ heteroarylthio group" as used herein indicates -$SA_{107}$ (wherein $A_{107}$ is the $C_1$-$C_{60}$ heteroaryl group), and the term "$C_2$-$C_{60}$ heteroaryl alkyl group" as used herein refers to -$A_{108}A_{109}$ ($A_{109}$ is a $C_1$-$C_{59}$ heteroaryl group, and $A_{108}$ is a $C_1$-$C_{59}$ alkylene group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, and S, other than carbon atoms, as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one heteroatom selected from N, O, Si, P, and S other than 1 to 30 carbon atoms. The $C_1$-$C_{30}$ heterocyclic group may be a monocyclic group or a polycyclic group.

At least one substituent selected from the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_6$-$C_{60}$ aryloxy group, the substituted $C_6$-$C_{60}$ arylthio group, the substituted $C_7$-$C_{60}$ aryl alkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroaryl alkyl group, the substituted $C_2$-$C_{60}$ alkyl heteroaryl group, the substituted monovalent non-aromatic condensed polycyclic group, and the substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroaryl alkyl group, a $C_2$-$C_{60}$ alkyl heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroaryl alkyl group, a $C_2$-$C_{60}$ alkyl heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroaryl alkyl group, a $C_2$-$C_{60}$ alkyl heteroaryl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroaryl alkyl group, a $C_2$-$C_{60}$ alkyl heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, and —$P(=O)(Q_{28})(Q_{29})$; and —$N(Q_{31})(Q_{32})$, —$Si(Q_{33})(Q_{34})(Q_{35})$, —$B(Q_{36})(Q_{37})$, and —$P(=O)(Q_{38})(Q_{39})$, and $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryl group substituted with at least one selected from a $C_1$-$C_{60}$ alkyl group and a $C_6$-$C_{60}$ aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroaryl alkyl group, a $C_2$-$C_{60}$ alkyl heteroaryl group, a monovalent non-aromatic condensed polycyclic group, and a monovalent non-aromatic condensed heteropolycyclic group.

Hereinafter, a compound and an organic light-emitting device according to embodiments are described in detail with reference to Synthesis Example and Examples. However, the organic light-emitting device is not limited thereto. The expression "B was used instead of A" used in describing Synthesis Examples means that an identical number of molar equivalents of A was used in place of molar equivalents of B.

EXAMPLES

Synthesis Example 1 (Compound 2)

Compound 2 was synthesized according to the Reaction Scheme:

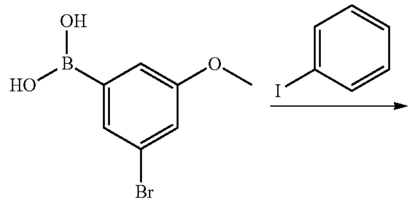

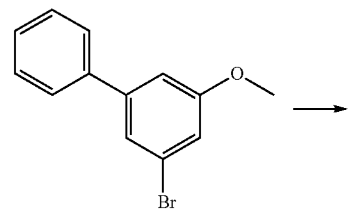

2-5

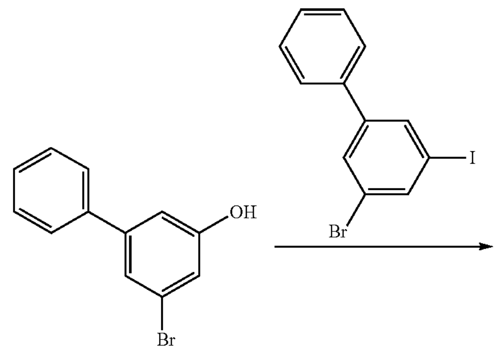

2-4

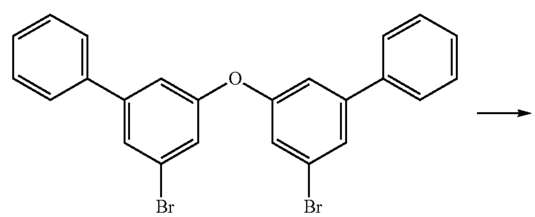

2-3

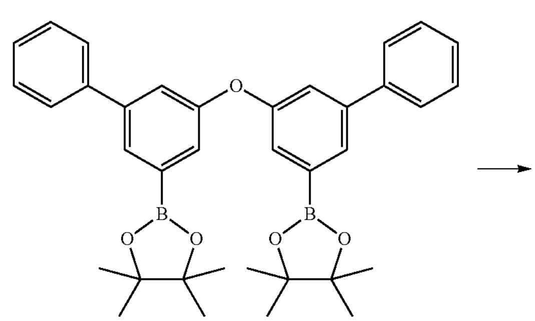

2-2

-continued

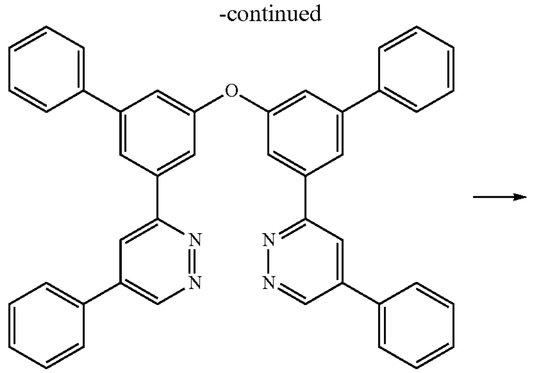

2-1

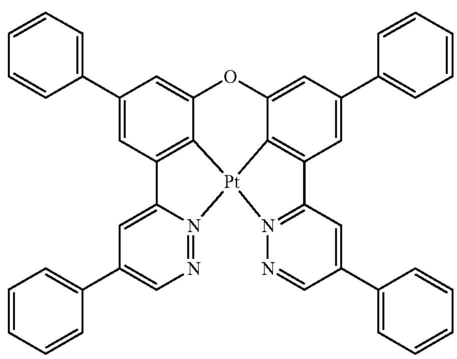

2

Synthesis of Intermediate 2-5

10.0 grams (g) (43.3 millimoles, mmol) of (3-bromo-5-methoxyphenyl)boronic acid, 80 milliliters (ml) of tetrahydrofuran (THF), and 20 ml of water were mixed, and 9.7 g (47.6 mmol) of iodobenzene, 3.5 g (3.0 mmol) of $Pd(PPh_3)_4$, and 18.0 g (130.0 mmol) of $K_2CO_3$ were mixed. Then, the reaction mixture was heated under reflux at a temperature of 80° C. for 18 hours. After the reaction was completed, the reaction mixture was concentrated under reduced pressure and dissolved in 50 ml of ethyl acetate to extract the organic layer. The extracted organic layer was dried by using magnesium sulfate, distilled under reduced pressure, and purified by liquid chromatography to obtain 9.1 g (35 mmol, yield: 80%) of Intermediate 2-5. LC-MS m/z=263 $(M+H)^+$.

Synthesis of Intermediate 2-4

5.0 g (19.0 mmol) of Intermediate 2-5 and 80 ml of dichloromethane were mixed, and 95 ml (95.0 mmol) of 1.0 molar (M) $BBr_3$ in dichloromethane was slowly added by drops thereto at a temperature of 0° C. for 1 hour. Then, the reaction mixture was stirred at room temperature for about 4 hour, and a small amount of methanol was added by drops thereto again at a temperature of 0° C. After several minutes, a saturated sodium hydrogen carbonate solution was added by drops thereto to adjust pH to 12 to 13. The organic layer obtained therefrom was dried by using magnesium sulfate, distilled under reduced pressure, and purified by liquid chromatography to obtain 4.2 g (17 mmol, yield: 90%) of Intermediate 2-4. LC-MS m/z=249 $(M+H)^+$.

Synthesis of Intermediate 2-3

4.2 g (17.0 mmol) of Intermediate 2-4, 6.1 g (17.0 mmol) of 3-bromo-5-iodo-1,1'-biphenyl, and 80 ml of dimethyl sulfoxide (DMSO) were mixed, and 0.6 g (3.4 mmol) of CuI, 0.8 g (6.8 mmol) of pyridine-2-carboxylic acid, and 7.2 g (34.0 mmol) of $K_3PO_4$ were added thereto. The reaction mixture was then heated under reflux at a temperature of 120° C. for 18 hours. After the reaction was completed, the organic layer was extracted therefrom by using ethyl acetate and water, dried by using magnesium sulfate, distilled under reduced pressure, and purified by liquid chromatography to obtain 4.1 g (8.5 mmol, yield: 50%) of Intermediate 2-3. LC-MS m/z=479 $(M+H)^+$.

Synthesis of Intermediate 2-2

4.1 g (8.5 mmol) of Intermediate 2-3 and 80 ml of toluene were mixed, and 6.4 g (25.5 mmol) of 4,4,4',4',5,5,5',5'-octamethyl-2,2'-bi(1,3,2-dioxaborolane), 1.2 g (1.7 mmol) of $Pd(PPh_3)_4$, and 2.5 g (25.5 mmol) of KOAc were added thereto. The reaction mixture was heated under reflux at a temperature of 120° C. for 18 hours. After the reaction was completed, the reaction mixture was concentrated under reduced pressure and dissolved in 80 ml of ethyl acetate to extract the organic layer. The extracted organic layer was dried by using magnesium sulfate, distilled under reduced pressure, and purified by liquid chromatography to obtain 3.4 g (6.0 mmol, yield: 70%) of Intermediate 2-2. LC-MS m/z=575 $(M+H)^+$.

Synthesis of Intermediate 2-1

3.4 g (6.0 mmol) of Intermediate 2-2 and 80 ml of THF were mixed, and 2.8 g (12.0 mmol) of 3-bromo-5-phenylpyridazine, 1.0 g (0.9 mmol) of $Pd(PPh_3)_4$, and 2.5 g (18.0 mmol) of $K_2CO_3$ were added thereto. The reaction mixture was heated under reflux at a temperature of 80° C. for 18 hours. After the reaction was completed, the organic layer was extracted therefrom by using ethyl acetate and water, dried by using magnesium sulfate, distilled under reduced pressure, and purified by liquid chromatography to obtain 2.2 g (3.6 mmol, yield: 60%) of Intermediate 2-1. LC-MS m/z=631 $(M+H)^+$.

Synthesis of Compound 2

1.6 g (2.5 mmol) of Intermediate 2-1, 100 ml of o-xylene, and 200 ml of benzonitrile were mixed at room temperature, and 1.2 g (2.5 mmol) of $PtCl_2(NCPh)_2$ was added thereto. The reaction mixture was heated under reflux for 26 hours. After completion of the reaction was confirmed by LCMS, the reaction mixture was concentrated under reduced pressure and purified by liquid chromatography to obtain 0.7 g (0.8 mmol, yield: 30%) of Compound 2. The obtained compound was identified by LC-MS. LC-MS m/z=824 $(M+H)^+$.

Synthesis Example 2 (Compound 1)

Compound 1 was synthesized according to the Reaction Scheme:

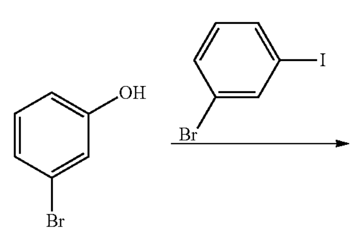

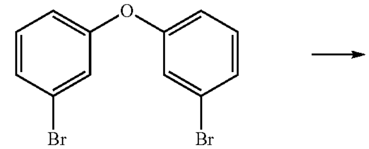

1-3

-continued

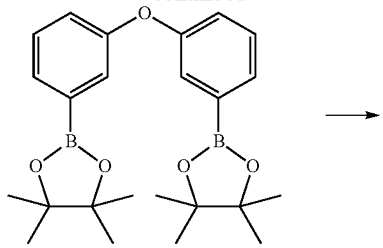

1-2

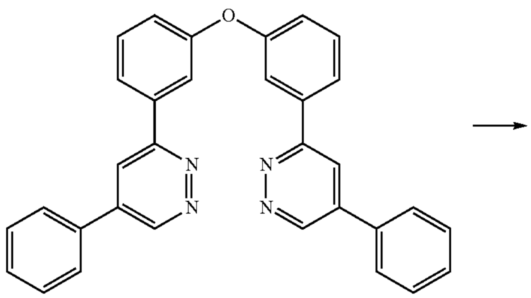

1-1

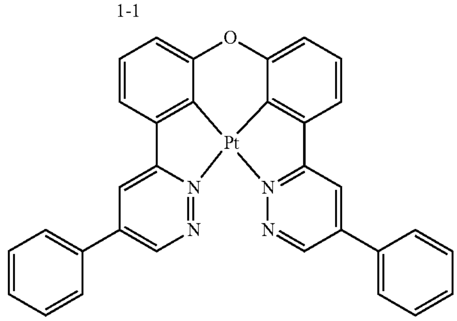

1

Synthesis of Intermediate 1-3

Intermediate 1-3 (yield: 65%) was synthesized in the same manner as Intermediate 2-3 of Synthesis Example 1, except that 3-bromophenol was used instead of Intermediate 2-4, and 1-bromo-3-iodobenzene was used instead of 3-bromo-5-iodo-1,1'-biphenyl. The obtained compound was identified by LC-MS. LC-MS m/z=327 $(M+H)^+$.

Synthesis of Intermediate 1-2

Intermediate 1-2 (yield: 80%) was synthesized in the same manner as Intermediate 2-2 of Synthesis Example 1, except that Intermediate 1-3 was used instead of Intermediate 2-3. The obtained compound was identified by LC-MS. LC-MS m/z=423 $(M+H)^+$.

Synthesis of Intermediate 1-1

Intermediate 1-1 (yield: 75%) was synthesized in the same manner as Intermediate 2-1 of Synthesis Example 1, except that Intermediate 1-2 was used instead of Intermediate 2-2. The obtained compound was identified by LC-MS. LC-MS m/z=479 $(M+H)^+$.

Synthesis of Compound 1

Compound 1 (yield: 43%) was synthesized in the same manner as Compound 2 of Synthesis Example 1, except that Intermediate 1-1 was used instead of Intermediate 2-1. The obtained compound was identified by LC-MS. LC-MS m/z=672 $(M+H)^+$.

Synthesis Example 3 (Compound 3)

Compound 3 was synthesized according to the Reaction Scheme:

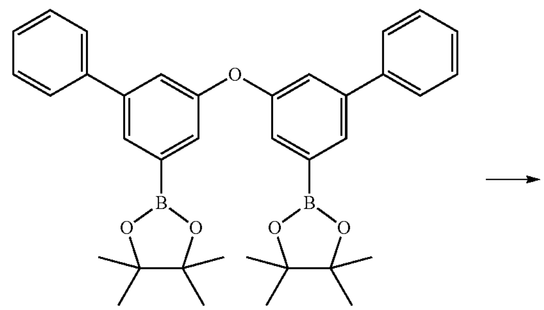

2-2

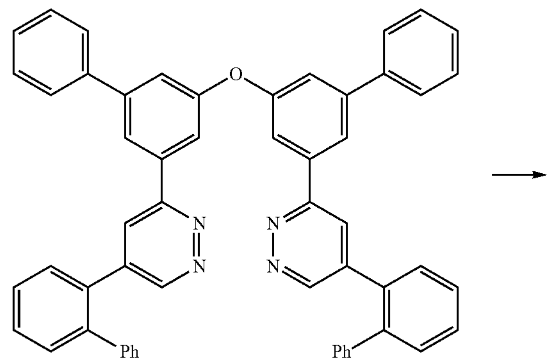

3-1

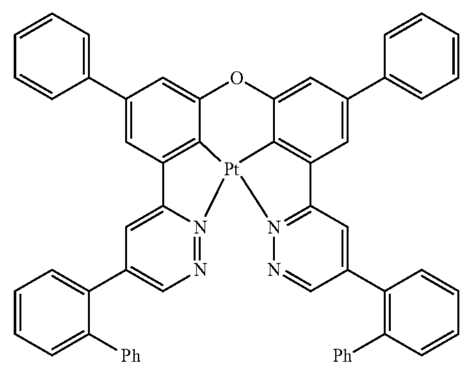

3

Synthesis of Intermediate 3-1

Intermediate 3-1 (yield: 80%) was synthesized in the same manner as Intermediate 2-1 of Synthesis Example 1, except that 5-([1,1'-biphenyl]-2-yl)-3-chloropyridazine was used instead of 3-bromo-5-phenylpyridazine. The obtained compound was identified by LC-MS. LC-MS m/z=783 (M+H)+.

Synthesis of Compound 3

Compound 3 (yield: 63%) was synthesized in the same manner as Compound 2 of Synthesis Example 1, except that Intermediate 3-1 was used instead of Intermediate 2-1. The obtained compound was identified by LC-MS. LC-MS m/z=976 $(M+H)^+$.

Synthesis Example 4 (Compound 4)

Compound 4 was synthesized according to the Reaction Scheme:

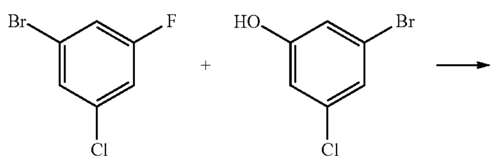

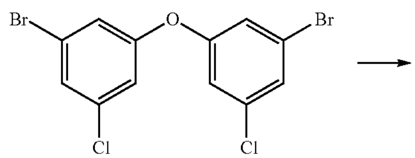

4-4

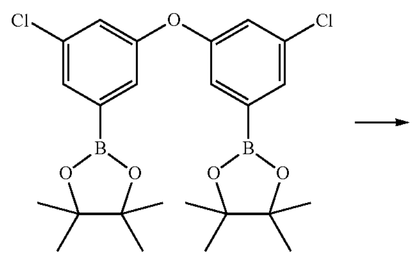

4-3

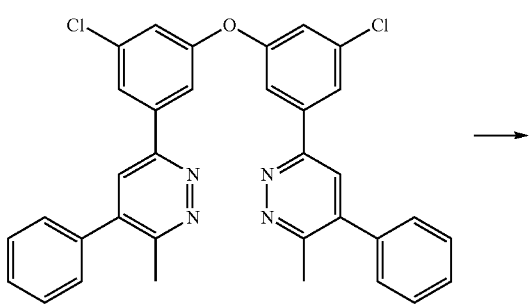

4-2

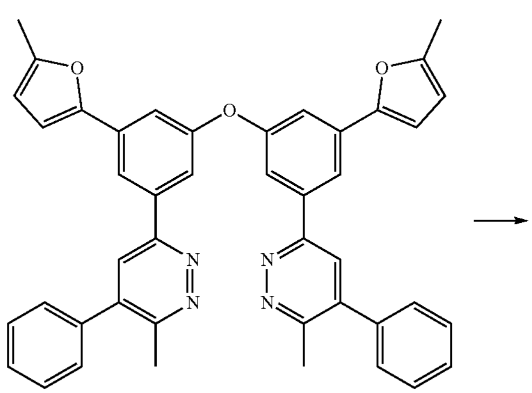

4-1

-continued

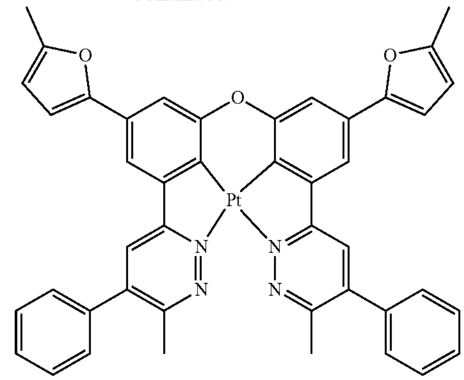

4

Synthesis of Intermediate 4-4

50.0 g (238.7 mmol) of 1-bromo-3-chloro-5-fluorobenzene and N-methyl-2-pyrrolidone (NMP) were mixed, and 44.5 g (214.8 mmol) of 3-bromo-5-chlorophenol and 59.0 g (429.6 mmol) of $K_2CO_3$ were mixed. Then, the reaction mixture was heated at a temperature of 180° C. for 16 hours. After the reaction was completed, the reaction mixture was concentrated under reduced pressure and the organic layer was extracted therefrom by using dichloromethane and water. The extracted organic layer was dried by using magnesium sulfate, distilled under reduced pressure, and purified by liquid chromatography to obtain 51.0 g (129 mmol, yield: 60%) of Intermediate 4-4. LC-MS m/z=394 $(M+H)^+$.

Synthesis of Intermediate 4-3

Intermediate 4-3 (yield: 70%) was synthesized in the same manner as Intermediate 2-2 of Synthesis Example 1, except that Intermediate 4-4 was used instead of Intermediate 2-3. The obtained compound was identified by LC-MS. LC-MS m/z=491 $(M+H)^+$.

Synthesis of Intermediate 4-2

Intermediate 4-2 (yield: 85%) was synthesized in the same manner as Intermediate 2-1 of Synthesis Example 1, except that 6-bromo-3-methyl-4-phenylpyridazine was used instead of 3-bromo-5-phenylpyridazine. The obtained compound was identified by LC-MS. LC-MS m/z=575 $(M+H)^+$.

Synthesis of Intermediate 4-1

1.1 g (1.9 mmol) of Intermediate 4-2 and 0.9 ml (4.2 mmol) of 5-methylfuran-2-boronic acid pinacole ester were mixed with 60 ml of dioxane and 12 ml of water, and 0.05 g (0.2 mmol) of $Pd(OAc)_2$, 0.15 g (0.4 mmol) of S-Phos, and 1.0 g (6.0 mmol) of $K_2CO_3$ were added thereto. The reaction mixture was then heated under reflux at a temperature of 110° C. for 18 hours. After the reaction was completed, the reaction mixture was concentrated under reduced pressure and dissolved in 50 ml of ethyl acetate to extract the organic layer. The extracted organic layer was dried by magnesium sulfate, distilled under reduced pressure, and purified by liquid chromatography to obtain 1.2 g (1.8 mmol, yield: 95%) of Intermediate 4-1. LC-MS m/z=667 $(M+H)^+$.

Synthesis of Compound 4

Compound 4 (yield: 55%) was synthesized in the same manner as Compound 2 of Synthesis Example 1, except that Intermediate 4-1 was used instead of Intermediate 2-1. The obtained compound was identified by LC-MS. LC-MS m/z=860 (M+H)+.

Synthesis Example 5 (Compound 5)

Compound 5 was synthesized according to the Reaction Scheme:

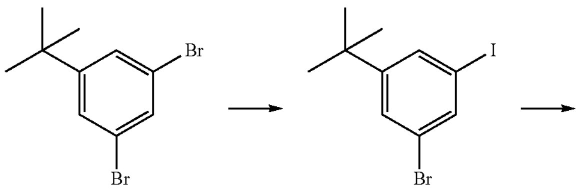

5-6

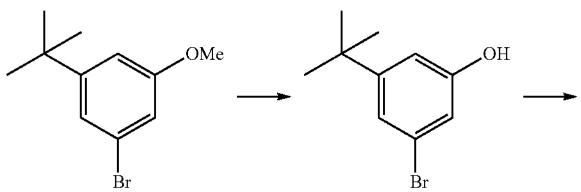

5-5 5-4

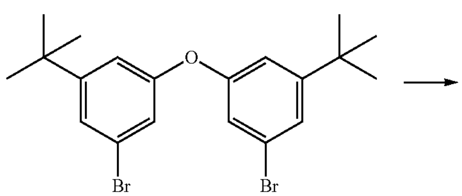

5-3

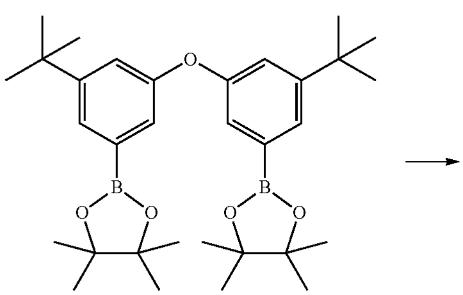

5-2

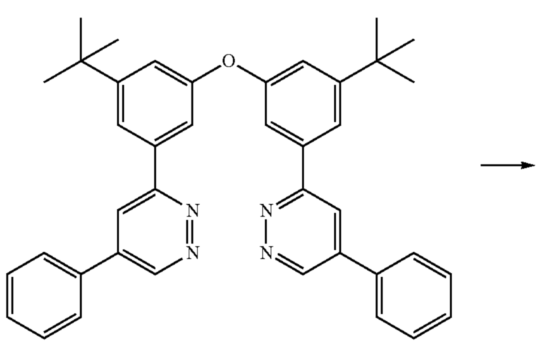

5-1

-continued

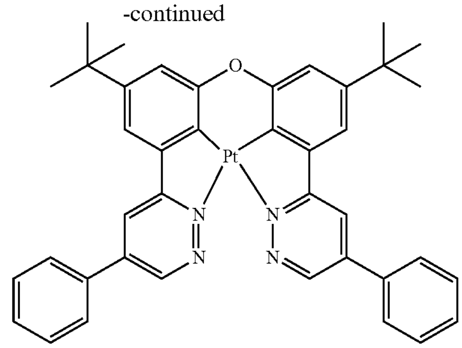

5

Synthesis of Intermediate 5-6

17.7 g (60.47 mmol) of 1,3-dibromo-5-(tert-butyl)benzene was mixed with 200 ml of diethyl ether, and n-BuLi (1.6 M in hexane) was slowly added thereto at a temperature of −78° C. After the reaction mixture was stirred at a temperature of −78° C. for 1 hour, 15 g (72.6 mmol) of iodine mixed with 20 ml of THF was slowly added by drops thereto. The reaction mixture was stirred at room temperature for 16 hours. After the reaction was completed, the organic layer was extracted by using ethyl acetate and a sodium thiosulfate aqueous solution, dried by using magnesium sulfate, distilled under reduced pressure, and purified by liquid chromatography to obtain 18 g (54.5 mmol, yield: 60%) of Intermediate 5-6. LC-MS m/z=291 $(M+H)^+$.

Synthesis of Intermediate 5-5

9.0 g (27.2 mmol) of Intermediate 5-6 and 150 ml of methyl alcohol were mixed, and 0.5 g (2.7 mmol) of CuI, 17.7 g (54.5 mmol) of $Cs_2CO_3$, and 1.3 g (5.5 mmol) of 4,7-dimethoxy-1,10-phenanthroline were added thereto. The reaction mixture was stirred in a seal-tube at 100° C. for 18 hours. After the reaction was completed, the reaction mixture was concentrated under reduced pressure, and the organic layer was extracted therefrom by using dichloromethane and water. The extracted organic layer was dried by using magnesium sulfate, distilled under reduced pressure, and purified by liquid chromatography to obtain 5 g (20.4 mmol, yield: 75%) of Intermediate 5-5. LC-MS m/z=244 $(M+H)^+$.

Synthesis of Intermediate 5-4

5.0 g (20.4 mmol) of Intermediate 5-5 and 200 ml of dichloromethane were mixed, and 100 ml (100.0 mmol) of $BBr_3$ (1.0 M solution in dichloromethane) was slowly added by drops thereto at a temperature of 0° C. The reaction mixture was stirred at room temperature for about 6 hours. After the reaction was completed, a saturated $NaHCO_3$ aqueous solution was added thereto to obtain the organic layer. The organic layer was dried by using magnesium sulfate, distilled under reduced pressure, and purified by liquid chromatography to obtain 4.5 g (19.5 mmol, yield: 96%) of Intermediate 5-4. LC-MS m/z=229 $(M+H)^+$.

Synthesis of Intermediate 5-3

4.5 g (19.5 mmol) of Intermediate 5-4 and 7.0 g (19.5 mmol) of Intermediate 5-6 were mixed with 100 ml of DMSO, and 0.4 g (2.0 mmol) of CuI, 0.5 g (4.0 mmol) of picolinic acid, and 8.3 g (39.0 mmol) of $K_3PO_4$ added thereto. The reaction mixture was heated at a temperature of 120° C. for 18 hours. After the reaction was completed, a saturated NaCl aqueous solution was added thereto to extract the organic layer. The extracted organic layer was dried by using magnesium sulfate, distilled under reduced pressure, and purified by liquid chromatography to obtain 5.5 g (12.7 mmol, yield: 65%) of Intermediate 5-3. LC-MS m/z=535 $(M+H)^+$.

Synthesis of Intermediate 5-2

Intermediate 5-2 (yield: 75%) was synthesized in the same manner as Intermediate 2-2 of Synthesis Example 1, except that Intermediate 5-3 was used instead of Intermediate 2-3. The obtained compound was identified by LC-MS. LC-MS m/z=534 $(M+H)^+$.

Synthesis of Intermediate 5-1

Intermediate 5-1 (yield: 80%) was synthesized in the same manner as Intermediate 2-1 of Synthesis Example 1, except that Intermediate 5-2 was used instead of Intermediate 2-2. The obtained compound was identified by LC-MS. LC-MS m/z=591 $(M+H)^+$.

Synthesis of Compound 5

Compound 5 (yield: 55%) was synthesized in the same manner as Compound 2 of Synthesis Example 1, except that Intermediate 5-1 was used instead of Intermediate 2-1. The obtained compound was identified by LC-MS. LC-MS m/z=784 $(M+H)^+$.

Synthesis Example 6 (Compound 6)

Compound 6 was synthesized according to Reaction Scheme:

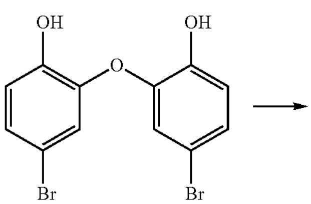

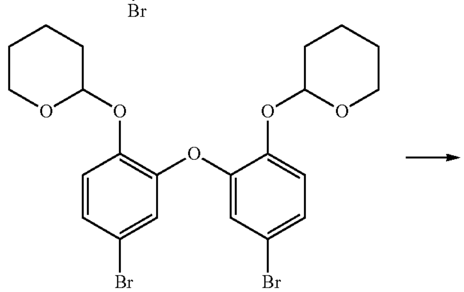

6-6

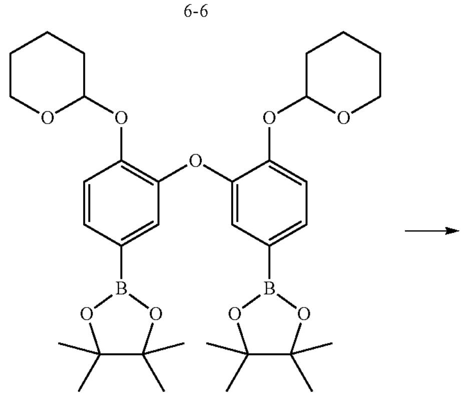

6-5

-continued

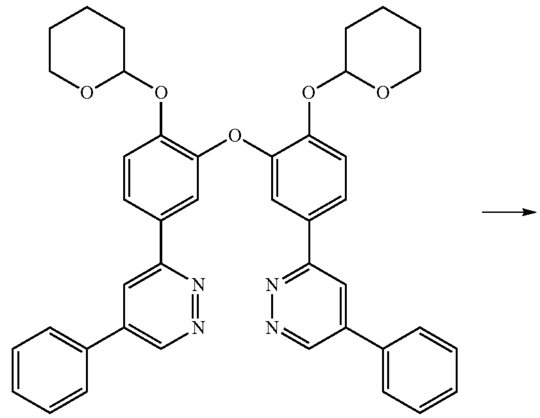

6-4

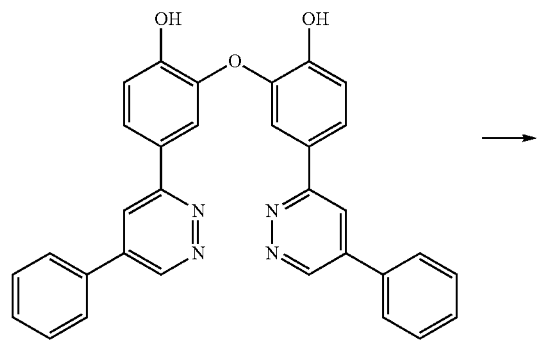

6-3

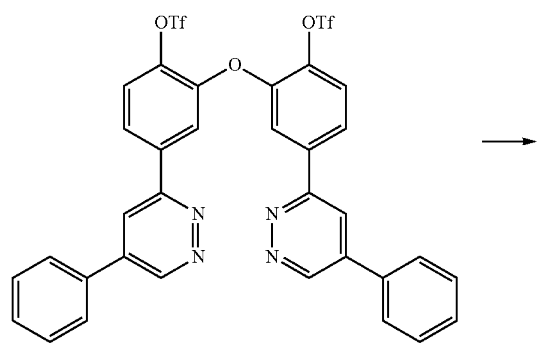

6-2

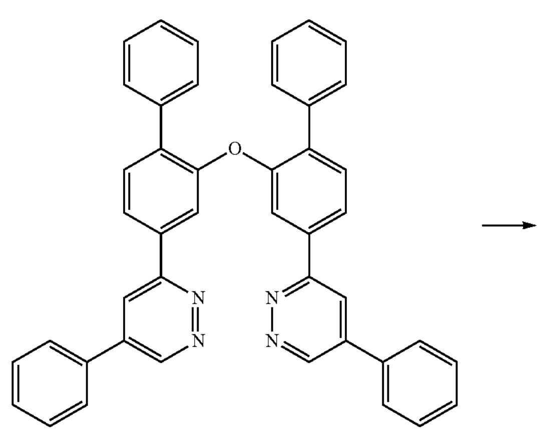

6-1

-continued

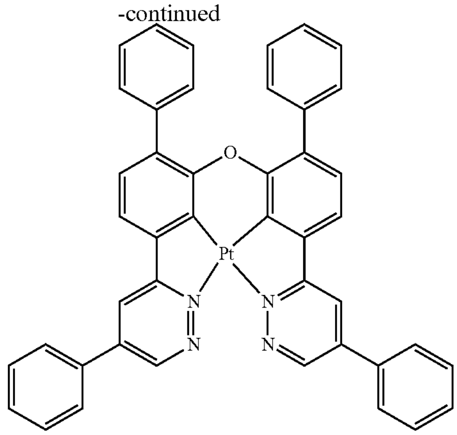

6

Synthesis of Intermediate 6-6

8.0 g (22.2 mmol) of 2,2'-oxybis(4-bromophenol) and 120 ml of dichloromethane were mixed, and 6.0 ml (66.6 mmol) of 3,4-dihydro-2H-pyran and 0.2 g (0.8 mmol) of pyridinium p-toluenesulfonate were added thereto. The reaction mixture was stirred at a temperature of 35° C. for about 18 hours. After the reaction was completed, a saturated $NaHCO_3$ aqueous solution was added thereto to extract the organic layer. The extracted organic layer was dried by using magnesium sulfate, distilled under reduced pressure, and purified by liquid chromatography to obtain 8.9 g (17.0 mmol, yield: 75%) of Intermediate 6-6. LC-MS m/z=529 $(M+H)^+$.

Synthesis of Intermediate 6-5

Intermediate 6-5 (yield: 70%) was synthesized in the same manner as Intermediate 2-2 of Synthesis Example 1, except that Intermediate 6-6 was used instead of Intermediate 2-3. The obtained compound was identified by LC-MS. LC-MS m/z=527 $(M+H)^+$.

Synthesis of Intermediate 6-4

Intermediate 6-4 (yield: 75%) was synthesized in the same manner as Intermediate 2-1 of Synthesis Example 1, except that Intermediate 6-5 was used instead of Intermediate 2-2. The obtained compound was identified by LC-MS. LC-MS m/z=679 $(M+H)^+$.

Synthesis of Intermediate 6-3

5.7 g (8.4 mmol) of Intermediate 6-4 and 80 ml of dioxane were mixed, and 1.0 M HCl solution (in MeOH) was added thereto. Then, the reaction mixture was stirred for 18 hours. After the reaction was completed, a saturated $NaHCO_3$ aqueous solution was added thereto to extract the organic layer. The extracted organic layer was dried by using magnesium sulfate, distilled under reduced pressure, and purified by liquid chromatography to obtain 3.9 g (7.6 mmol, yield: 90%) of Intermediate 6-3. LC-MS m/z=511 $(M+H)^+$.

Synthesis of Intermediate 6-2

2.7 g (5.3 mmol) of Intermediate 6-3 and 120 ml of dichloromethane were mixed, and 4.5 ml (32.1 mmol) of trimethylamine was added thereto. 3.1 ml (19.0 mmol) of triflic anhydride was slowly added by drops to the reaction mixture at a temperature of 0° C. The reaction mixture was stirred at room temperature for 12 hours. After the reaction was completed, a saturated $NaHCO_3$ aqueous solution was added thereto to extract the organic layer. The organic layer was dried by using magnesium sulfate, distilled under reduced pressure, and purified by liquid chromatography to obtain 2.3 g (3.0 mmol, yield: 55%) of Intermediate 6-2. LC-MS m/z=775 $(M+H)^+$.

Synthesis of Intermediate 6-1

1.5 g (1.9 mmol) of Intermediate 6-2 and 0.5 ml (4.2 mmol) of phenylboronic acid were mixed with 50 ml of toluene, 10 ml of ethyl alcohol, and 10 ml of water, and 0.06 g (0.3 mmol) of $Pd(OAc)_2$, 0.3 g (0.6 mmol) of X-Phos, and 1.0 g (7.6 mmol) of $K_2CO_3$ were added thereto. The reaction mixture was heated under reflux at a temperature of 100° C. for 18 hours. After the reaction was completed, the reaction mixture was concentrated under reduced pressure and the organic layer was extracted therefrom by using dichloromethane and water. The result extracted therefrom was dried by using magnesium sulfate. The reaction mixture was distilled under reduced pressure and purified by liquid chromatography to obtain 0.7 g (1.2 mmol, yield: 65%) of Intermediate 6-1. LC-MS m/z=631 $(M+H)^+$.

Synthesis of Compound 6

Compound 6 (yield: 25%) was synthesized in the same manner as Compound 2 of Synthesis Example 1, except that Intermediate 6-1 was used instead of Intermediate 2-1. The obtained compound was identified by LC-MS. LC-MS m/z=824 $(M+H)^+$.

Synthesis Example 7 (Compound 7)

Compound 7 was synthesized according to the Reaction Scheme:

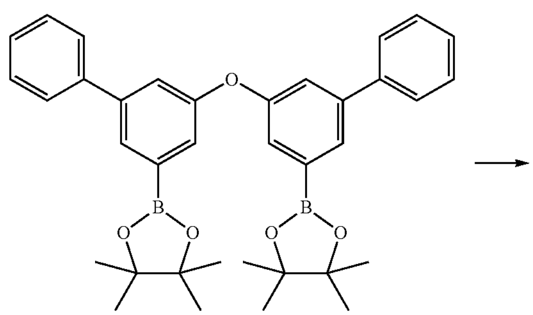

2-2

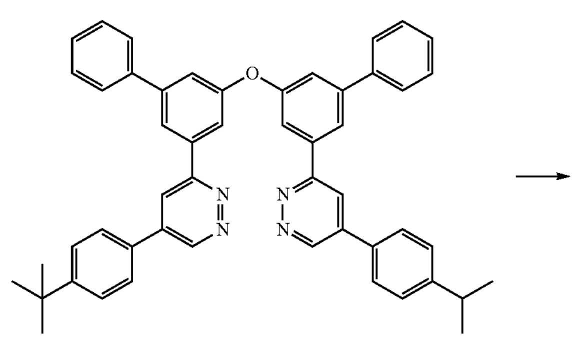

7-1

-continued

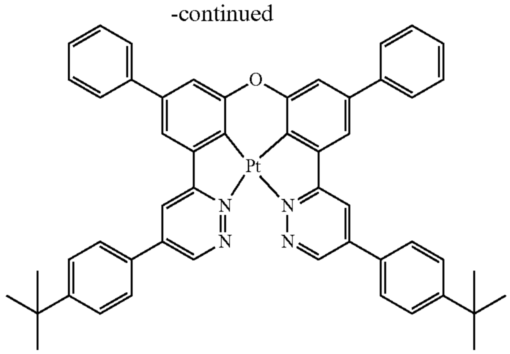

7

Synthesis of Intermediate 7-1

Intermediate 7-1 (yield: 70%) was synthesized in the same manner as Intermediate 2-1 of Synthesis Example 1, except that 3-bromo-5-(4-(tert-butyl)phenyl)pyridazine was used instead of 3-bromo-5-phenylpyridazine. The obtained compound was identified by LC-MS. LC-MS m/z=743 $(M+H)^+$.

Synthesis of Compound 7

Compound 7 (yield: 50%) was synthesized in the same manner as Compound 2 of Synthesis Example 1, except that Intermediate 7-1 was used instead of Intermediate 2-1. The obtained compound was identified by LC-MS. LC-MS m/z=936 $(M+H)^+$.

Synthesis Example 8 (Compound 8)

Compound 8 was synthesized according to the Reaction Scheme:

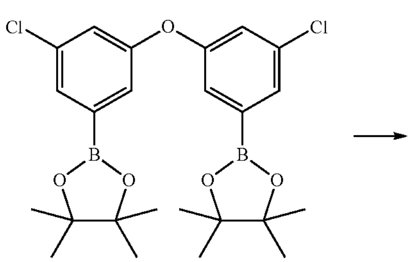

4-3

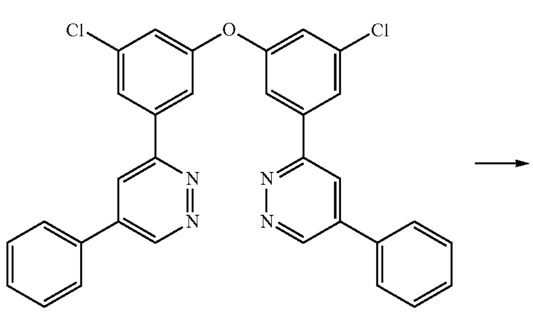

8-2

-continued

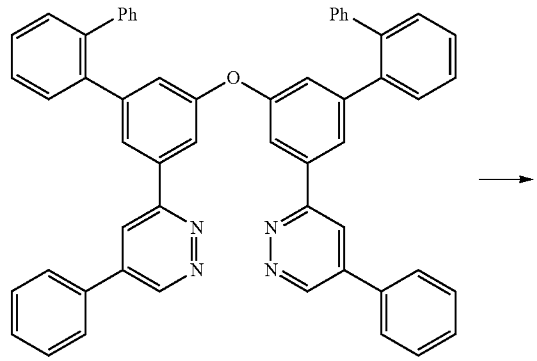

8-1

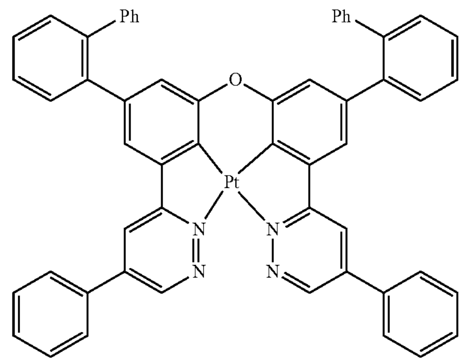

8

Synthesis of Intermediate 8-2

Intermediate 8-2 (yield: 80%) was synthesized in the same manner as Intermediate 4-2 of Synthesis Example 4, except that 3-bromo-5-phenylpyridazine was used instead of 6-bromo-3-methyl-4-phenylpyridazine. The obtained compound was identified by LC-MS. LC-MS m/z=547 $(M+H)^+$.

Synthesis of Intermediate 8-1

Intermediate 8-1 (yield: 65%) was synthesized in the same manner as Intermediate 4-1 of Synthesis Example 4, except that [1,1'-biphenyl]-2-ylboronic acid was used instead of 5-methylfuran-2-boronic acid pinacole ester. The obtained compound was identified by LC-MS. LC-MS m/z=783 (M+H)+.

Synthesis of Compound 8

Compound 8 (yield: 70%) was synthesized in the same manner as Compound 2 of Synthesis Example 1, except that Intermediate 8-1 was used instead of Intermediate 2-1. The obtained compound was identified by LC-MS. LC-MS m/z=976 $(M+H)^+$.

Synthesis Example 9 (Compound 9)

Compound 9 was synthesized according to the Reaction Scheme:

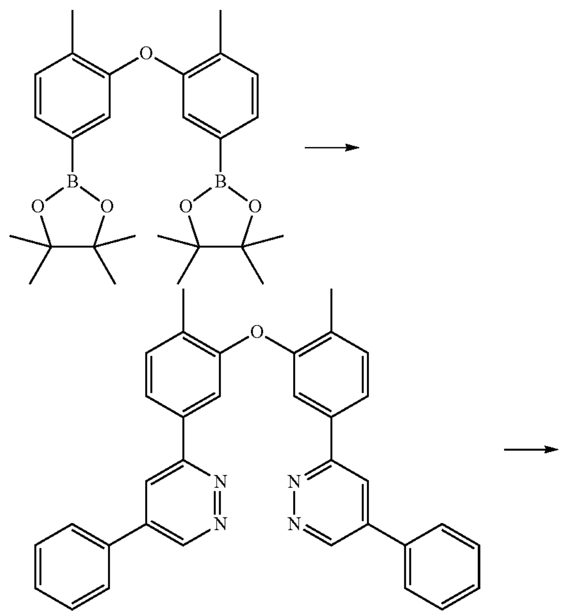

9-1

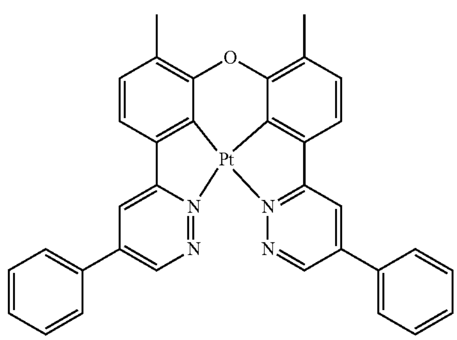

9

Synthesis of Intermediate 9-1

Intermediate 9-1 (yield: 55%) was synthesized in the same manner as Intermediate 2-1 of Synthesis Example 1, except that 2,2'-(oxybis(4-methyl-3,1-phenylene))bis(4,4,5,5-tetramethyl-1,3,2-dioxaborolane) was used instead of Intermediate 2-2. The obtained compound was identified by LC-MS. LC-MS m/z=541 $(M+H)^+$.

Synthesis of Compound 9

Compound 9 (yield: 15%) was synthesized in the same manner as Compound 2 of Synthesis Example 1, except that Intermediate 9-1 was used instead of Intermediate 2-1. The obtained compound was identified by LC-MS. LC-MS m/z=700 $(M+H)^+$.

Synthesis Example 10 (Compound 10)

Compound 10 was synthesized according to the Reaction Scheme:

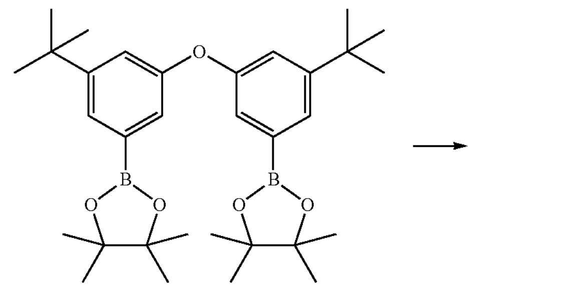

5-2

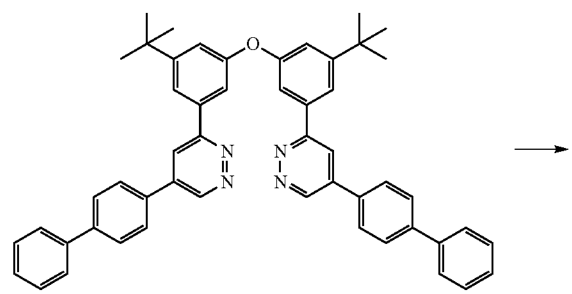

10-1

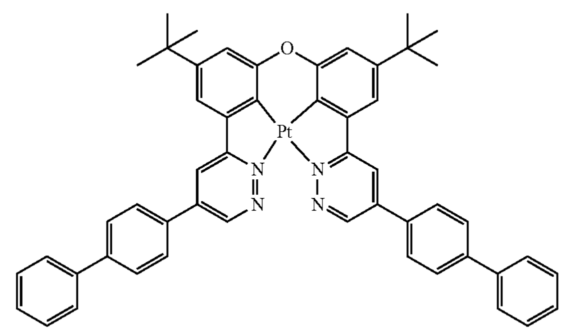

10

Synthesis of Intermediate 10-1

Intermediate 10-1 (yield: 70%) was synthesized in the same manner as Intermediate 5-1 of Synthesis Example 5, except that 5-([1,1'-biphenyl]-4-yl)-3-pyridazine was used instead of 3-bromo-5-phenylpyridazine. The obtained compound was identified by LC-MS. LC-MS m/z=743 (M+H)+.

Synthesis of Compound 10

Compound 10 (yield: 35%) was synthesized in the same manner as Compound 2 of Synthesis Example 1, except that Intermediate 10-1 was used instead of Intermediate 2-1. The obtained compound was identified by LC-MS. LC-MS m/z=936 (M+H)+.

Synthesis Example 11 (Compound 11)

Compound 11 was synthesized according to the Reaction Scheme:

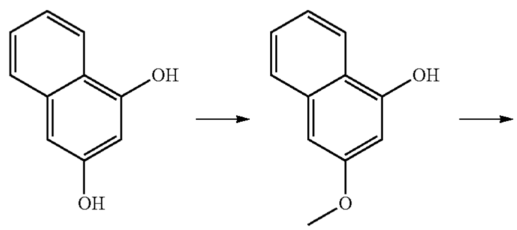

11-7

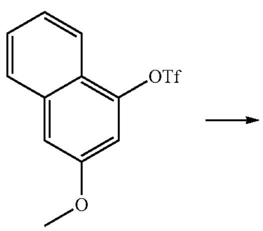

11-6

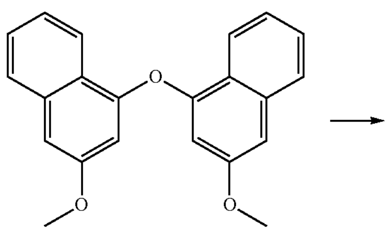

11-5

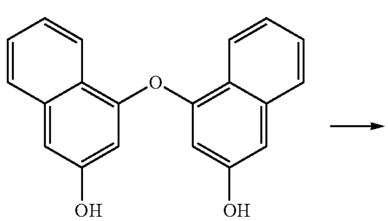

11-4

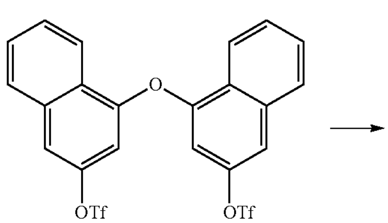

11-3

-continued

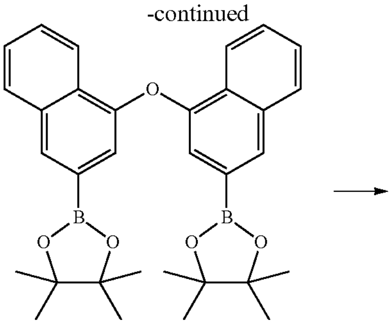

11-2

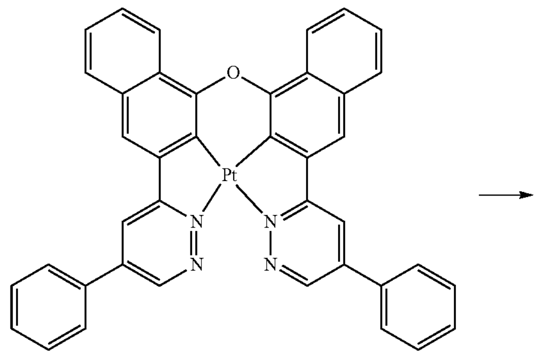

11-1

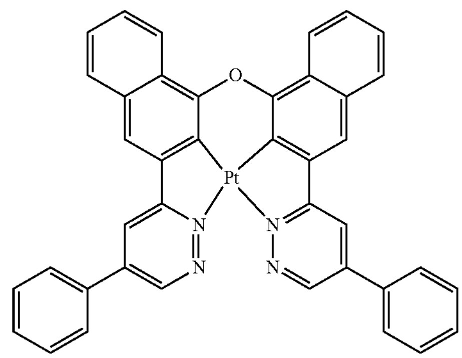

11-1

Synthesis of Intermediate 11-7

10.0 g (62.4 mmol) of naphthalene-1,3-diol and 120 ml of MeOH were mixed, and 4 ml of HCl was added thereto. The reaction mixture was heated under reflux at a temperature of 80° C. for 18 hours. After the reaction was completed, the reaction mixture was concentrated under reduced pressure, and the organic layer was extracted therefrom by using 60 ml of dichloromethane, 2-propanol, and a saturated $NaHCO_3$ aqueous solution. The extracted organic layer was dried by using magnesium sulfate, distilled under reduced pressure, and purified by liquid chromatography to obtain 9.2 g (53 mmol, yield: 85%) of Intermediate 11-7. LC-MS m/z=175 $(M+H)^+$.

Synthesis of Intermediate 11-6

4.6 g (26.5 mmol) of Intermediate 11-7 and 150 ml of dichloromethane were mixed, 6 ml (40.0 mmol) of trimethylamine was added thereto. 9 ml (53.0 mmol) of triflic anhydride was slowly added by drops to the reaction mixture at a temperature of 0° C. and stirred at room temperature for 12 hours. After the reaction was completed, a saturated $NaHCO_3$ aqueous solution was added thereto to extract the organic layer. The extracted organic layer was dried by using magnesium sulfate, distilled under reduced pressure, and purified by liquid chromatography to obtain 6.5 g (21.2 mmol, yield: 80%) of Intermediate 11-6. LC-MS m/z=307 (M+H)+.

Synthesis of Intermediate 11-5

Intermediate 11-5 (yield: 55%) was synthesized in the same manner as used to synthesize Intermediate 5-3 of Synthesis Example 5, except that Intermediate 11-6 and Intermediate 11-7 were used instead of Intermediate 5-4 and Intermediate 5-6, respectively. The obtained compound was identified by LC-MS. LC-MS m/z=331 (M+H)+.

Synthesis of Intermediate 11-4

3.3 g (10.0 mmol) of Intermediate 11-5 was dissolved in 150 ml of dichloromethane, and 60 ml (60.0 mmol) of $BBr_3$ (1.0 M solution in dichloromethane) was slowly added by drops thereto at a temperature of 0° C. The reaction mixture was stirred at room temperature for about 6 hours. After the reaction was completed, a saturated $NaHCO_3$ aqueous solution was added thereto to extract the organic layer. The extracted organic layer was dried by using magnesium sulfate, distilled under reduced pressure, and purified by liquid chromatography to obtain 2.9 g (9.5 mmol, yield: 95%) of Intermediate 11-4. LC-MS m/z=303 $(M+H)^+$.

Synthesis of Intermediate 11-3

Intermediate 11-3 (yield: 70%) was synthesized in the same manner as Intermediate 6-2 of Synthesis Example 6, except that Intermediate 11-4 was used instead of Intermediate 6-3. The obtained compound was identified by LC-MS. LC-MS m/z=567 $(M+H)^+$.

Synthesis of Intermediate 11-2

Intermediate 11-2 (yield: 70%) was synthesized in the same manner as Intermediate 2-2 of Synthesis Example 1, except that Intermediate 11-3 was used instead of Intermediate 2-3. The obtained compound was identified by LC-MS. LC-MS m/z=523 $(M+H)^+$.

Synthesis of Intermediate 11-1

Intermediate 11-1 (yield: 65%) was synthesized in the same manner as Intermediate 2-1 of Synthesis Example 1, except that Intermediate 11-2 was used instead of Intermediate 2-2. The obtained compound was identified by LC-MS. LC-MS m/z=772 $(M+H)^+$.

Synthesis of Compound 11

Compound 11 (yield: 20%) was synthesized in the same manner as Compound 2 of Synthesis Example 1, except that Intermediate 11-1 was used instead of Intermediate 2-1. The obtained compound was identified by LC-MS. LC-MS m/z=772 $(M+H)^+$.

Synthesis Example 12 (Compound 12)

Compound 12 was synthesized according to the Reaction Scheme:

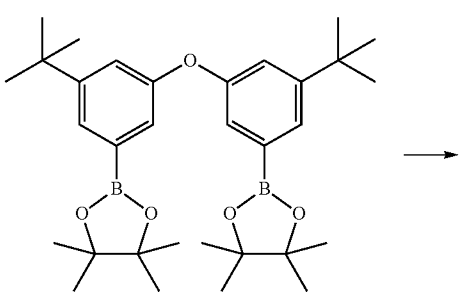

5-2

-continued

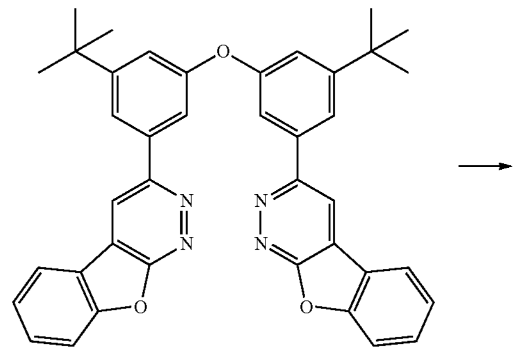

12-1

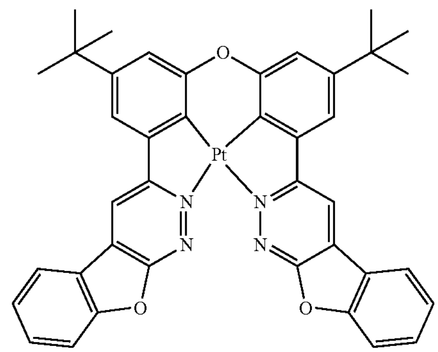

12

Synthesis of Intermediate 12-1

Intermediate 12-1 (yield: 85%) was synthesized in the same manner as Intermediate 5-1 of Synthesis Example 5, except that 3-chlorobenzofuro[2,3-c]pyridazine was used instead of 3-bromo-5-phenylpyridazine. The obtained compound was identified by LC-MS. LC-MS m/z=619 (M+H)+.

Synthesis of Compound 12

Compound 12 (yield: 45%) was synthesized in the same manner as Compound 5 of Synthesis Example 5, except that Intermediate 12-1 was used instead of Intermediate 5-1. The obtained compound was identified by LC-MS. LC-MS m/z=812 (M+H)+.

Synthesis Example 13 (Compound 13)

Compound 13 was synthesized according to the Reaction Scheme:

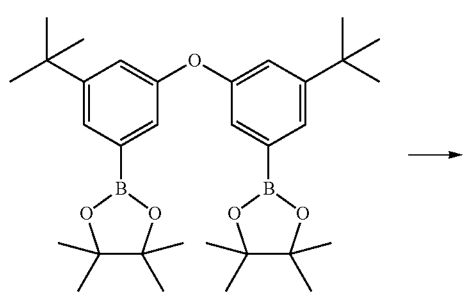

5-2

-continued

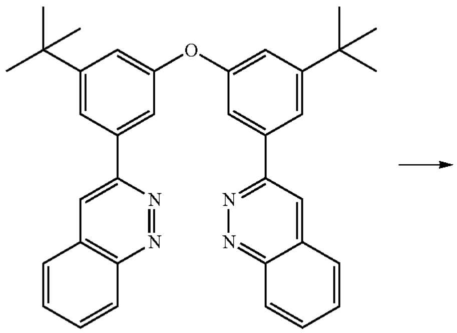

13-1

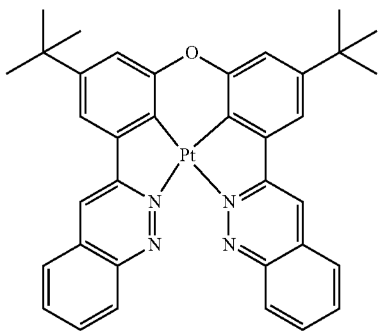

13

Synthesis of Intermediate 13-1

Intermediate 13-1 (yield: 60%) was synthesized in the same manner as Intermediate 5-1 of Synthesis Example 5, except that 3-bromocinnoline was used instead of 3-bromo-5-phenylpyridazine. The obtained compound was identified by LC-MS. LC-MS m/z=539 $(M+H)^+$.

Synthesis of Compound 13

Compound 13 (yield: 40%) was synthesized in the same manner as Compound 5 of Synthesis Example 5, except that Intermediate 13-1 was used instead of Intermediate 5-1. The obtained compound was identified by LC-MS. LC-MS m/z=732 $(M+H)^+$.

Synthesis Example 14 (Compound 14)

Compound 14 was synthesized according to the Reaction Scheme:

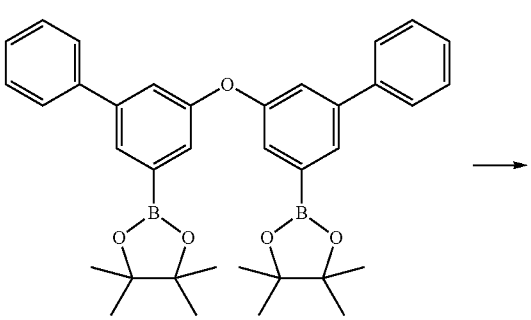

2-2

-continued

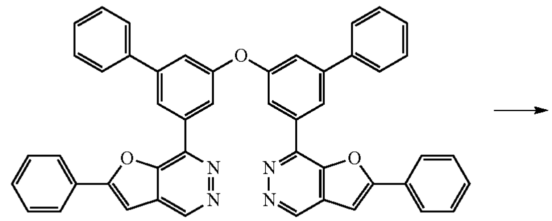

14-1

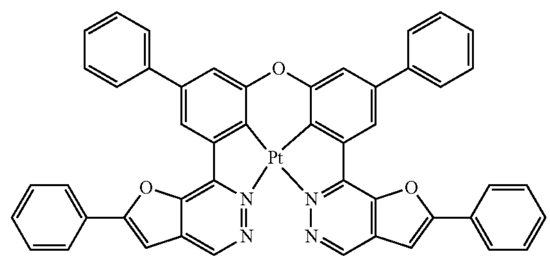

14

Synthesis of Intermediate 14-1

Intermediate 14-1 (yield: 85%) was synthesized in the same manner as Intermediate 2-1 of Synthesis Example 1, except that 7-chloro-2-phenylfuro[2,3-d]pyridazine was used instead of 3-bromo-5-phenylpyridazine. The obtained compound was identified by LC-MS. LC-MS m/z=711 $(M+H)^+$.

Synthesis of Compound 14

Compound 14 (yield: 40%) was synthesized in the same manner as Compound 2 of Synthesis Example 1, except that Intermediate 14-1 was used instead of Intermediate 2-1. The obtained compound was identified by LC-MS. LC-MS m/z=904 $(M+H)^+$.

Synthesis Example 15 (Compound 15)

Compound 15 was synthesized according to the Reaction Scheme:

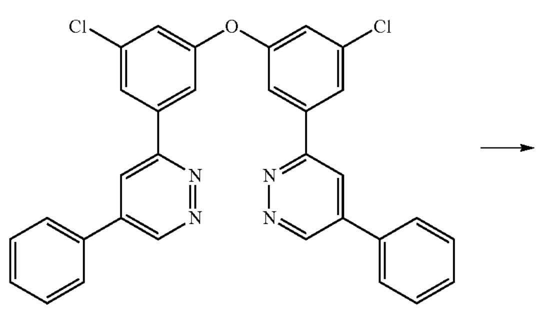

8-2

-continued

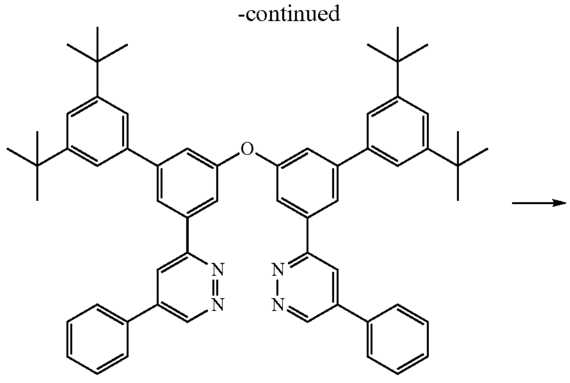

16-1

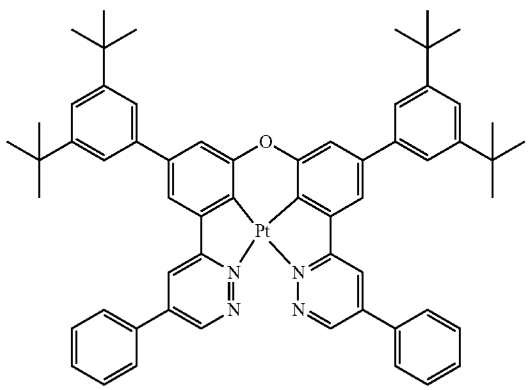

15

-continued

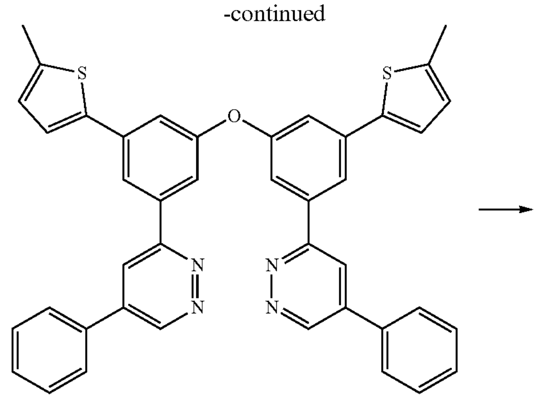

16-1

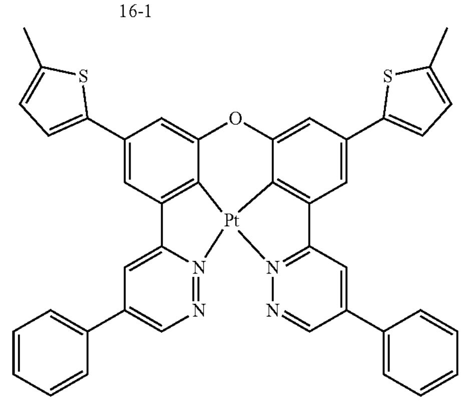

16

Synthesis of Intermediate 15-1

Intermediate 15-1 (yield: 85%) was synthesized in the same manner as Intermediate 8-1 of Synthesis Example 8, except that (3,5-di-tert-butylphenyl)boronic acid was used instead of [1,1'-biphenyl]-2-ylboronic acid. The obtained compound was identified by LC-MS. LC-MS m/z=855 (M+H)+.

Synthesis of Compound 15

Compound 15 (yield: 33%) was synthesized in the same manner as Compound 2 of Synthesis Example 1, except that Intermediate 15-1 was used instead of Intermediate 2-1. The obtained compound was identified by LC-MS. LC-MS m/z=1048 (M+H)+.

Synthesis Example 16 (Compound 16)

Compound 16 was synthesized according to the Reaction Scheme:

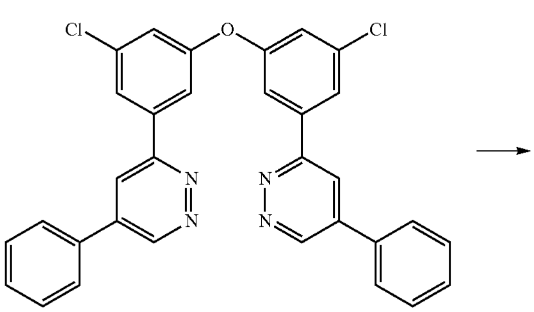

8-2

Synthesis of Intermediate 16-1

Intermediate 16-1 (yield: 85%) was synthesized in the same manner as Intermediate 8-1 of Synthesis Example 8, except that 4,4,5,5-tetramethyl-2-(5-methylthiophen-2-yl)-1,3,2-dioxaborolane was used instead of [1,1'-biphenyl]-2-ylboronic acid. The obtained compound was identified by LC-MS. LC-MS m/z=671 (M+H)+.

Synthesis of Compound 16

Compound 16 (yield: 20%) was synthesized in the same manner as Compound 2 of Synthesis Example 1, except that Intermediate 16-1 was used instead of Intermediate 2-1. The obtained compound was identified by LC-MS. LC-MS m/z=864 (M+H)+.

Evaluation Example 1: Evaluation of Photoluminescence Quantum Yields (PLQY) and Radiative Decay Rate CBP and Compound 1 were co-deposited at a weight ratio of 9:1 at the degree of vacuum of $10^{-7}$ torr to form a film having a thickness of 40 nanometers (nm).

Luminescence quantum yields (PLQY) in film was evaluated by using a Hamamatsu Photonics absolute PL quantum yield measurement system equipped with a xenon light source, a monochromator, a photonic multichannel analyzer, and an integrating sphere and employing PLQY measurement software (Hamamatsu Photonics, Ltd., Shizuoka, Japan). The PLQY in film of Compound 1 was confirmed, and results thereof are shown in Table 2.

Then, the PL spectrum of the film was evaluated at room temperature by using a time-resolved photoluminescence (TRPL) measurement system Fluo Time 300 (manufactured by PicoQuant) and a pumping source PLS340 (excitation wavelength=340 nm, spectral width=20 nm) (manufactured by PicoQuant), a wavelength of main peak of the spectrum was determined, and the number of photons emitted from the film at the wavelength of the main peak by a photon pulse (pulse width=500 picoseconds, ps) applied to the film by PLS340 was measured over time based on Time-Correlated Single Photon Counting (TCSPC). By repeating the above processes, a sufficiently fittable TRPL curve was obtained. Then, a decay time $T_{decay}(E_x)$ of the film was obtained by fitting at least one exponential decay function to a result obtained from the TRPL curve, and a radiative decay rate corresponding to a reciprocal of the decay time was calculated. Results thereof are shown in Table 2. A function represented by Equation 1 was used for the fitting, and a greatest value among $T_{decay}$ obtained from the exponential decay function used for the fitting was taken as $T_{decay}(Ex)$. At this time, the same measurement was performed once more for the same measurement as that for calculating the TRPL curve in a dark state (a state in which the pumping signal input to the certain film was blocked) to obtain a baseline or background signal curve. The baseline or background signal curve was used as a baseline for fitting.

Equation 20 □=□=I□□□□□□−□/□□□□□□, □

Results obtained by performing PLQY and radiative decay rate measurement on Compounds 2, 3, 4, 5, 8, 10, A, B, and C are shown in Table 2.

TABLE 2

| Compound No. | PLQY (%) | Radiative decay rate ($s^{-1}$) |
|---|---|---|
| 1 | 97 | $3.28 \times 10^5$ |
| 2 | 95 | $3.66 \times 10^5$ |
| 3 | 98 | $3.46 \times 10^5$ |
| 4 | 92 | $3.00 \times 10^5$ |
| 5 | 99 | $3.43 \times 10^5$ |
| 8 | 99 | $3.50 \times 10^5$ |
| 10 | 99 | $3.50 \times 10^5$ |
| A | 70 | $1.09 \times 10^5$ |
| B | 80 | $1.78 \times 10^5$ |
| C | 73 | $2.00 \times 10^5$ |

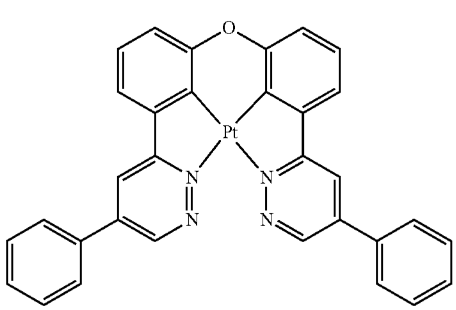

1

-continued

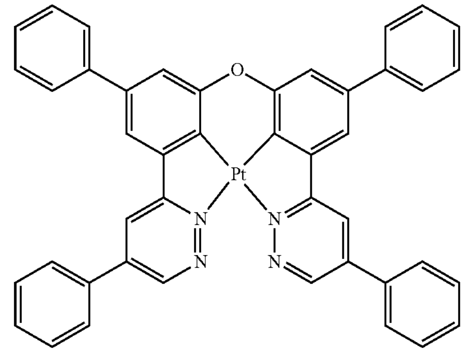

2

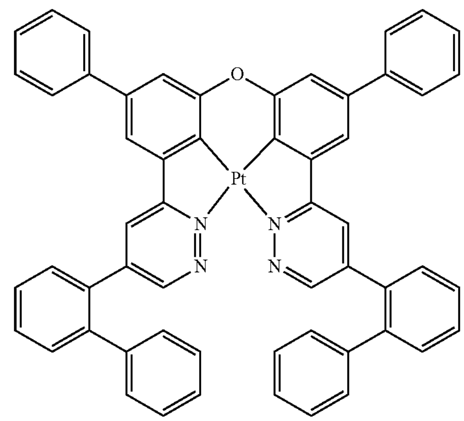

3

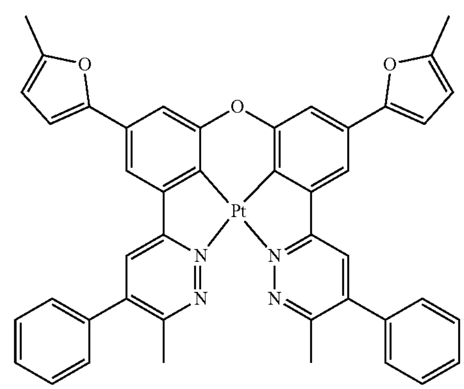

4

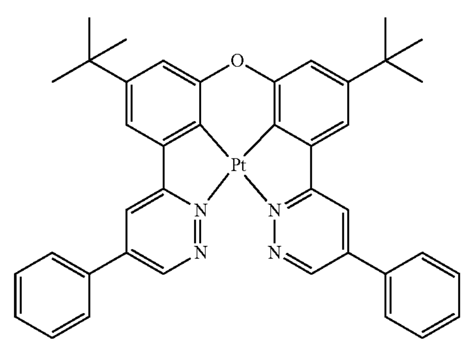

5

-continued

8

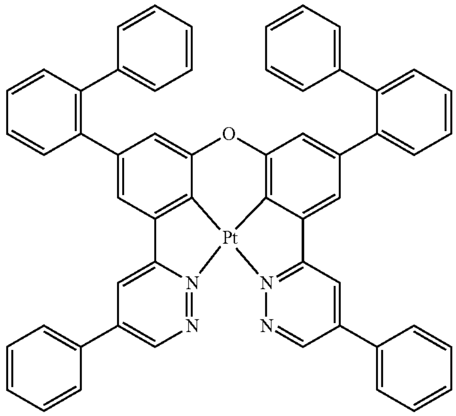

10

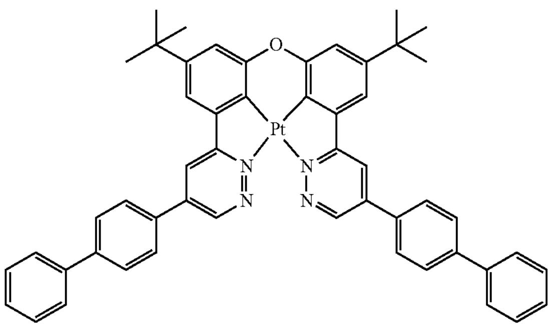

A

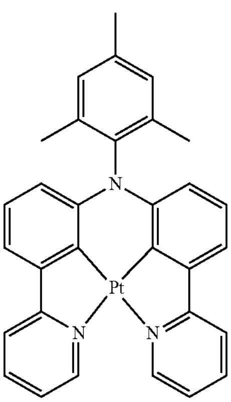

B

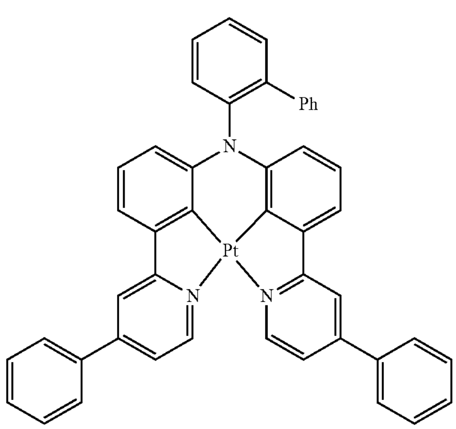

-continued

C

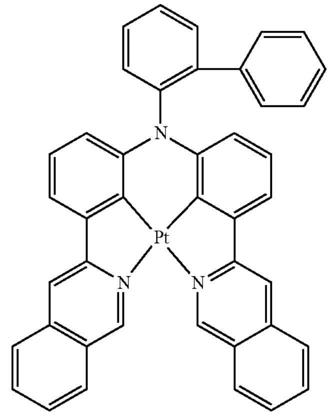

Referring to Table 2, it is confirmed that Compounds 1, 2, 3, 4, 5, 8, and 10 have a higher PLQY and a higher radiative decay rate, as compared with Compounds A, B, and C.

Evaluation Example 2: Evaluation of Maximum Emission Wavelength and FWHM

Compound 1 was diluted in toluene at a concentration of 10 millimolar (mM), and a photoluminescence (PL) spectrum was measured at room temperature by using ISC PC1 Spectrofluorometer equipped with a xenon lamp. A maximum emission wavelength and FWHM of Compound 1 was evaluated from the PL spectrum. This process was repeated on Compounds 2, 3, 4, 5, 8, 10, A, B, and C, and results thereof are shown in Table 3. The term "maximum emission wavelength" as used herein refers to a wavelength at which the emission intensity is maximum.

TABLE 3

| Compound No. | $\lambda_{max}$ (nm) | FWHM (nm) |
|---|---|---|
| 1 | 610 | 64 |
| 2 | 625 | 55 |
| 3 | 618 | 64 |
| 4 | 626 | 57 |
| 5 | 624 | 63 |
| 8 | 622 | 55 |
| 10 | 627 | 57 |
| A | 615 | 72 |
| B | 631 | 75 |
| C | 577 | 85 |

Referring to Table 3, it is confirmed that Compounds 1, 2, 3, 4, 5, 8, and 10 have a small FWHM, as compared with Compounds A, B, and C.

Example 1

A glass substrate, on which ITO/Ag/ITO (70 Å/1,000 Å/70 Å) were deposited as an anode, was cut to a size of 50 mm×50 mm×0.5 mm (mm=millimeter), sonicated with isopropyl alcohol and pure water each for 5 minutes, and then cleaned by exposure to ultraviolet rays and ozone for 30 minutes. Then, the glass substrate was provided to a vacuum deposition apparatus.

2-TNATA was vacuum-deposited on the anode of the glass substrate to form a hole injection layer having a thickness of 600 Å, and 4,4'-bis[N-(1-naphthyl)-N-phenylamino]biphenyl (NPB) was vacuum-deposited on the hole injection layer to form a hole transport layer having a thickness of 1,350 Å.

CBP (host) and Compound 1 (dopant) were co-deposited on the hole transport layer at a weight ratio of 94:6 to form an emission layer having a thickness of 400 Å.

Then, BCP was vacuum-deposited on the emission layer to form a hole blocking layer having a thickness of 50 Å, $Alq_3$ was vacuum-deposited on the hole blocking layer to form an electron transport layer having a thickness of 350 Å, LiF was deposited on the electron transport layer to form an electron injection layer having a thickness of 10 Å, and Mg and Ag were deposited on the electron injection layer at a weight ratio of 90:10 to form a cathode having a thickness of 120 Å, thereby completing the manufacture of an organic light-emitting device (emitting red light) having a structure of anode/2-TNATA (600 Å)/NPB (1,350 Å)/CBP+Compound 1 (6 weight %) (400 Å)/BCP(50 Å)/$Alq_3$ (350 Å)/LiF (10 Å)/MgAg (120 Å).

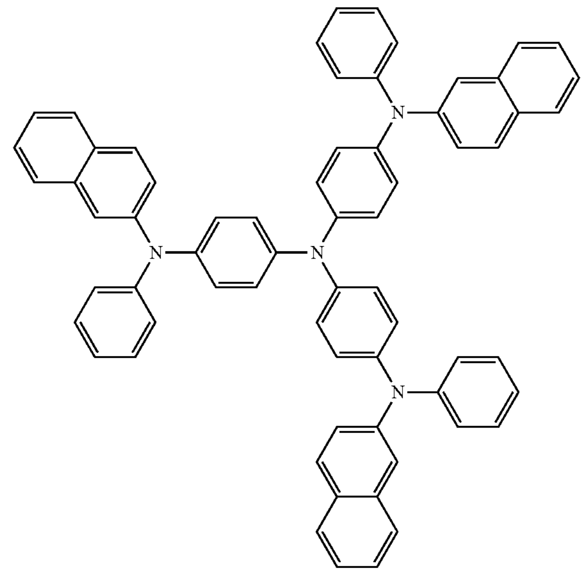

2-TNATA

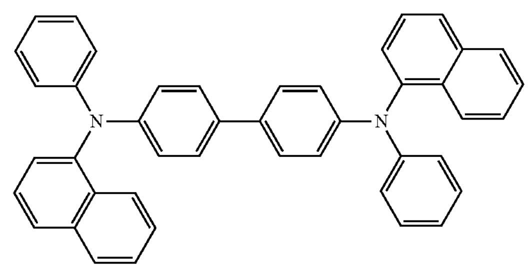

NPB

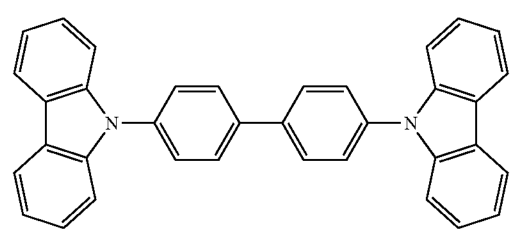

CBP

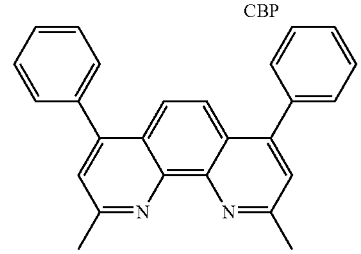

BCP

-continued

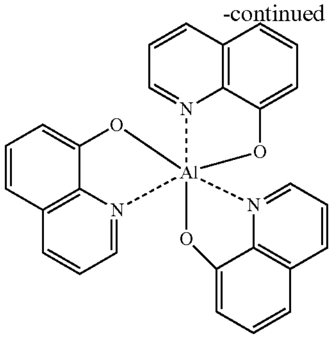

Alq3

Examples 2 to 6 and Comparative Examples A to C

Organic light-emitting devices were manufactured in the same manner as in Example 1, except that Compounds shown in Table 4 were each used instead of Compound 1 as a dopant in forming an emission layer.

Evaluation Example 3: Evaluation of Characteristics of Organic Light-Emitting Devices The driving voltage, current density, maximum quantum emission efficiency, roll-off ratio, FWHM, and lifespan of the organic light-emitting devices manufactured according to Examples 1 to 6 and Comparative Examples A to C were evaluated by using a current-voltage meter (Keithley 2400) and a luminance meter (Minolta Cs-1000A), and results thereof are shown in Tables 4 and 5. The roll-off ratio was calculated by using Equation 30. The lifespan (LT99, at 3500 nit) indicates an amount of time that lapsed when luminance was 99% of initial luminance (100%).

Roll off ratio={1−(Efficiency (at 3500 nit)/Maximum Emission Efficiency)}×100% Equation 30

TABLE 4

| | Dopant compound No. | Driving voltage (V) | Current density ($mA/cm^2$) | Maximum quantum emission efficiency (%) | Roll-off ratio (%) | FWHM (nm) |
|---|---|---|---|---|---|---|
| Example 1 | 1 | 4.5 | 10 | 18 | 10 | 56 |
| Example 2 | 2 | 4.2 | 10 | 19 | 9 | 51 |
| Example 3 | 5 | 4.3 | 10 | 21 | 9 | 48 |
| Example 4 | 8 | 4.2 | 10 | 22 | 10 | 51 |
| Example 5 | 10 | 4.2 | 10 | 23 | 10 | 52 |
| Example 6 | 12 | 4.4 | 10 | 21 | 10 | 66 |
| Comparative Example A | A | 5.8 | 10 | 15 | 30 | 75 |
| Comparative Example B | B | 5.7 | 10 | 17 | 38 | 72 |
| Comparative Example C | C | 5.2 | 10 | 18 | 22 | 98 |

TABLE 5

| | Dopant compound No. | Emission color | Lifespan ($LT_{99}$) (at 3500 nit) (hr) |
|---|---|---|---|
| Example 1 | 1 | Red | 250 |
| Example 2 | 2 | Red | 350 |
| Example 3 | 5 | Red | 350 |
| Example 4 | 8 | Red | 450 |
| Example 5 | 10 | Red | 450 |
| Example 6 | 12 | Red | 300 |
| Comparative Example A | A | Red | 150 |
| Comparative Example B | B | Red | 100 |
| Comparative Example C | C | Orange | 100 |

1

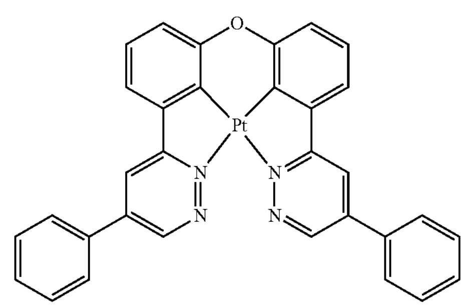

2

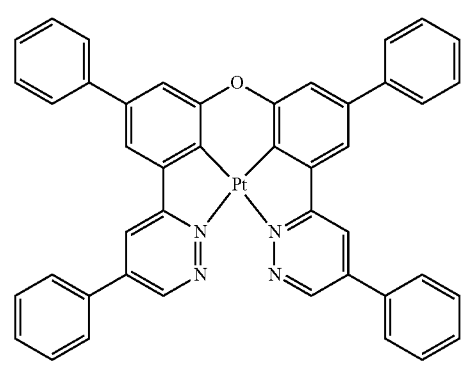

-continued

5

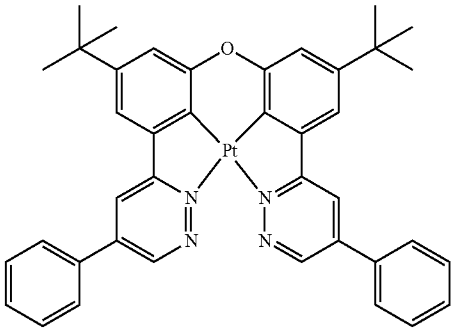

8

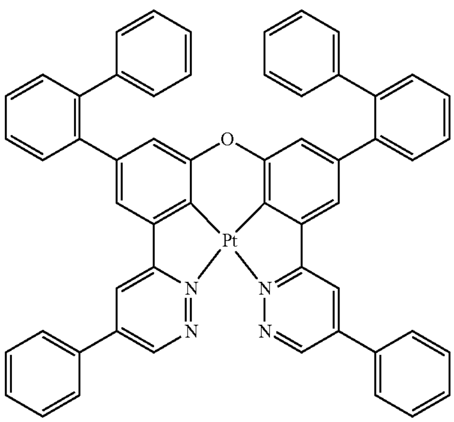

10

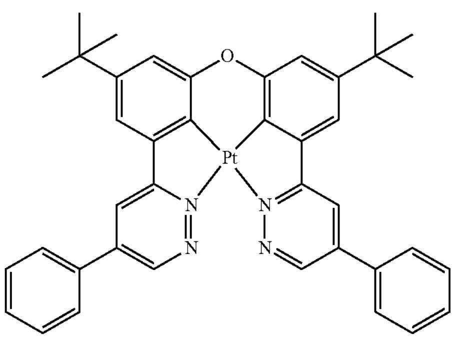

12

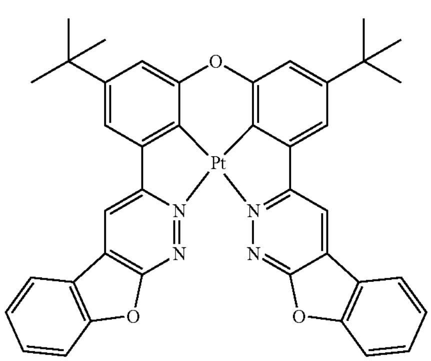

-continued

A

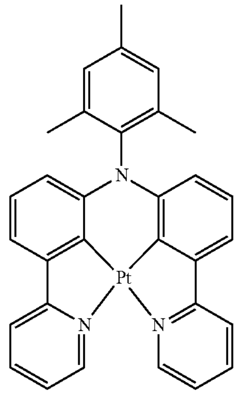

B

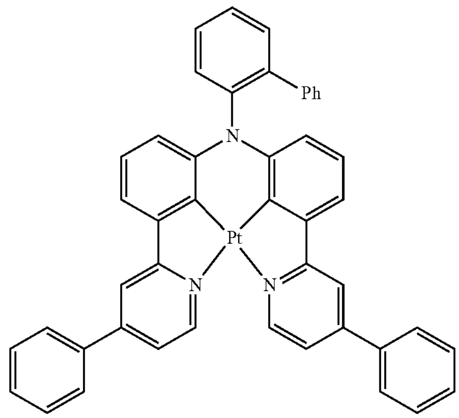

C

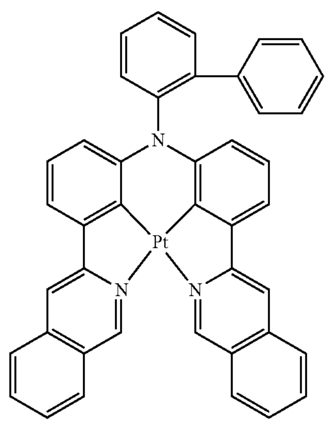

Referring to Tables 4 and 5, it is confirmed that the organic light-emitting devices of Examples 1 to 6 have improved driving voltage, maximum quantum emission efficiency, roll-off ratio, and lifespan characteristics and a reduced FWHM, as compared with those of the organic light-emitting devices of Comparative Examples A to C.

Since the organometallic compound emits light having a relatively small FWHM and has high PLQY and a high radiative decay rate, an organic light-emitting device including the organometallic compound may have improved driving voltage, maximum quantum emission efficiency, roll-off ratio, and lifespan characteristics. In addition, since the organometallic compound has excellent phosphorescence characteristics, a diagnostic composition including the organometallic compound may have high diagnostic efficiency.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present description as defined by the following claims.

What is claimed is:

1. An organic light-emitting device comprising:

a first electrode, a second electrode; and an organic layer disposed between the first electrode and the second electrode, wherein the organic layer comprises an emission layer, and where the organic layer further comprises at least one organometallic compound represented by Formula 1A(1):

Formula 1A(1)

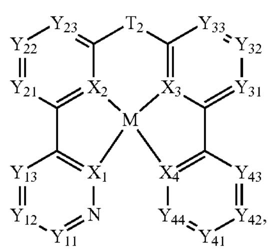

wherein, in Formula 1A(1),

M is beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au), $X_1$ and $X_4$ are each N, $X_2$ and $X_3$ are each C, a bond between $X_1$ and M is a coordinate bond, a bond between $X_2$ and M is a covalent bond, a bond between $X_3$ and M is a covalent bond, and a bond between $X_4$ and M is a coordinate bond, $Y_{11}$ is $C(Z_{11})$, $Y_{12}$ is $C(Z_{12})$, $Y_{13}$ is $C(Z_{13})$, $Y_{21}$ is $C(Z_{21})$, $Y_{22}$ is $C(Z_{22})$, $Y_{23}$ is $C(Z_{23})$, $Y_{31}$ is $C(Z_{31})$, $Y_{32}$ is $C(Z_{32})$, $Y_{33}$ is $C(Z_{33})$, $Y_{41}$ is $C(Z_{41})$, $Y_{42}$ is $C(Z_{42})$, $Y_{43}$ is $C(Z_{43})$, and $Y_{44}$ is N, $T_2$ is a double bond, *—N($R_5$)—*', *—B($R_5$)—*', *—P($R_5$)—*', *—Si($R_5$)($R_6$)—*', *—Ge($R_5$)($R_6$)—*', *—S—*', *—Se—*', *—O—*', *—C(═O)—*', *—S(═O)—*', or *—S(═O)$_2$—*', $Z_{11}$ to $Z_{13}$, $Z_{21}$ to $Z_{23}$, $Z_{31}$ to $Z_{33}$, $Z_{41}$ to $Z_{43}$, $R_5$, and $R_6$ are each independently selected from hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ aryl alkyl group, a substituted or unsubstituted $C_1$-$C_{60}$ heteroaryl group, a substituted or unsubstituted $C_1$-$C_{00}$ heteroaryloxy group, a substituted or unsubstituted $C_1$-$C_{60}$ heteroarylthio group, a substituted or unsubstituted $C_2$-$C_{60}$ heteroaryl alkyl group, a substituted or unsubstituted $C_2$-$C_{60}$ alkyl heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(═O)($Q_8$)($Q_9$), provided that, at least one of $Z_1$ to $Z_{13}$, $Z_{21}$ to $Z_{23}$, $Z_{31}$ to $Z_{33}$, and $Z_{41}$ to $Z_{43}$ is a substituted or unsubstituted $C_6$-$C_{60}$ aryl group, a substituted or unsubstituted $C_3$-$C_{60}$ heteroaryl group, or a combination thereof, at least two of $Z_1$ to $Z_{13}$ are optionally linked to form a $C_5$-$C_{30}$ carbocyclic group which is unsubstituted or substituted with at least one $R_{10a}$ or a $C_1$-$C_{30}$ heterocyclic group which is unsubstituted or substituted with at least one $R_{10a}$, at least two of $Z_{21}$ to $Z_{23}$ are optionally linked to form a $C_5$-$C_{30}$ carbocyclic group which is unsubstituted or substituted with at least one $R_{10a}$ or a $C_1$-$C_{30}$ heterocyclic group which is unsubstituted or substituted with at least one $R_{10a}$, at least two of $Z_{31}$ to $Z_{33}$ are optionally linked to form a $C_5$-$C_{30}$ carbocyclic group which is unsubstituted or substituted with at least one $R_{10a}$ or a $C_1$-$C_{30}$ heterocyclic group which is unsubstituted or substituted with at least one $R_{10a}$, at least two of $Z_{41}$ to $Z_{44}$ are optionally linked to form a $C_5$-$C_{30}$ carbocyclic group which is unsubstituted or substituted with at least one $R_{10a}$ or a $C_1$-$C_{30}$ heterocyclic group which is unsubstituted or substituted with at least one $R_{10a}$, and two of $R_5$, $R_6$, $Z_{11}$ to $Z_{13}$, $Z_{21}$ to $Z_{23}$, $Z_{31}$ to $Z_{33}$, and $Z_{41}$ to $Z_{43}$ are optionally linked to form a $C_5$-$C_{30}$ carbocyclic group which is unsubstituted or substituted with at least one $R_{10a}$ or a $C_1$-$C_{30}$ heterocyclic group which is unsubstituted or substituted with at least one $R_{10a}$, $R_{10a}$ is the same as described in connection with Zn,

* and *' each indicate a binding site to a neighboring atom, at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_6$-$C_{60}$ aryloxy group, the substituted $C_6$-$C_{60}$ arylthio group, the substituted $C_7$-$C_{60}$ aryl alkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroaryl alkyl group, the substituted $C_2$-$C_{60}$ alkyl heteroaryl group, the substituted monovalent non-aromatic condensed polycyclic group, and the substituted monovalent non-aromatic condensed heteropolycyclic group is selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroaryl alkyl group, a $C_2$-$C_{60}$ alkyl heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), and —P(═O)($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroaryl alkyl group, a $C_2$-$C_{60}$ alkyl heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroaryl alkyl group, a $C_2$-$C_{60}$ alkyl heteroaryl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroaryl alkyl group, a $C_2$-$C_{60}$ alkyl heteroaryl group, a monovalent non-aromatic condensed polycyclic group, a monovalent non-aromatic condensed heteropoly cyclic group, —N($Q_{21}$)($Q_{22}$), —Si($Q_{23}$)($Q_{24}$)($Q_{25}$), —B($Q_{26}$)($Q_{27}$), and —P(═O)($Q_{28}$)($Q_{29}$); and —N($Q_{31}$)($Q_{32}$), —Si($Q_{33}$)($Q_{34}$)($Q_{35}$), —B($Q_{36}$)($Q_{37}$), and —P(═O)($Q_{38}$)($Q_{39}$), and $Q_1$ to $Q_9$, $Q_{11}$ to $Q_{19}$, $Q_{21}$ to $Q_{29}$, and $Q_{31}$ to $Q_{39}$ are each independently selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_7$-$C_{60}$ alkylaryl group, a $C_1$-$C_{60}$ alkyl group, and a $C_6$-$C_{60}$ aryl group, a $C_6$-$C_{60}$ aryloxy group, a $C_6$-$C_{60}$ arylthio group, a $C_7$-$C_{60}$ aryl alkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroaryl alkyl group, a $C_2$-$C_{60}$ alkyl heteroaryl group, a monovalent non-aromatic condensed polycyclic group, and a monovalent non-aromatic condensed heteropolycyclic group.

2. The organic light-emitting device of claim 1, wherein M is Pt, Pd, or Au.

3. The organic light-emitting device of claim 1, wherein $T_2$ is *—N($R_5$)—*', *—Si($R_5$)($R_6$)—*', *—S*', or *—O—*'.

4. The organic light-emitting device of claim 1, wherein $Z_{11}$ to $Z_{13}$, $Z_{21}$ to $Z_{23}$, $Z_{31}$ to $Z_{33}$, $Z_{41}$ to $Z_{43}$, $R_5$, and $R_6$ are each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, and a pyrimidinyl group;

a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkyl phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkyl phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkyl phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and $—N(Q_1)(Q_2)$, $—Si(Q_3)(Q_4)(Q_5)$, $—B(Q_6)(Q_7)$, and $—P(=O)(Q_8)(Q_9)$, $Q_1$ to $Q_9$ are each independently selected from:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, $—CD_2CH_3$, and $—CD_2CDH_2$;

an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group, and provided that, at least one of $Z_1$ to $Z_{13}$, $Z_{21}$ to $Z_{23}$, $Z_{31}$ to $Z_{33}$, $Z_{41}$ to $Z_{43}$, is not hydrogen.

5. The organic light-emitting device of claim 1, wherein the organometallic compound has a linearly symmetrical structure with respect to a symmetrical axis connecting M and $T_2$ in Formula 1.

6. The organic light-emitting device of claim 1, wherein the organometallic compound is a compound selected from Compounds 1 to 16:

1

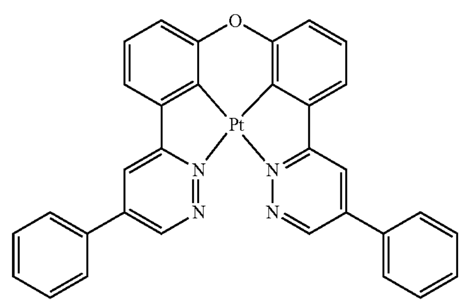

2

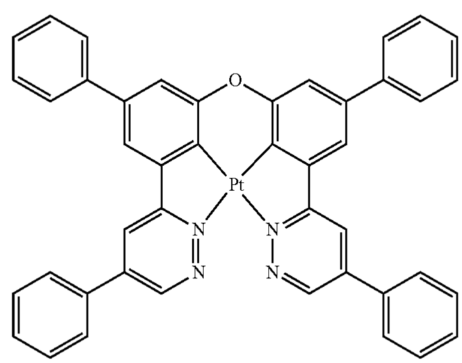

-continued
3
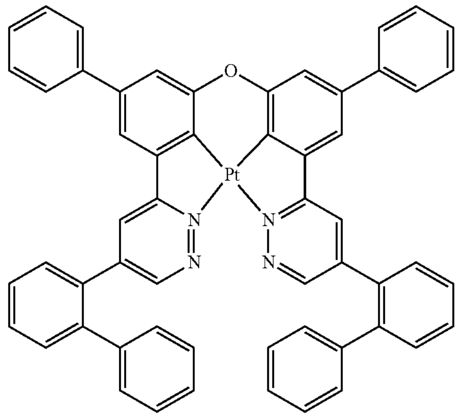
4
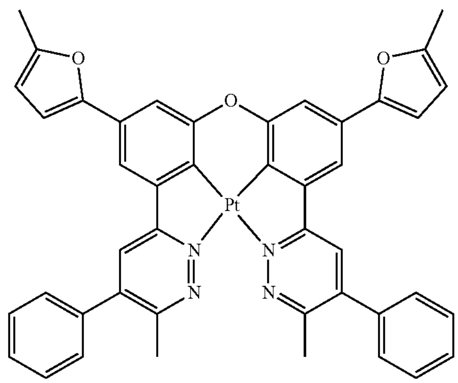
5
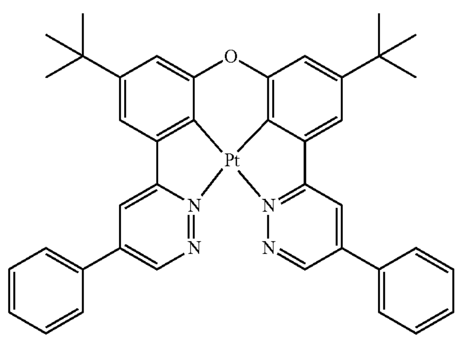
6
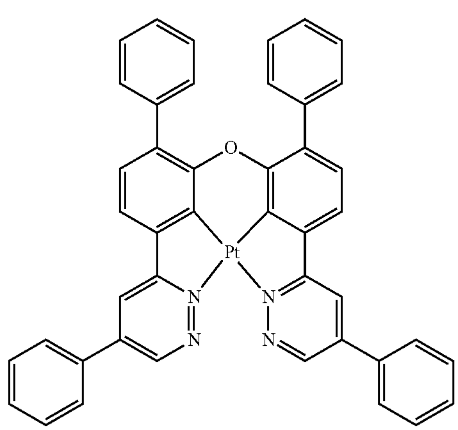
-continued
7
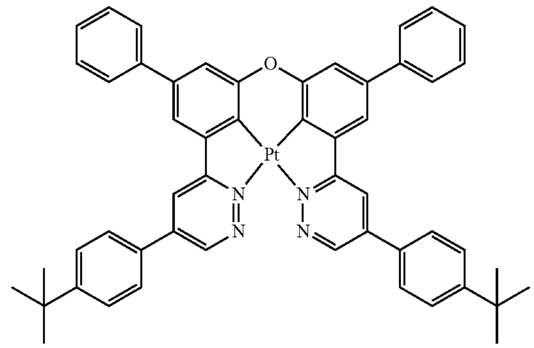
8
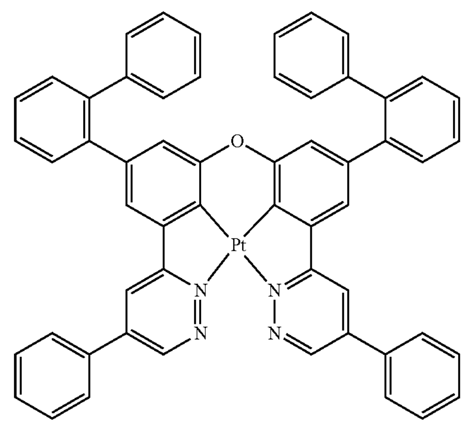
9
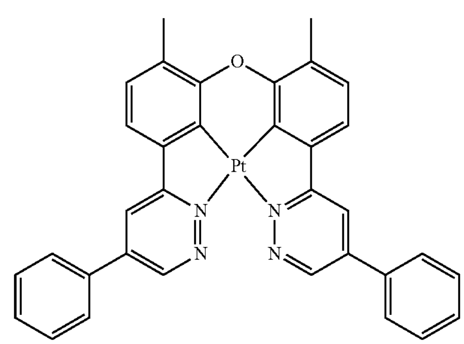
10
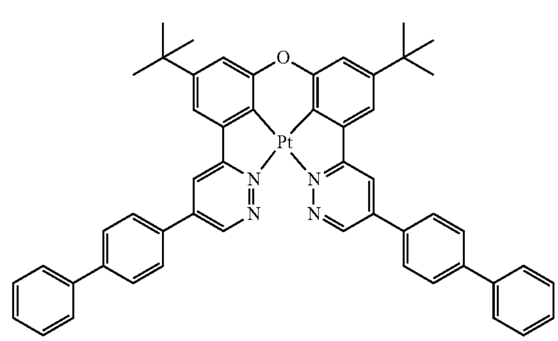

-continued

11

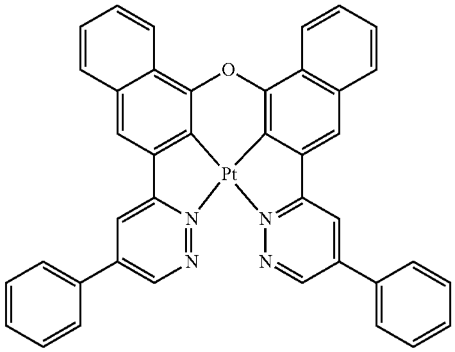

12

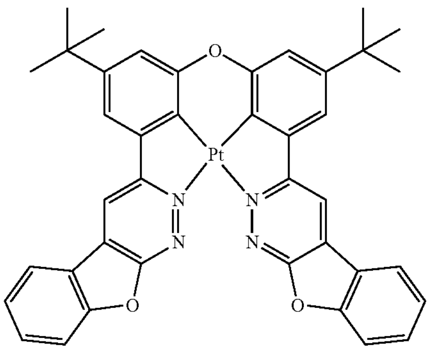

13

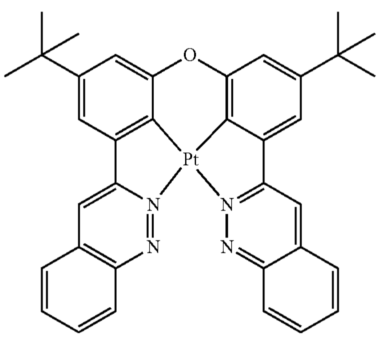

14

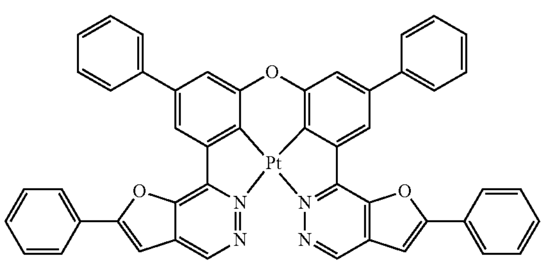

-continued

15

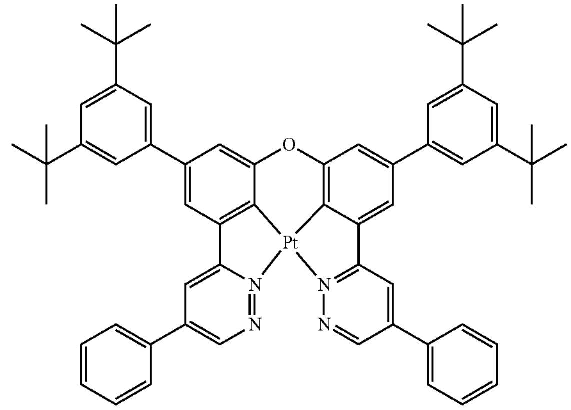

16

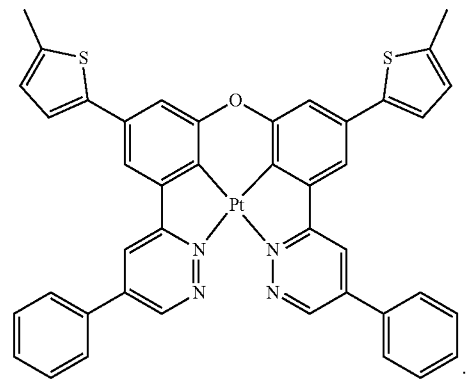

7. The organic light-emitting device of claim 1, wherein the first electrode is an anode, the second electrode is a cathode, and the organic layer further comprises a hole transport region disposed between the first electrode and the emission layer and an electron transport region disposed between the emission layer and the second electrode, wherein the hole transport region comprises a hole injection layer, a hole transport layer, an electron blocking layer, a buffer layer or any combination thereof, and wherein the electron transport region comprises a hole blocking layer, an electron transport layer, an electron injection layer, or any combination thereof.

8. The organic light-emitting device of claim 1, wherein the emission layer comprises the organometallic compound.

9. The organic light-emitting device of claim 8, wherein the emission layer further comprises a host, and an amount of the host is larger than an amount of the organometallic compound.

* * * * *